United States Patent
Takahashi et al.

(10) Patent No.: US 11,882,374 B2
(45) Date of Patent: Jan. 23, 2024

(54) SEMICONDUCTOR DEVICE, IMAGING DEVICE, AND DISPLAY DEVICE

(71) Applicant: SEMICONDUCTOR ENERGY LABORATORY CO., LTD., Atsugi (JP)

(72) Inventors: Kei Takahashi, Kanagawa (JP); Kouhei Toyotaka, Kanagawa (JP); Hidetomo Kobayashi, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 17/441,733

(22) PCT Filed: Feb. 17, 2021

(86) PCT No.: PCT/IB2021/051307
§ 371 (c)(1),
(2) Date: Sep. 22, 2021

(87) PCT Pub. No.: WO2021/171137
PCT Pub. Date: Sep. 2, 2021

(65) Prior Publication Data
US 2022/0394202 A1   Dec. 8, 2022

(30) Foreign Application Priority Data
Feb. 28, 2020   (JP) .................. 2020-033670

(51) Int. Cl.
*H04N 25/75* (2023.01)
*H04N 25/77* (2023.01)
*H10K 65/00* (2023.01)

(52) U.S. Cl.
CPC ............. *H04N 25/75* (2023.01); *H04N 25/77* (2023.01); *H10K 65/00* (2023.02)

(58) Field of Classification Search
CPC ........ H04N 25/75; H04N 25/77; H04N 25/79; H04N 5/33; H04N 25/766; H10K 65/00;
(Continued)

(56) References Cited

U.S. PATENT DOCUMENTS 9,049,389 B2   6/2015   Hashimoto et al.
9,264,643 B1 *  2/2016   Xue ................. H04N 25/75
(Continued)

FOREIGN PATENT DOCUMENTS

CN    103379297 A    10/2013
JP    2013-236362 A    11/2013
(Continued)

OTHER PUBLICATIONS

International Search Report (Application No. PCT/IB2021/051307) dated May 25, 2021.
(Continued)

*Primary Examiner* — Christopher K Peterson
(74) *Attorney, Agent, or Firm* — Fish & Richardson P.C.

(57) ABSTRACT

The reading accuracy of an imaging device is increased. Clear image capturing is performed even in the case where the luminance is high. A reading circuit of the imaging device includes an amplifier portion and a conversion portion. The amplifier portion amplifies a potential difference between a first signal and a second signal that are sequentially input and outputs the amplified difference to the conversion portion. The conversion portion converts the output potential of the amplifier portion into a digital value. The amplifier portion is reset on the basis of a first reference potential and the first signal and amplifies the potential difference on the basis of a second reference potential that is different from the first reference potential and the second signal.

18 Claims, 24 Drawing Sheets

(58) Field of Classification Search
CPC .... H10K 59/131; H10K 59/65; H10K 59/123; H10K 77/10; G09F 9/33
See application file for complete search history.

(56) References Cited

U.S. PATENT DOCUMENTS

| | | | |
|---|---|---|---|
| 9,300,889 | B2 | 3/2016 | Hashimoto et al. |
| 9,380,245 | B1 * | 6/2016 | Guidash ............... H04N 25/134 |
| 9,966,398 | B2 | 5/2018 | Nakamura et al. |
| 10,811,448 | B2 | 10/2020 | Nakamura et al. |
| 2013/0271633 | A1 * | 10/2013 | Hashimoto ............ H04N 25/60 348/300 |
| 2017/0048474 | A1 * | 2/2017 | Nakamura ........ H01L 27/14609 |
| 2021/0067720 | A1 * | 3/2021 | Benjaram ......... H01L 27/14612 |
| 2022/0385847 | A1 * | 12/2022 | Benjaram ............ H04N 25/778 |

FOREIGN PATENT DOCUMENTS

| | | |
|---|---|---|
| JP | 2017-022444 A | 1/2017 |
| JP | 2017-038312 A | 2/2017 |

OTHER PUBLICATIONS

Written Opinion (Application No. PCT/IB2021/051307) dated May 25, 2021.

* cited by examiner

Initialization

Amplification

Initialization

Amplification

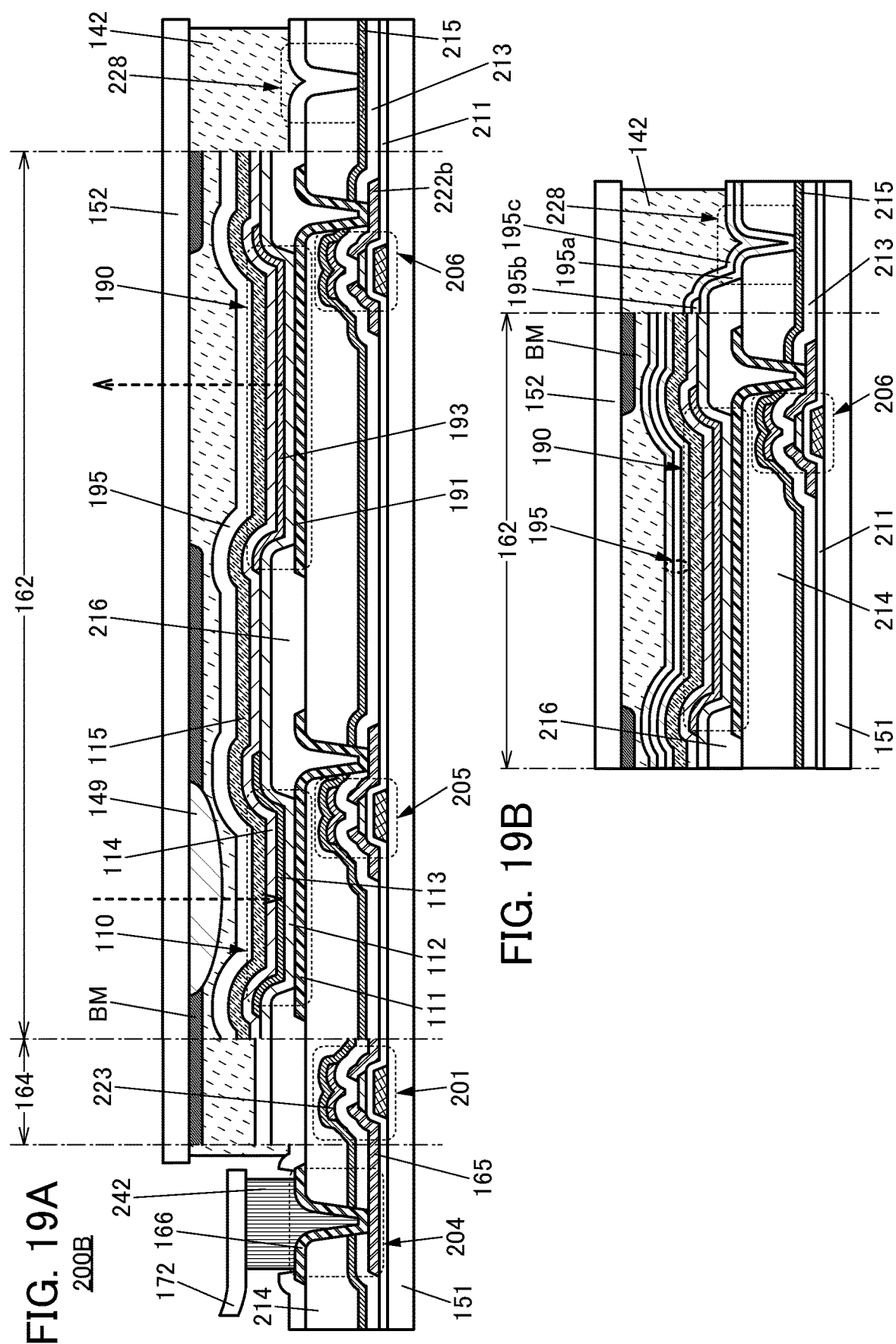

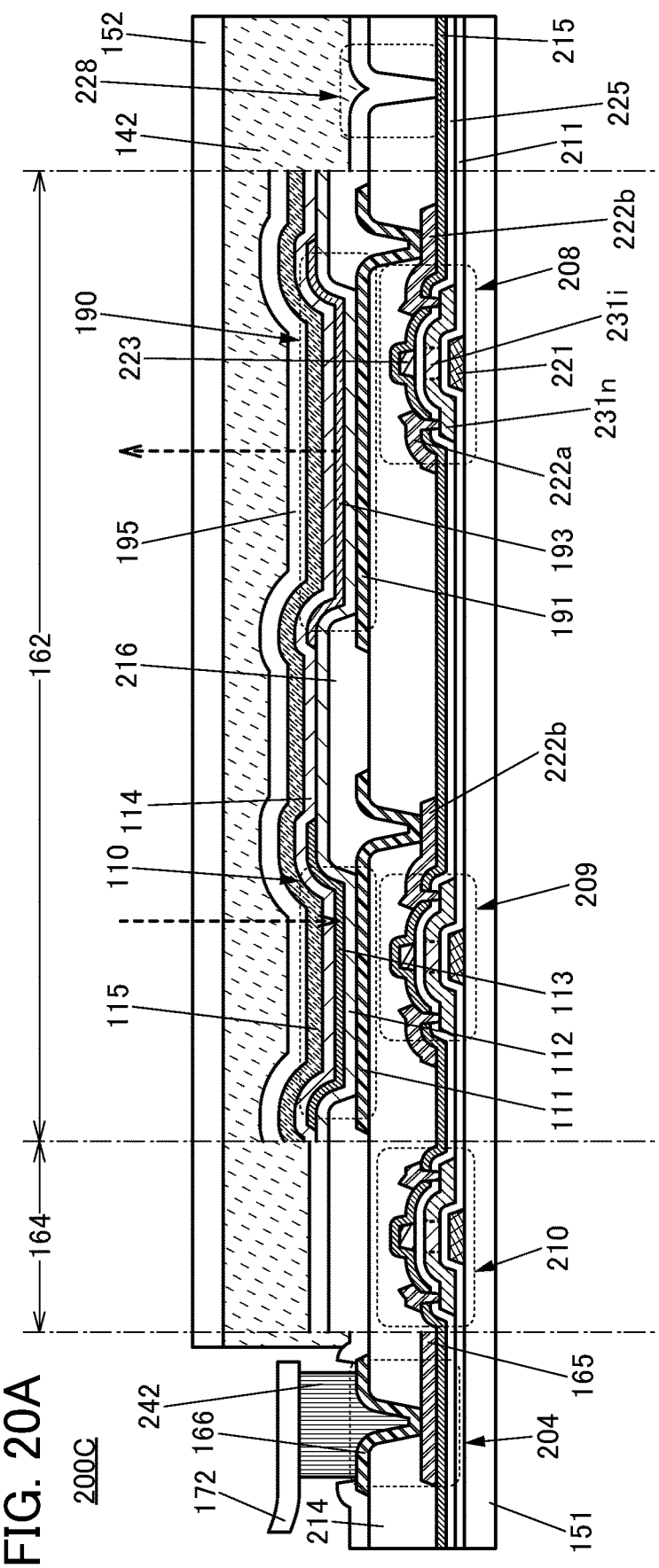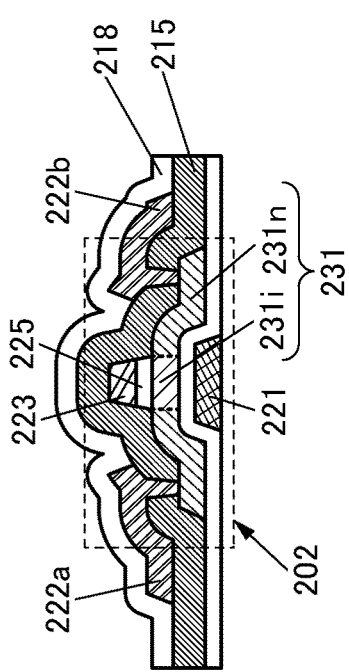

SEMICONDUCTOR DEVICE, IMAGING DEVICE, AND DISPLAY DEVICE

CROSS REFERENCE TO RELATED APPLICATIONS

This application is a U.S. National Phase Application under 35 U.S.C. § 371 of International Application PCT/IB2021/051307, filed on Feb. 17, 2021, which is incorporated by reference and claims the benefit of a foreign priority application filed in Japan on Feb. 28, 2020, as Application No. 2020-033670.

TECHNICAL FIELD

One embodiment of the present invention relates to a semiconductor device. One embodiment of the present invention relates to an imaging device. One embodiment of the present invention relates to a display device having an image capturing function. One embodiment of the present invention relates to a reading circuit.

Note that one embodiment of the present invention is not limited to the above technical field. Examples of the technical field of one embodiment of the present invention disclosed in this specification and the like include a semiconductor device, a display device, a light-emitting device, a power storage device, a memory device, an electronic device, a lighting device, an input device, an input/output device, a driving method thereof, and a manufacturing method thereof. A semiconductor device generally means a device that can function by utilizing semiconductor characteristics.

BACKGROUND ART

An imaging device in which pixels including photoelectric conversion elements are provided in a matrix is known. In many cases, an analog signal obtained in a pixel is converted into digital data by an analog digital converter circuit (A-D converter circuit), and the digital data is output. A technique in which the dynamic range is expanded by amplifying the amplitude of the signal output from the pixel and performing A-D conversion processing is known. For example, in Patent Document 1, an imaging device including an amplifier circuit that amplifies a signal of a pixel with a set gain and an AD conversion portion is disclosed.

REFERENCE

Patent Document

[Patent Document 1] Japanese Published Patent Application No. 2013-236362

SUMMARY OF THE INVENTION

Problems to be Solved by the Invention

An object of one embodiment of the present invention is to increase the reading accuracy of an imaging device. Another object of one embodiment of the present invention is to perform clear image capturing even in the case where the image capturing luminance is high. Another object of one embodiment of the present invention is to provide a semiconductor device or an imaging device that includes a reading circuit and can be formed at low cost. Another object of one embodiment of the present invention is to provide a display device having an image capturing function. Another object of one embodiment of the present invention is to provide an imaging device or a display device that can clearly capture an image of a fingerprint or the like. Another object of one embodiment of the present invention is to provide a semiconductor device, an imaging device, or a display device that has a reduced number of terminals or wirings. Another object of one embodiment of the present invention is to reduce the number of components of an electronic device or the like. Another object of one embodiment of the present invention is to provide a semiconductor device, an imaging device, a display device, or an electronic device that has a novel configuration.

Note that the description of these objects does not preclude the existence of other objects. One embodiment of the present invention does not have to achieve all these objects. Objects other than these can be derived from the description of the specification, the drawings, the claims, and the like.

Means for Solving the Problems

One embodiment of the present invention is a semiconductor device including an amplifier portion and a conversion portion. The amplifier portion includes a comparison circuit, and a first signal and a second signal are sequentially input to the amplifier portion. A first reference potential is supplied to the comparison circuit in a period during which the first signal is input. A second reference potential is supplied to the comparison circuit in a period during which the second signal is input. The amplifier portion outputs, to the conversion portion, an output potential that is obtained by amplifying a difference between potentials of the first signal and the second signal in a period during which the second signal is input. The conversion portion converts the output potential into a digital value.

Another embodiment of the present invention is a semiconductor device including an amplifier portion, a conversion portion, and an input terminal. The amplifier portion includes a comparison circuit, a first capacitor, a second capacitor, and a first switch. The comparison circuit includes an inverting input terminal, a non-inverting input terminal, and an output terminal. A first signal and a second signal are sequentially supplied to the input terminal. One of a pair of electrodes of the first capacitor is electrically connected to the input terminal and the other is electrically connected to the inverting input terminal. The second capacitor and the first switch are each electrically connected in parallel with the inverting input terminal and the output terminal. In the amplifier portion, when the first signal is supplied, the first switch is turned on and a first reference potential is supplied to the non-inverting input terminal, and when the second signal is supplied, the first switch is turned off and a second reference potential that is different from the first reference potential is supplied to the non-inverting input terminal. The conversion portion converts a potential output from the output terminal into a digital value.

Another embodiment of the present invention is a semiconductor device including an amplifier portion, a conversion portion, and an input terminal. The amplifier portion includes a comparison circuit, a first capacitor, a second capacitor, a first switch, a second switch, a third switch, a first wiring, and a second wiring. The comparison circuit includes an inverting input terminal, a non-inverting input terminal, and an output terminal. A first signal and a second signal are sequentially supplied to the input terminal. One of a pair of electrodes of the first capacitor is electrically connected to the input terminal and the other is electrically connected to the inverting input terminal. The second capacitor and the first switch are each electrically connected in parallel with the inverting input terminal and the output terminal. The first wiring to which a first reference potential is supplied is electrically connected to the non-inverting input terminal through the second switch. The second wiring to which a second reference potential that is different from the first reference potential is supplied is electrically connected to the non-inverting input terminal through the third switch. The conversion portion converts a potential output from the output terminal into a digital value.

One embodiment of the present invention is an imaging device including the semiconductor device described in any one of the above, a pixel, and a third wiring. The pixel includes a photoelectric conversion element and a pixel circuit. The pixel circuit outputs the first signal including a light-receiving potential and the second signal including a reset potential to the third wiring. The third wiring is electrically connected to the input terminal.

Another embodiment of the present invention is an imaging device including the semiconductor device described in any one of the above, a plurality of pixels, a plurality of third wirings, and a first selection circuit. The pixel includes a photoelectric conversion element and a pixel circuit. The pixel circuit outputs the first signal including a light-receiving potential and the second signal including a reset potential to the third wiring. The plurality of third wirings is electrically connected to the first selection circuit. The first selection circuit selects one of the plurality of third wirings and electrically connects the selected third wiring to the input terminal.

Any of the above imaging devices preferably includes a correlated double sampling circuit between the third wiring and the input terminal.

Any of the above imaging devices preferably includes a first substrate and a second substrate. At this time, it is preferable that the semiconductor device be provided over the first substrate, and the pixel be provided over the second substrate.

Another embodiment of the present invention is a semiconductor device including an amplifier portion, a first conversion portion, a second conversion portion, an input terminal, and a first output terminal. The amplifier portion includes a comparison circuit, a first capacitor, a second capacitor, and a first switch. The comparison circuit includes an inverting input terminal, a non-inverting input terminal, and a second output terminal. A first signal and a second signal are sequentially supplied to the input terminal. One of a pair of electrodes of the first capacitor is electrically connected to the input terminal and the other is electrically connected to the inverting input terminal. The second capacitor and the first switch are each electrically connected in parallel with the inverting input terminal and the second output terminal. In the amplifier portion, when the first signal is supplied, a first reference potential is supplied to the non-inverting input terminal, and when the second signal is supplied, a second reference potential that is different from the first reference potential is supplied to the non-inverting input terminal. The first conversion portion coverts a potential output from the second output terminal into a digital value. A digital signal is supplied to the second conversion portion, and the second conversion portion converts the digital signal into an analog third signal and outputs the third signal to the first output terminal. The amplifier portion, the first conversion portion, and the second conversion portion are provided over a first substrate.

In the above, a fourth switch is preferably included. At this time, the first output terminal is electrically connected to the non-inverting input terminal through the fourth switch. Furthermore, the second conversion portion outputs the third signal including a data potential, the first reference potential, and the second reference potential on the basis of the digital signal. Moreover, it is preferable that the fourth switch be in a conducting state in a period during which the first reference potential is output to the first output terminal and in a period during which the second reference potential is output to the first output terminal, and that the fourth switch be in a non-conducting state in a period during which the data potential is output to the first output terminal.

In any of the above, a second switch, a third switch, a first wiring, and a second wiring are preferably included. At this time, the first wiring to which the first reference potential is supplied is electrically connected to the non-inverting input terminal through the second switch. The second wiring to which the second reference potential is supplied is electrically connected to the non-inverting input terminal through the third switch.

One embodiment of the present invention is a display device including the semiconductor device described in any one of the above, a first pixel, a second pixel, a third wiring, and a fourth wiring. The first pixel includes a photoelectric conversion element and a first pixel circuit. The first pixel circuit outputs the first signal including a light-receiving potential and the second signal including a reset potential to the third wiring. The third wiring is electrically connected to the input terminal. The second pixel includes a display element and a second pixel circuit. The fourth wiring is electrically connected to the first output terminal and the second pixel circuit. The second pixel circuit controls a gray level of the display element on the basis of the third signal.

In the above, a second selection circuit, a third selection circuit, and a fifth wiring are preferably included. At this time, the third wiring and the fourth wiring are electrically connected to the second selection circuit. The input terminal and the first output terminal are electrically connected to the third selection circuit. The second selection circuit is electrically connected to the third selection circuit through the fifth wiring. The second selection circuit selects either the third wiring or the fourth wiring and electrically connects the selected wiring to the fifth wiring. The third selection circuit selects either the input terminal or the first output terminal and electrically connects the selected terminal to the fifth wiring.

In any of the above, the display element is preferably a light-emitting element. Moreover, the photoelectric conversion element and the light-emitting element are preferably positioned on the same plane. Furthermore, the photoelectric conversion element preferably includes an electron-injection layer, an electron-transport layer, a light-emitting layer, an active layer, a hole-injection layer, and a hole-transport layer between a pixel electrode and a first electrode. The light-emitting element preferably includes one or more of the first electrode, the electron-injection layer, the electron-transport layer, the hole-injection layer, and the hole-transport layer.

In any of the above, a second substrate that is different from the first substrate is preferably included. At this time, it is preferable that the semiconductor device be provided over the first substrate, and the first pixel and the second pixel be provided over the second substrate. Furthermore, it is preferable that the first substrate be a single crystal substrate and the second substrate include glass or organic resin.

Effect of the Invention

According to one embodiment of the present invention, the reading accuracy of an imaging device can be increased. According to one embodiment of the present invention, clear image capturing can be performed even in the case where the image capturing luminance is high. According to one embodiment of the present invention, a semiconductor device or an imaging device including a reading circuit that can be formed at low cost can be provided.

According to one embodiment of the present invention, a display device having an image capturing function can be provided. According to one embodiment of the present invention, an imaging device or a display device that can clearly capture an image of a fingerprint or the like can be provided. According to one embodiment of the present invention, a semiconductor device, an imaging device, or a display device that has a reduced number of terminals or wirings can be provided. According to one embodiment of the present invention, the number of components of an electronic device or the like can be reduced. According to one embodiment of the present invention, a semiconductor device, an imaging device, a display device, or an electronic device that has a novel configuration can be provided.

Note that the description of these effects does not preclude the existence of other effects. One embodiment of the present invention does not have to have all of these effects. Effects other than these can be derived from the description of the specification, the drawings, the claims, and the like.

BRIEF DESCRIPTION OF THE DRAWINGS

FIG. 19A and FIG. 19B are structure examples of a display device.

FIG. 20A and FIG. 20B are structure examples of a display device.

MODE FOR CARRYING OUT THE INVENTION

Figure 1A:
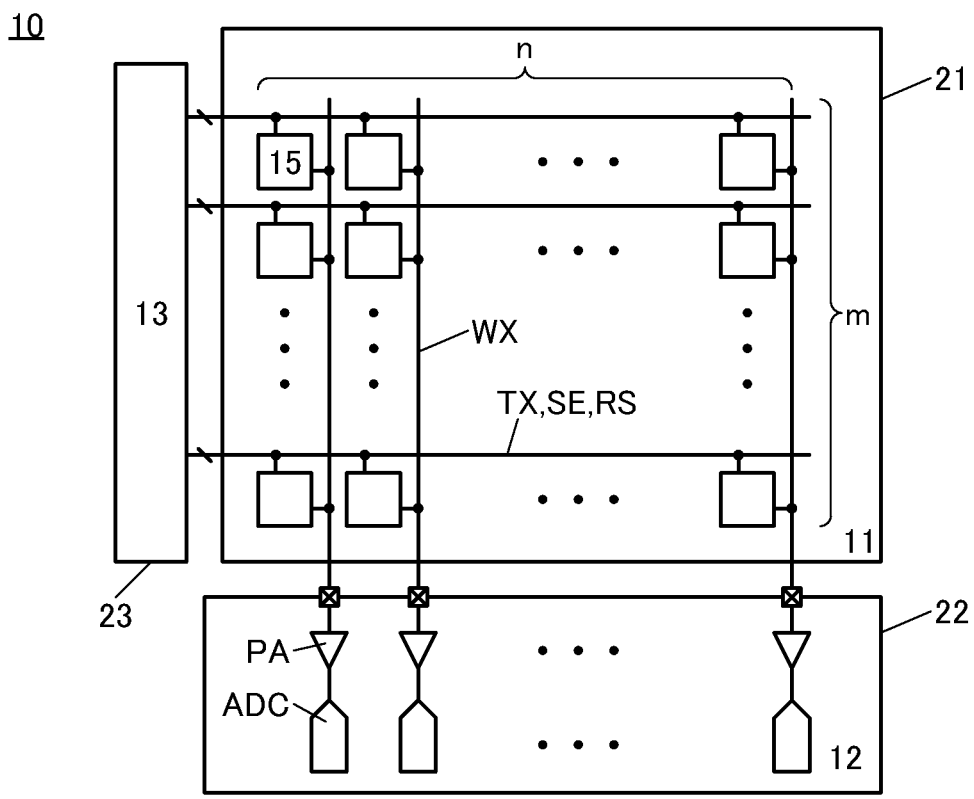
FIG. 1A is a configuration example of an imaging device.

Hereinafter, embodiments are described with reference to the drawings. Note that the embodiments can be implemented in many different modes, and it is readily understood by those skilled in the art that modes and details thereof can be changed in various ways without departing from the spirit and scope thereof. Thus, the present invention should not be construed as being limited to the following description of the embodiments.

Note that in structures of the invention described below, the same portions or portions having similar functions are denoted by the same reference numerals in different drawings, and a description thereof is not repeated. Furthermore, the same hatch pattern is used for the portions having similar functions, and the portions are not especially denoted by reference numerals in some cases.

Note that in each drawing described in this specification, the size, the layer thickness, or the region of each component is exaggerated for clarity in some cases. Therefore, they are not limited to the illustrated scale.

Note that in this specification and the like, the ordinal numbers such as "first" and "second" are used in order to avoid confusion among components and do not limit the number.

In this specification and the like, "electrically connected" includes the case where connection is made through an "object having any electric function". Here, there is no particular limitation on the "object having any electric function" as long as electric signals can be transmitted and received between components that are connected through the object. Examples of the "object having any electric function" include a switching element such as a transistor, a resistor, a coil, a capacitor, and other elements with a variety of functions as well as an electrode and a wiring.

Note that in this specification and the like, a node is an element (e.g., a wiring) that enables electrical connection between elements included in a circuit. Thus, a "node to which A is connected" is a wiring that is electrically connected to A and can be regarded as having the same potential as A. Note that even when one or more elements which enable electrical connection (e.g., switches, transistors, capacitors, inductors, resistors, or diodes) are inserted in a portion of the wire, the wire can be regarded as the "node to which A is connected" as long as it has the same potential as A.

In this specification and the like, a display panel that is one embodiment of a display device has a function of displaying (outputting) an image or the like on (to) a display surface. Therefore, the display panel is one embodiment of an output device.

In this specification and the like, a substrate of a display panel to which a connector such as an FPC (Flexible Printed Circuit) or a TCP (Tape Carrier Package) is attached, or a substrate on which an IC is mounted by a COG (Chip On Glass) method or the like is referred to as a display panel module, a display module, or simply a display panel or the like in some cases.

Embodiment 1

In this embodiment, configuration examples of a semiconductor device, an imaging device, and a display device of one embodiment of the present invention are described.

[Configuration Example 1 of Imaging Device]

FIG. 1A shows a block diagram of an imaging device 10. The imaging device 10 includes an imaging portion 11, a circuit portion 12, a driver circuit portion 13, and the like.

The imaging portion 11 includes a plurality of pixels 15 arranged in a matrix. The pixel 15 includes a light-receiving element functioning as a photoelectric conversion element and a pixel circuit. FIG. 1A illustrates an example in which the pixels 15 arranged in m rows and n columns are included.

The pixel 15 is electrically connected to a wiring TX, a wiring SE, a wiring RS, and a wiring WX. The wiring TX, the wiring SE, and the wiring RS are electrically connected to the driver circuit portion 13. The wiring WX is electrically connected to the circuit portion 12.

The pixel 15 is driven to output a first signal and a second signal sequentially to the wiring WX. The first signal is a signal including a light-receiving potential (a potential $V_S$ described later) corresponding to the amount of light received by a light-receiving element included in the pixel 15 during an exposure period. The second signal is a signal including a reset potential (a potential $V_R$ described later) that is output in a state where the pixel 15 is reset at a predetermined potential. The first signal can also be referred to as a light-receiving signal, and the second signal can also be referred to as a reset signal.

The driver circuit portion 13 has a function of generating a signal for driving the pixel 15 and outputting the signal to the pixel 15 through the wiring SE, the wiring TX, and the wiring RS. The circuit portion 12 has a function of receiving a signal output from the pixel 15 through the wiring WX and outputting the signal to the outside as digital image data. The circuit portion 12 functions as a reading circuit.

The circuit portion 12 includes a plurality of amplifier portions PA and a plurality of conversion portions ADC. The wiring WX is electrically connected to the amplifier portion PA. The amplifier portion PA is electrically connected to the conversion portion ADC. FIG. 1A illustrates an example in which the circuit portion 12 includes n amplifier portions PA and n conversion portions ADC. Note that another circuit may be provided between the wiring WX and the amplifier portion PA. For example, a variety of circuits such as a circuit forming a source follower with a transistor included in the pixel 15, an amplifier circuit, a buffer circuit, a multiplexer circuit, or a correlated double sampling (CDS) circuit may be provided.

The amplifier portion PA has a function of amplifying a difference between the first signal and the second signal that are output from the pixel 15 through the wiring WX and outputting the amplified difference to the conversion portion ADC as an analog signal. The amplifier portion PA can also be referred to as a preamplifier. The conversion portion ADC has a function of converting the analog signal input from the amplifier portion PA into a digital signal.

Here, as illustrated in FIG. 1A, the imaging portion 11 is provided over a substrate 21. The circuit portion 12 is provided over a substrate 22. The driver circuit portion 13 is provided over a substrate 23. As the substrate 21, the substrate 22, and the substrate 23, a single crystal substrate of silicon, a compound semiconductor, or the like, an SOI (Silicon on Insulator) substrate, or the like can be used. Furthermore, as the substrate 21 over which the imaging portion 11 is provided, an insulating substrate of glass, quartz, ceramic, sapphire, resin, or the like may be used. Moreover, as the substrate 21, a substrate having rigidity or a substrate having flexibility may be used. Note that the imaging portion 11 and the driver circuit portion 13 may be provided over the same substrate, and the circuit portion 12 may be provided over another substrate. Alternatively, the imaging portion 11, the circuit portion 12, and the driver circuit portion 13 may be provided over the same substrate.

[Configuration Example 1 of Reading Circuit]

Figure 1B:
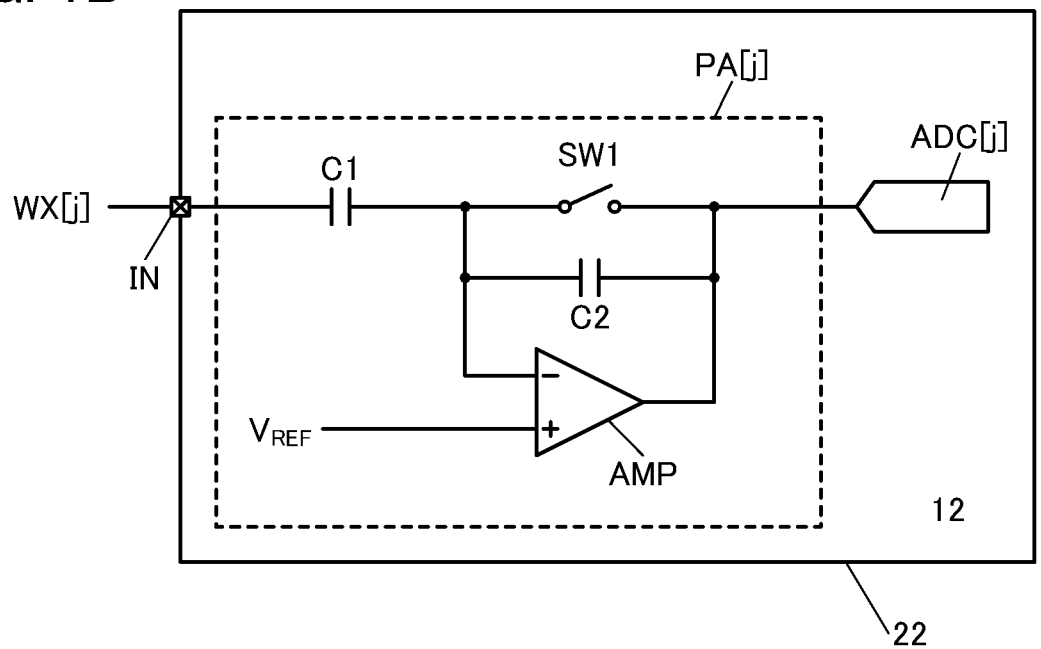
FIG. 1B is a configuration example of a circuit portion.

FIG. 1B illustrates a configuration example of the circuit portion 12 that is a semiconductor device of one embodiment of the present invention. In FIG. 1B, an amplifier portion PA[j] and a conversion portion ADC[j] that correspond to a j-th wiring WX[j] (j is an integer greater than or equal to 1 and less than or equal to n) are illustrated in the circuit portion 12. Furthermore, FIG. 1B illustrates an input terminal IN included in the circuit portion 12. The wiring WX[j] is electrically connected to the input terminal IN.

The amplifier portion PA[j] includes a comparison circuit AMP, a capacitor C1, a capacitor C2, a switch SW1, and the like. The comparison circuit AMP includes an inverting input terminal, a non-inverting input terminal, and an output terminal. As the comparison circuit AMP, for example, a comparator or a differential amplifier (also referred to as a differential amplifier circuit) such as an operational amplifier can be used.

One electrode of the capacitor C1 is electrically connected to the input terminal IN, the other electrode of the capacitor C1 is electrically connected to one terminal of the switch SW1, one electrode of the capacitor C2, and the inverting input terminal of the comparison circuit AMP. The other terminal of the switch SW1 is electrically connected to the other terminal of the capacitor C2 and the output terminal of the comparison circuit AMP. The output terminal of the comparison circuit AMP is electrically connected to an input terminal of the conversion portion ADC[/]. The non-inverting input terminal of the comparison circuit AMP is electrically connected to a wiring to which a reference potential $V_{REF}$ is supplied.

In FIG. 1B, it can also be said that the switch SW1 and the capacitor C2 are each connected in parallel with the inverting input terminal and the output terminal of the comparison circuit AMP.

[Driving Method Example 1]

The reading circuit of one embodiment of the present invention includes the amplifier portion and the conversion portion. The amplifier portion amplifies a potential difference between the first signal and the second signal that are sequentially input and outputs the amplified difference to the conversion portion. The conversion portion converts the output potential of the amplifier portion into a digital value. The amplifier portion can be reset on the basis of a first reference potential and the first signal and can amplify the potential difference on the basis of a second reference potential that is different from the first reference potential and the second signal.

An example of a driving method of the circuit portion 12 illustrated in FIG. 1B is described with reference to FIG. 2A and FIG. 2B. Note that in FIG. 2A and FIG. 2B, the conversion portion ADC[j] is omitted.

The operation of the amplifier portion PA[j] is performed by roughly two operations: initialization and amplification.

Figure 2A:
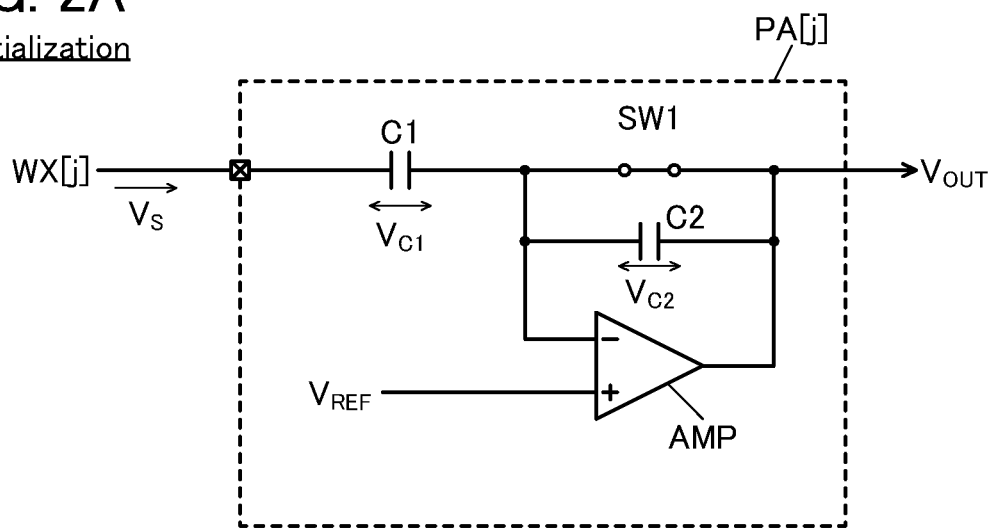
FIG. 2A and FIG. 2B are diagrams illustrating operation of an amplifier portion.
Figure 2B:
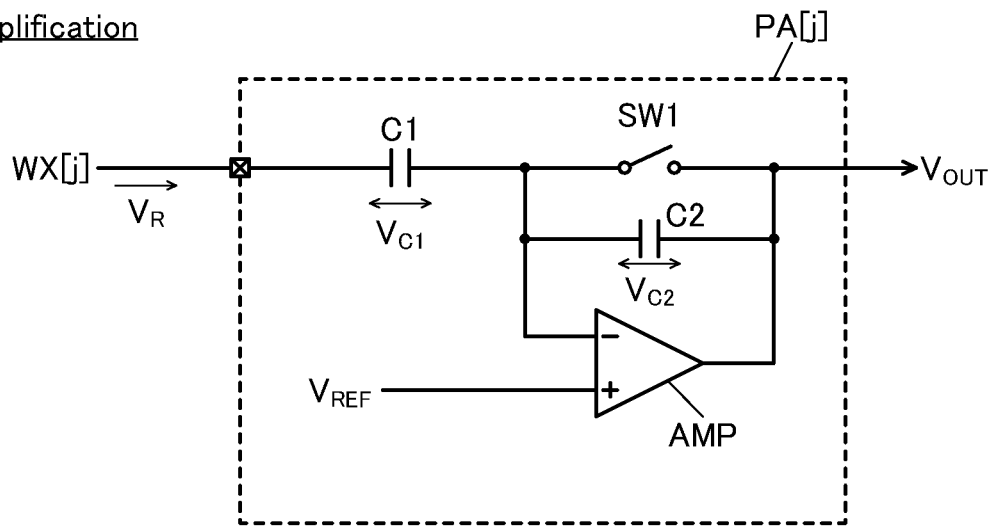

FIG. 2A corresponds to operation for initialization (also referred to as initialization operation) and FIG. 2B corresponds to operation for amplification (also referred to as amplification operation). Furthermore, hereinafter, a period taken for initialization operation is referred to as an initialization period, and a period taken for amplification operation is referred to as an amplification period.

First, the initialization operation of the amplifier portion PA[j] is described with reference to FIG. 2A. In the initialization operation, the switch SW1 is brought into a conducting state. Furthermore, in the initialization period, the potential $V_S$ that is the potential of the first signal is supplied from the wiring WX[j].

In the initialization operation, the switch SW1 is in a conducting state; thus, the output terminal and the inverting input terminal of the comparison circuit AMP are electrically short-circuited. Therefore, the output potential of the comparison circuit AMP becomes the same as the reference potential $V_{REF}$. At this time, a voltage $V_{C1}$ applied between the pair of electrodes of the capacitor C1 becomes a difference between the reference potential $V_{REF}$ and the potential $V_S$. Furthermore, there is no potential difference between the pair of electrodes of the capacitor C2; thus, a voltage $V_{C2}$ applied to the capacitor C2 becomes 0 V. As a result, an output potential $V_{OUT}$ of the amplifier portion PA[j] in the initialization period is equal to the reference potential $V_{REF}$.

That is, in the initialization period, the voltage $V_{C1}$, the voltage $V_{C2}$, and the output potential $V_{OUT}$ are as follows.

$$V_{C1} = V_S - V_{REF}$$

$$V_{C2} = V_{REF} - V_{REF} =$$

$$V_{OUT} = V_{REF} \quad \text{[Formula 1]}$$

Next, the amplification operation of the amplifier portion PA[j] is described with reference to FIG. 2B. In the amplification operation, first, the switch SW1 is brought into a non-conducting state. Then, the potential of the wiring WX[j] is changed from the potential $V_S$ of the first signal to the potential $V_R$ that is a potential of the second signal. Accordingly, the potential of the inverting input terminal of the comparison circuit AMP is changed; thus, the output potential of the comparison circuit AMP is changed until the potential difference between the inverting input terminal and the non-inverting input terminal of the comparison circuit AMP becomes 0 V. The potential of the output terminal of the comparison circuit AMP at the time when the amplifier portion PA[j] achieves a state of equilibrium is determined by the potential difference between the potential $V_S$ and the potential $V_R$, an amplification factor G, and the reference potential $V_{REF}$. Here, the amplification factor G of the amplifier portion PA[j] is determined by the capacitance ratio between the capacitor C1 and the capacitor C2.

That is, the output potential $V_{OUT}$ and the amplification factor G in the amplification period are as follows. Note that in the following description, the capacitance value of the capacitor C1 is denoted by C1 and the capacitance value of the capacitor C2 is denoted by C2.

$$V_{OUT} = V_{REF} + G(V_S - V_R)$$

$$G = C1/C2 \quad \text{[Formula 2]}$$

As described above, the amplifier portion PA[j] can amplify a difference between two input signals and output the amplified difference to the conversion portion ADC[j]. Accordingly, the amplifier portion PA[j] can output the output potential $V_{OUT}$ from which an influence of variations of the pixel circuit included in the pixel 15, a circuit provided between the pixel circuit and the amplifier portion PA[j], or the like is eliminated.

Here, in the comparison circuit AMP included in the amplifier portion PA[j], an offset voltage is generated between the inverting input terminal and the non-inverting input terminal in some cases. Because of the offset voltage, the inverting input terminal and the non-inverting input terminal that are in the state of equilibrium do not have the equal potential in some cases. However, obtaining a difference between two kinds of the output potentials $V_{OUT}$ that are output from the amplifier portion PA[j] can eliminate the influence of the offset voltage.

[Configuration Example 2 of Reading Circuit]

The above-described amplifier portion PA shown in FIG. 1B and the like as an example can amplify and output a difference between two input signals. However, in the case where the potential difference between two input signals is too large, a phenomenon in which the output potential is saturated occurs in some cases. Such a phenomenon in which the output potential of an amplifier circuit is saturated can be referred to as clipping. Clipping can occur because, for example, the comparison circuit included in the amplifier portion PA cannot output a voltage (potential) exceeding a power supply voltage.

Therefore, one embodiment of the present invention shown below as an example has a configuration in which the reference potential input to the comparison circuit is switched between the initialization period and the amplification period. At this time, the reference potential in the amplification period is set lower than the reference potential in the initialization period. Thus, even in the case where the potential difference between the two input signals is large, clipping can be favorably inhibited.

Figure 3:
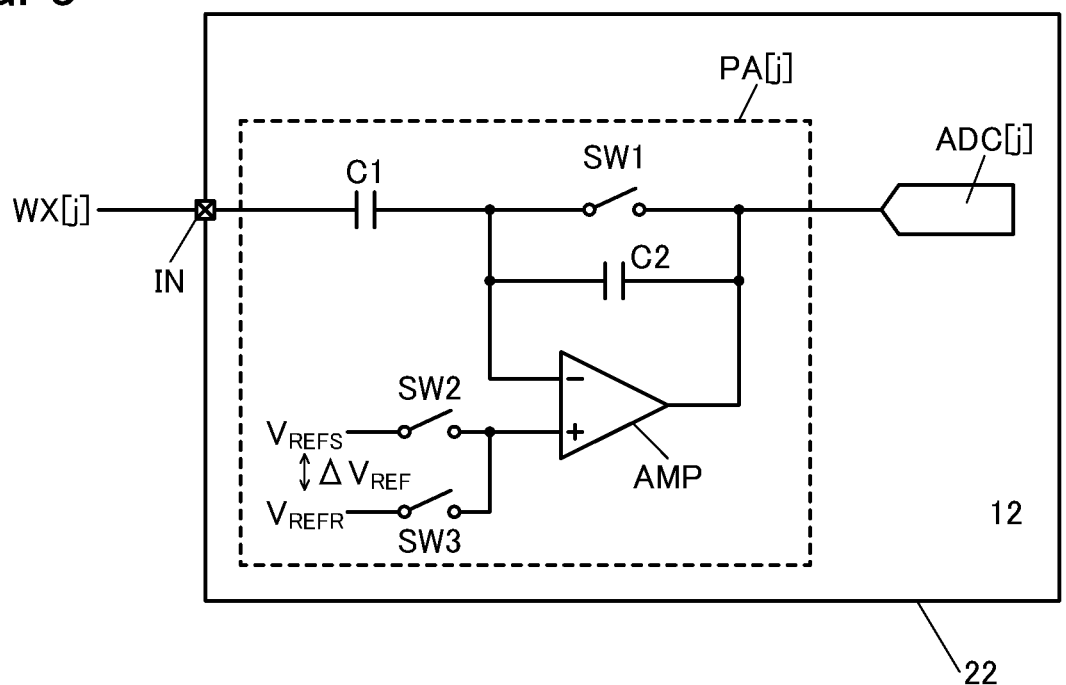
FIG. 3 is a configuration example of a circuit portion.

FIG. 3 illustrates a configuration example of the circuit portion 12 shown below as an example. The circuit portion 12 illustrated in FIG. 3 is different from the above-described configuration illustrated in FIG. 1B in the configuration of the wiring connected to the non-inverting input terminal of the comparison circuit AMP.

The amplifier portion PA[j] includes a switch SW2 and a switch SW3.

One terminal of the switch SW2 is electrically connected to a wiring to which a reference potential $V_{REFS}$ is supplied, and the other terminal is electrically connected to the non-inverting input terminal of the comparison circuit AMP. One terminal of the switch SW3 is electrically connected to a wiring to which a reference potential $V_{REFR}$ is supplied, and the other terminal is electrically connected to the non-inverting input terminal of the comparison circuit AMP. In other words, the non-inverting input terminal of the comparison circuit AMP is electrically connected to the wiring to which the reference potential $V_{REFS}$ is supplied through the switch SW2 and furthermore, is electrically connected to the wiring to which the reference potential $V_{REFR}$ is supplied through the switch SW3.

The reference potential $V_{REFS}$ and the reference potential $V_{REFR}$ are different potentials. The reference potential $V_{REFS}$ is preferably set higher than the reference potential $V_{REFR}$. Note that depending on the driving method, the reference potential $V_{REFR}$ can be higher than the reference potential $V_{REFS}$. Here, as illustrated in FIG. 3, the potential difference between the reference potential $V_{REFS}$ and the reference potential $V_{REFR}$ is $\Delta V_{REF}$.

[Driving Method Example 2]

The operation of the amplifier portion PA[j] shown in FIG. 3 as an example is described below with reference to FIG. 4A and FIG. 4B. Note that for the portions overlapping with the above, detailed description is omitted or description is made simple in some cases.

First, the operation of the amplifier portion PA[j] in the initialization period is described with reference to FIG. 4A. In the initialization period, the switch SW1 and the switch SW2 are brought into a conducting state, and the switch SW3 is brought into a non-conducting state. The reference potential $V_{REFS}$ is supplied to the non-inverting input terminal of the comparison circuit AMP through the switch SW2. Furthermore, the potential $V_S$, which is the potential of the first signal, is supplied from the wiring WX[j].

In a manner similar to the above, the output potential $V_{OUT}$ in the initialization period is equal to the reference potential $V_{REFS}$. That is, the voltage $V_{C1}$, the voltage $V_{C2}$, and the output potential $V_{OUT}$ in the initialization period are as follows.

$$V_{C1} = V_S - V_{REFS}$$

$$V_{C2} = 0$$

$$V_{OUT} = V_{REFS} \quad \text{[Formula 3]}$$

Next, the amplification operation is described with reference to FIG. 4B. In the amplification period, the switch SW1 is brought into a non-conducting state. Furthermore, the switch SW2 is brought into a non-conducting state, and the switch SW3 is brought into a conducting state. Accordingly, the reference potential $V_{REFR}$ is supplied to the non-inverting input terminal of the comparison circuit AMP through the switch SW3. Furthermore, the potential of the wiring WX[j] is changed from the potential $V_S$ of the first signal to the potential $V_R$ of the second signal.

In the amplification period, the output potential $V_{OUT}$ at the time when the amplifier portion PA[j] achieves a state of equilibrium is as follows.

$$V_{OUT} = V_{REFR} + G(\Delta V_{REF} - \Delta V_S)$$

$$\Delta V_{REF} = V_{REFS} - V_{REFR}$$

$$\Delta V_S = V_S - V_R \quad \text{[Formula 4]}$$

As described above, the amplifier portion PA[j] can amplify a difference between the potential difference $\Delta V_{REF}$ that is a difference between the two reference potentials and a potential difference $\Delta V_S$ between the two input signals and output the amplified difference. Accordingly, occurrence of clipping can be favorably inhibited.

For example, a case where in the amplifier portion PA[j] illustrated in FIG. 1B, the potential $V_S$ is 6.0 V, the potential $V_R$ is 4.0 V, the amplification factor G is 10 times, the reference potential $V_{REF}$ is 4.5 V, and the power supply voltage of the comparison circuit AMP is 9.0 V is considered. At this time, the output potential $V_{OUT}$ becomes 24.5 V, which exceeds the upper limit of the power supply voltage; thus, clipping occurs.

In contrast, a case where in the amplifier portion PA[j] illustrated in FIG. 3, the potential $V_S$ is 6.0 V, the potential $V_R$ is 4.1 V, the amplification factor G is 10 times, the reference potential $V_{REFS}$ is 6.5 V, the reference potential $V_{REFR}$ is 4.5 V, and the power supply voltage of the comparison circuit AMP is 9.0 V is considered. At this time, the potential difference $\Delta V_S$ is 1.9 V, and the potential difference $\Delta V_{REF}$ is 2.0 V. Therefore, the output potential $V_{OUT}$ is 5.5 V, which is in the range of the power supply voltage; thus, occurrence of clipping can be inhibited.

However, even with the configuration illustrated in FIG. 3, in the case where the potential difference $\Delta V_{REF}$ between the reference potential $V_{REFS}$ and the reference potential $V_{REFR}$ and the potential difference $\Delta V_S$ between the two signals are too large, clipping might occur. Thus, the value of the potential difference $\Delta V_{REF}$ is preferably set in advance in accordance with the signal range that can be output by the pixel circuit. Alternatively, the value of the potential difference $\Delta V_{REF}$ may be changed in accordance with a driving mode of the imaging device, illuminance of an environment in which the imaging device is used, or the like.

Depending on the driving mode of the imaging device, the illuminance of the environment in which the imaging device is used, or the like, the potential difference $\Delta V_S$ between the two signals is sufficiently small in some cases. At this time, without switching of the reference potentials, the reading operation may be performed using one of the reference potential $V_{REFS}$ and the reference potential $V_{REFR}$. Specifically, the reading operation may be performed in the state where one of the switch SW2 and the switch SW3 is brought into a conducting state and the other is brought into in a non-conducting state in both the initialization period and the amplification period. At this time, depending on the driving mode of the imaging device, the environment in which the imaging device is used, or the like, the driving method in which the reference potentials are switched and the driving method in which the reference potential is fixed can be switched. Accordingly, without change of the circuit configuration shown in FIG. 3 as an example, the two kinds of reading operations can be performed; thus, image capturing can be performed with higher accuracy.

[Configuration Example 2 of Imaging Device]

A more specific configuration example of an imaging device is described below.

Figure 5A:
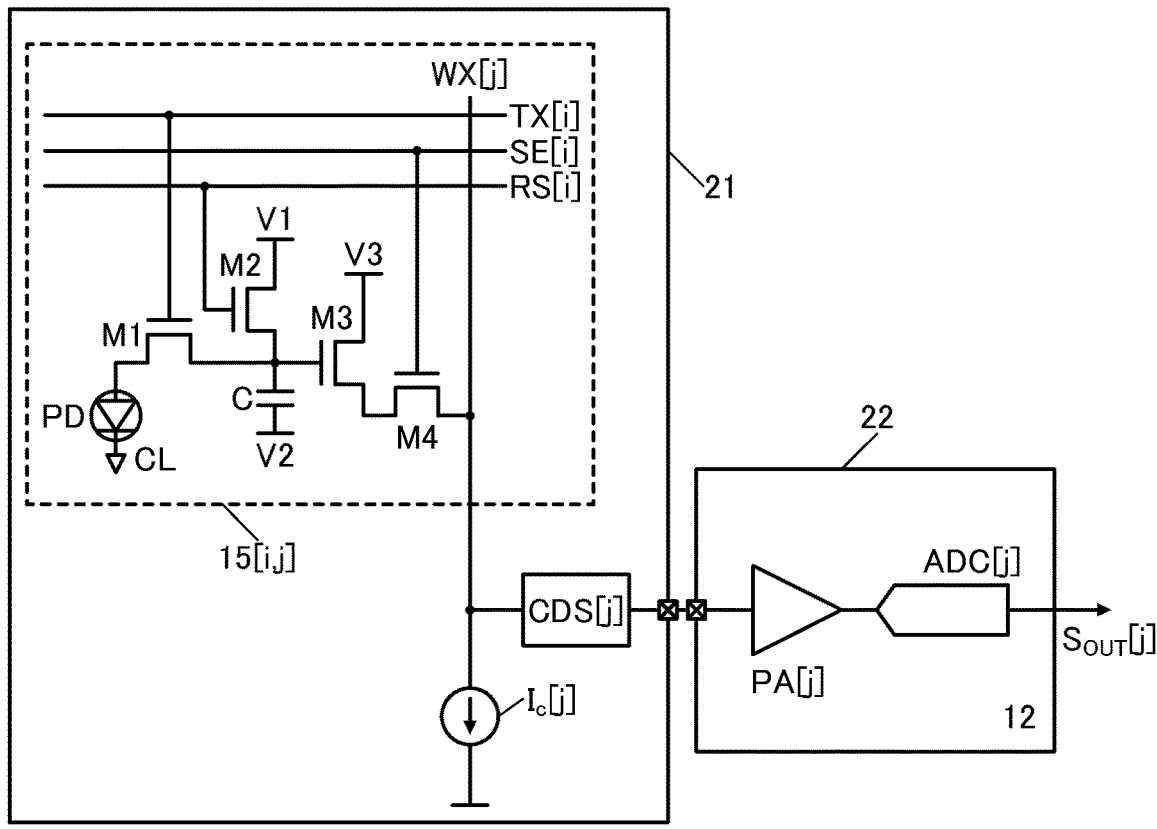
FIG. 5A is a configuration example of an imaging device.

FIG. 5A illustrates a circuit diagram of an imaging device. In FIG. 5A, a circuit diagram of a pixel 15[i,j] in the i-th row and the j-th column and a current source $I_C$[j] and a CDS circuit CDS[j] connected to the wiring WX[j] are illustrated as components provided over the substrate 21. Note that although only one pixel 15[i,j] connected to the wiring WX[j] is illustrated here, m pixels 15 are actually connected to one wiring WX[j].

Furthermore, in FIG. 5A, the amplifier portion PA[j] and the conversion portion ADC[j] are illustrated as components provided over the substrate 22. The above description can be referred to for the configurations of the amplifier portion PA[j] and the conversion portion ADC[j].

The pixel 15[i,j] includes a transistor M1, a transistor M2, a transistor M3, a transistor M4, a capacitor C, a light-receiving element PD, and the like. Furthermore, a wiring TX[i], a wiring SE[i], a wiring RS[i], and the wiring WX[j] are connected to the pixel 15[i,j].

A gate of the transistor M1 is electrically connected to the wiring TX[i], one of a source and a drain of the transistor M1 is electrically connected to an anode of the light-receiving element PD, and the other of the source and the drain of the transistor M1 is electrically connected to one of a source and a drain of the transistor M2, a first electrode of the capacitor C, and a gate of the transistor M3. A gate of the transistor M2 is electrically connected to the wiring RS[i], and the other of the source and the drain of the transistor M2 is electrically connected to a wiring to which a potential V1 is supplied. One of a source and a drain of the transistor M3 is electrically connected to a wiring to which a potential V3 is supplied, and the other of the source and the drain of the transistor M3 is electrically connected to one of a source and a drain of the transistor M4. A gate of the transistor M4 is electrically connected to the wiring SE[i], and the other of the source and the drain of the transistor M4 is electrically connected to the wiring WX[j]. A second electrode of the capacitor C is electrically connected to a wiring to which a potential V2 is supplied. A cathode of the light-receiving element PD is electrically connected to a wiring CL to which a cathode potential is supplied.

The transistor M1, the transistor M2, and the transistor M4 function as switches. The transistor M3 functions as an amplifier element (amplifier).

A transistor in which silicon (including single crystal silicon, polycrystalline silicon, and low-temperature polycrystalline silicon (LTPS)) is used for a semiconductor in which a channel is formed (hereinafter, the transistor is referred to as a Si transistor) is preferably used as all of the transistor M1 to the transistor M4. Alternatively, a transistor in which an oxide semiconductor is used for a semiconductor in which a channel is formed (hereinafter, the transistor is referred to as an OS transistor) is preferably used as all of the transistor M1 to the transistor M4.

Alternatively, both a Si transistor and an OS transistor may be used. For example, it is preferable to use OS transistors as the transistor M1 and the transistor M2 and to use a Si transistor as the transistor M3. At this time, the transistor M4 may be either an OS transistor or a Si transistor.

By using OS transistors as the transistor M1 and the transistor M2, a potential held in the gate of the transistor M3 on the basis of charge generated in the light-receiving element PD can be prevented from leaking through the transistor M1 or the transistor M2.

As the OS transistor, a transistor including an oxide semiconductor in a semiconductor layer in which a channel is formed can be used. The semiconductor layer preferably includes indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. In particular, M is preferably one or more kinds selected from aluminum, gallium, yttrium, and tin. It is particularly preferable to use an oxide containing indium, gallium, and zinc (also referred to as IGZO) for the semiconductor layer of the OS transistor. Alternatively, it is preferable to use an oxide containing indium, tin, and zinc. Further alternatively, it is preferable to use an oxide containing indium, gallium, tin, and zinc.

A transistor using an oxide semiconductor having a wider band gap and a lower carrier density than silicon can achieve an extremely low off-state current. Thus, such a low off-state current enables retention of charge accumulated in a capacitor that is connected in series with the transistor for a long time. Therefore, it is particularly preferable to use a transistor using an oxide semiconductor as the transistor M1 and the transistor M2 each of which is connected in series with the capacitor C. The use of the transistor containing an oxide semiconductor as each of the transistor M1 and the transistor M2 can prevent leakage of charge held in the capacitor C through the transistor M1 or the transistor M2. Moreover, charge held in the capacitor C can be held for a long time; thus, a period from exposure to reading can be extended.

For example, in the case where image capturing is performed using a global shutter system, a period from the end of charge transfer operation to the start of reading operation (charge holding period) varies among pixels. For example, when an image having the same gray level in all the pixels is captured, output signals in all the pixels ideally have potentials of the same level. However, in the case where the length of the charge holding period varies row by row, if charge accumulated at nodes in the pixels in each row leaks out over time, the potential of an output signal in a pixel varies row by row, and image data varies in gray level row by row. Thus, when the OS transistors are used as the transistor M1 and the transistor M2, such a potential change at the node can be extremely small. That is, even when image capturing is performed using the global shutter system, it is possible to inhibit variation in grayscale of image data due to a difference in the length of the charge holding period, and it is possible to enhance the quality of captured images.

In contrast, as the transistor M3, a Si transistor is preferably used. The Si transistor can have a higher field-effect mobility than the OS transistor, and has excellent drive capability and current capability. Thus, the transistor M3 can operate at higher speed than the transistor M1 and the transistor M2. By using the Si transistor as the transistor M3, an output in accordance with the extremely low potential based on the amount of light received by the light-receiving element PD can be quickly supplied to the transistor M4.

In other words, in the pixel 15[i,j], the transistor M1 and the transistor M2 have low leakage current and the transistor M3 has high drive capability, whereby, when the light-receiving element PD receives light, the charge transferred through the transistor M1 can be held without leakage and high-speed reading can be performed.

Low off-state current, high-speed operation, and the like, which are required for the transistor M1 to the transistor M3, are not necessarily required for the transistor M4, which functions as a switch for supplying the output from the transistor M3 to the wiring WX[j]. Thus, a Si transistor or an OS transistor may be used as the transistor M4.

Although n-channel transistors are shown as the transistors in FIG. 5A, p-channel transistors can be used.

Each of the transistors included in the pixel 15[i,j], a transistor included in the CDS circuit CDS[j], a transistor included in the current source $I_C[j]$, and the like are preferably formed over the substrate 21 through the same steps.

The current source $I_C[j]$ is connected in series with the wiring WX[j] connected to the pixel 15[i,j]. The current source $I_C[j]$ and the transistor M3 included in the pixel 15[i,j] form a source follower circuit.

The configuration of the current source $I_C[j]$ is not particularly limited, and for example, a transistor whose gate is supplied with a constant potential, a current mirror circuit, or the like can be used.

Furthermore, the CDS circuit CDS[j] is connected to the wiring WX[j]. The CDS circuit CDS[j] is a circuit that is capable of executing correlated double sampling.

An output terminal of the CDS circuit CDS[j] is connected to the input terminal of the amplifier portion PA[j]. A signal sampled by the CDS circuit CDS[j] is output to the amplifier portion PA[j].

In the circuit portion 12, a signal $S_{OUT}[j]$ is output as an output signal from the conversion portion ADC[j]. The signal $S_{OUT}[j]$ is a digital signal converted from an analog signal by the conversion portion ADC[j]. The signal $S_{OUT}[j]$ is output to, for example, an arithmetic circuit provided outside the imaging device and processed.

[Driving Method Example of Pixel]

Figure 5B:
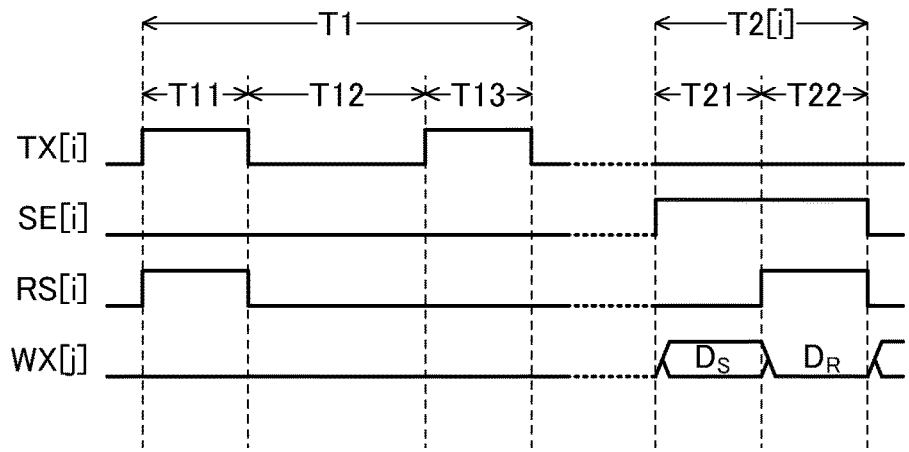
FIG. 5B is a timing chart.

Here, a driving method of the pixel 15[i,j] is described. FIG. 5B is a timing chart of the driving method of the pixel 15[i,j]. FIG. 5B shows changes in potentials of the wiring TX[i], the wiring SE[i], the wiring RS[i], and the wiring WX[j].

Driving of the pixel 15[i,j] is roughly divided into an image capturing period T1 and a reading period T2. In the image capturing period T1, image capturing is performed in all pixels of the imaging portion 11, and reading is sequentially performed row by row in the subsequent reading period T2, so that global shutter driving can be performed. In contrast, when the image capturing period T1 and the reading period T2 are provided for each row, rolling shutter driving can be performed.

The image capturing period T1 is divided into a period T11, a period T12, and a period T13. The period T11 corresponds to a reset period of the pixel, the period T12 corresponds to an exposure period, and the period T13 corresponds to a transfer period.

In the period T11, the potentials of the wiring TX[i] and the wiring RS[i] each become a high-level potential. Accordingly, the transistor M1 and the transistor M2 are brought into a conducting state, and the potential of the anode of the light-receiving element PD is reset to the potential V1.

Next, in the period T12, the potentials of the wiring TX[i] and the wiring RS[i] become a low-level potential. Accordingly, the transistor M1 is brought into a non-conducting state. In the period T12, photoelectric conversion is caused by incident light on the light-receiving element PD, and charge is accumulated in the anode of the light-receiving element PD.

Next, in the period T13, the potential of the wiring TX[i] becomes a high-level potential. Accordingly, the transistor M1 is brought into a conducting state, and the charge accumulated in the light-receiving element PD is transferred to the capacitor C.

After that, a low-level potential is supplied to the wiring TX[i] and thus, the transistor M1 is brought into a non-conducting state, so that the charge in the capacitor C is held.

The reading period T2 is divided into a period T21 and a period T22. A signal including a light-receiving potential is output in the period T21, and a signal including a reset potential is output in the period T22.

In the global shutter driving, after the above-described image capturing period T1, reading operation is performed row by row. The reading period T2[i] in the i-th row is shown in FIG. 5B.

In the period T21, a high-level potential is supplied to the wiring SE[i]. Accordingly, the transistor M4 is brought into a conducting state. At this time, the transistor M3 and the current source $I_C$[j] form a source follower circuit, and a data signal Ds is output to the CDS circuit CDS[j] through the wiring WX[j]. At this time, the potential of the data signal Ds output to the wiring WX[j] is determined in accordance with a gate potential of the transistor M3. The data signal Ds corresponds to the above-described first signal (light-receiving signal).

Next, in the period T22, high-level potentials are supplied to the wiring SE[i] and the wiring RS[i]. Accordingly, the transistor M2 and the transistor M4 are brought into a conducting state. Thus, the potential V1 is supplied to the gate of the transistor M3. That is, the pixel 15 [i,j] is reset. In the period T22, a data signal DR in this state is output to the wiring WX[j]. The data signal DR corresponds to the above-described second signal (reset signal).

By such driving, in the reading period T2, the first signal and the second signal can be sequentially output from the pixel 15[i,j] to the wiring WX[j].

The above is the description of the driving method of the pixel circuit.

[Configuration Example 3 of Imaging Device]

Figure 6:
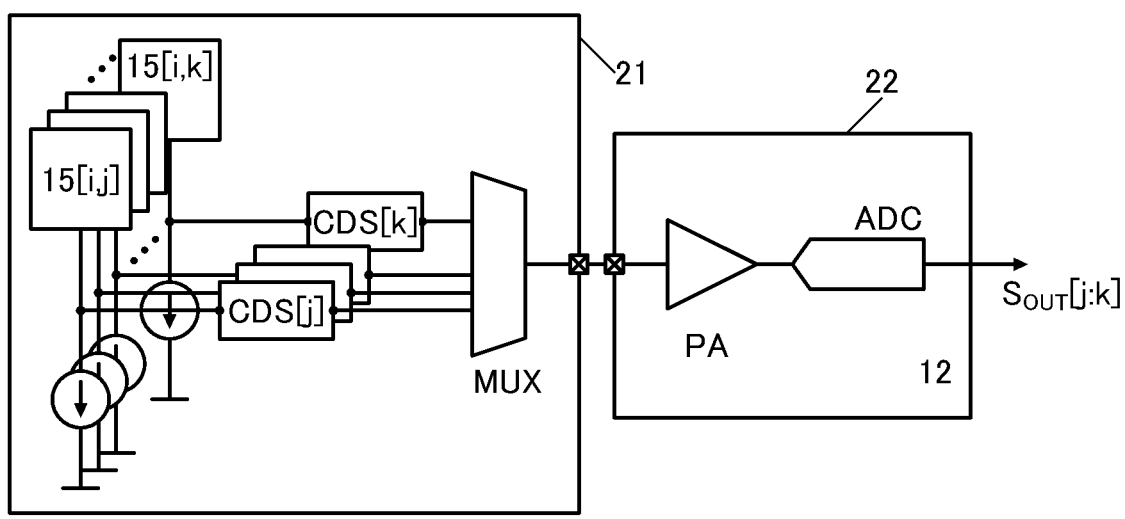
FIG. 6 is a configuration example of an imaging device.

FIG. 6 illustrates a configuration example of an imaging device that is partly different from that in FIG. 5A, which is described above. The imaging device illustrated in FIG. 6 includes a multiplexer circuit MUX between a plurality of CDS circuits and the amplifier portion PA.

Here, a configuration in which, output from the j-th pixel 15[i,j] to the k-th pixel 15[i,k] among n pixels 15 in the i-th column is output to the amplifier portion PA through one multiplexer circuit MUX is illustrated.

Furthermore, as illustrated in FIG. 6, the CDS circuit CDS may be provided between each of the pixels 15 and the multiplexer circuit MUX.

With such a configuration, the number of connection terminals can be reduced between the substrate 21 and the substrate 22. In particular, in the case where the substrate 22 is formed to have a chip shape and an IC chip including the substrate 22 is mounted by being bonded to the substrate 21, another circuit board, or the like with a bump or the like, a reduction in number of terminals of the substrate 22 is preferable because the reduction largely contributes to a reduction in chip size.

[Configuration Example of Display Device]

Hereinafter, a display device having a function of displaying an image and a function of capturing an image is described.

A display device of one embodiment of the present invention includes light-receiving elements (also referred to as light-receiving devices) and light-emitting elements (also referred to as light-emitting devices) in a display portion. The light-emitting elements are arranged in a matrix in the display portion, and an image can be displayed on the display portion using the light-emitting elements. Moreover, the light-receiving elements are arranged in a matrix in the display portion, so that the display portion also has a function of a light-receiving portion. An image can be captured by the plurality of light-receiving elements provided in the display portion, so that the display device can function as an image sensor, a touch panel, or the like. That is, the display portion can capture an image and sense an approach or a contact of an object (e.g., a finger or a pen). Furthermore, since the light-emitting elements provided in the display portion can be used as light sources at the time of receiving light, a light source does not need to be provided separately from the display device; thus, a highly functional display device can be provided without increasing the number of components of an electronic device.

In one embodiment of the present invention, when an object reflects light emitted from the light-emitting element included in the display portion, the light-receiving element can sense the reflected light; thus, image capturing and touch (including non-contact touch) sensing can be performed even in a dark environment.

Furthermore, when a finger, a palm, or the like touches the display portion of the display device of one embodiment of the present invention, an image of the fingerprint or the palm print can be captured. Thus, an electronic device including the display device of one embodiment of the present invention can perform personal authentication by using the captured fingerprint. Accordingly, an imaging device for the fingerprint authentication or palm-print authentication does not need to be additionally provided, and the number of components of the electronic device can be reduced. Furthermore, since the light-receiving elements are arranged in a matrix in the display portion, an image of a fingerprint, a palm print, or the like can be captured in any portion in the display portion, which can provide a convenient electronic device.

Here, the display portion can have a configuration in which first pixel circuits each including the light-receiving element and one or more transistors are arranged in a matrix and second pixel circuits each including the light-emitting element and one or more transistors are arranged in a matrix.

More specific configuration examples are described below with reference to drawings.

Figure 7A:
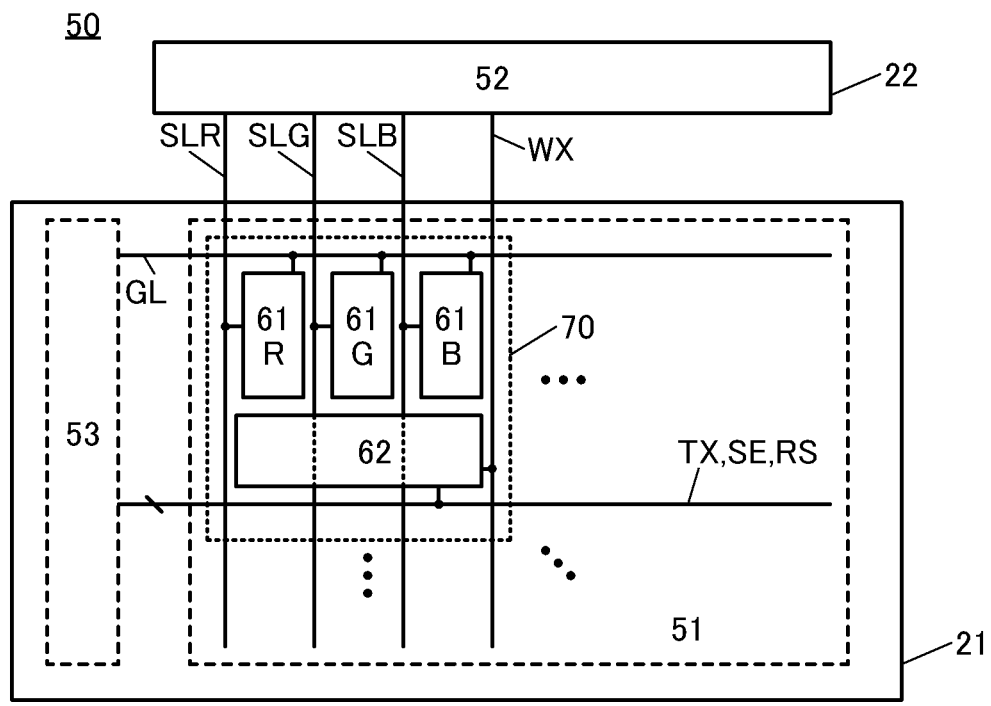
FIG. 7A is a configuration example of a display device.

FIG. 7A is a block diagram of a display device 50. The display device 50 includes a display portion 51, a circuit portion 52, a driver circuit portion 53, and the like.

FIG. 7A illustrates an example in which the display portion 51 and the driver circuit portion 53 are provided over the substrate 21 and the circuit portion 52 is provided over the substrate 22. The substrate 22 is preferably formed to have a chip shape to have a form of an $I_C$ chip. At this time, the $I_C$ chip including the substrate 22 is preferably bonded to the substrate 21 or an FPC (Flexible Printed Circuit) connected to the substrate 21 with an anisotropic conductive film (ACF), an anisotropic conductive paste (ACP), a bump, or the like. Note that the display portion 51 and the driver circuit portion 53 may be provided over different substrates. Alternatively, the display portion 51, the circuit portion 52, and the driver circuit portion 53 may be provided over one substrate.

The display portion 51 includes a plurality of pixels 70 arranged in a matrix. The pixels 70 each include a subpixel 61R, a subpixel 61G, a subpixel 61B, and an imaging pixel 62. The subpixel 61R, the subpixel 61G, and the subpixel 61B each include a light-emitting element functioning as a display element. The imaging pixel 62 includes a light-receiving element functioning as a photoelectric conversion element.

The pixel 70 is electrically connected to a wiring GL, a wiring SLR, a wiring SLG, a wiring SLB, the wiring TX, the wiring SE, the wiring RS, the wiring WX, and the like. The wiring SLR, the wiring SLG, the wiring SLB, and the wiring WX are electrically connected to the circuit portion 52. The wiring GL, the wiring TX, the wiring SE, and the wiring RS are electrically connected to the driver circuit portion 53. The circuit portion 52 functions as a source line driver circuit (also referred to as a source driver) and a reading circuit. The driver circuit portion 53 functions as a gate line driver circuit (also referred to as a gate driver) and a driver circuit of the imaging pixel 62.

The pixels 70 each include the subpixel 61R, the subpixel 61G, and the subpixel 61B. For example, the subpixel 61R exhibits a red color, the subpixel 61G exhibits a green color, and the subpixel 61B exhibits a blue color. Thus, the display device 50 can perform full-color display. Note that although the example where the pixels 70 each include subpixels of three colors is shown here, subpixels of four or more colors may be included.

The subpixel 61R, the subpixel 61G, and the subpixel 61B each include a light-emitting element and a pixel circuit. The pixel circuit has a function of controlling the gray level of the light-emitting element on the basis of a signal (potential) that is supplied from the circuit portion 52 and input through the wiring SLR, the wiring SLG, or the wiring SLB.

The subpixel 61R includes a light-emitting element emitting red light. The subpixel 61G includes a light-emitting element emitting green light. The subpixel 61B includes a light-emitting element emitting blue light. Note that the pixel 70 may include a subpixel including a light-emitting element emitting light of another color. For example, the pixel 70 may include, in addition to the three subpixels, a subpixel including a light-emitting element emitting white light, a subpixel including a light-emitting element emitting yellow light, or the like.

The wiring GL is electrically connected to the subpixel 61R, the subpixel 61G, and the subpixel 61B arranged in a row direction (an extending direction of the wiring GL). The wiring SLR is electrically connected to a plurality of subpixels 61R (not illustrated) arranged in a column direction (an extending direction of the wiring SLR and the like). Similarly, the wiring SLG and the wiring SLB are respectively electrically connected to a plurality of subpixels 61G and a plurality of subpixels 61B (not illustrated) arranged in the column direction.

The imaging pixel 62 included in the pixel 70 is electrically connected to the wiring TX, the wiring SE, the wiring RS, and the wiring WX.

The driver circuit portion 53 has a function of generating a signal for driving the imaging pixel 62 and outputting the signal to the imaging pixel 62 through the wiring SE, the wiring TX, and the wiring RS. The circuit portion 52 has a function of receiving a signal output from the imaging pixel 62 through the wiring WX and outputting the signal to the outside as image data. The circuit portion 52 functions as a reading circuit.

[Configuration Example 1 of Pixel Circuit]

Figure 7B:
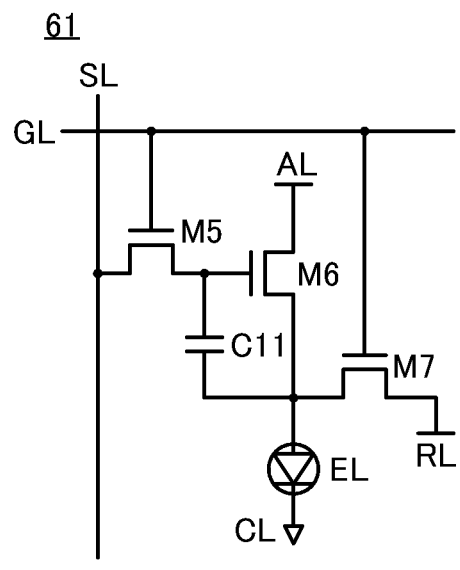
FIG. 7B and FIG. 7C are configuration examples of a pixel.

FIG. 7B illustrates an example of a circuit diagram of a pixel 61 that can be used as the subpixel 61R, the subpixel 61G, and the subpixel 61B. The pixel 61 includes a transistor M5, a transistor M6, a transistor M7, a capacitor C11, and a light-emitting element EL. The wiring GL and the wiring SL are electrically connected to the pixel 61. The wiring SL corresponds to any of the wiring SLR, the wiring SLG, and the wiring SLB illustrated in FIG. 7A.

A gate of the transistor M5 is electrically connected to the wiring GL, one of a source and a drain of the transistor M5 is electrically connected to the wiring SL, and the other of the source and the drain of the transistor M5 is electrically connected to one electrode of the capacitor C11 and a gate of the transistor M6. One of a source and a drain of the transistor M6 is electrically connected to a wiring AL, and the other of the source and the drain of the transistor M6 is electrically connected to one electrode of the light-emitting element EL, the other electrode of the capacitor C11, and one of a source and a drain of the transistor M7. A gate of the transistor M7 is electrically connected to the wiring GL, and the other of the source and the drain of the transistor M7 is electrically connected to the wiring RL. The other electrode of the light-emitting element EL is electrically connected to the wiring CL.

The transistor M5 and the transistor M7 each function as a switch. For example, the transistor M6 functions as a transistor that controls a current flowing through the light-emitting element EL.

Here, it is preferable to use Si transistors as all of the transistor M5 to the transistor M7. In particular, as the Si transistor, a transistor in which LTPS is used as a semiconductor where a channel is formed (LTPS transistor) is preferably used. Alternatively, it is preferable to use OS transistors as all of the transistor M5 to the transistor M7. Alternatively, it is preferable to use OS transistors as the transistor M5 and the transistor M7 and to use an LTPS transistor as the transistor M6.

An OS transistor can have an extremely low off-state current. Thus, it is particularly preferable to use a transistor using an oxide semiconductor as the transistor M5 and the transistor M7 each of which is connected in series with the capacitor C11. Accordingly, charge held in the capacitor C1 can be prevented from leaking through the transistor M5 or the transistor M7. Furthermore, since charge held in the capacitor C11 can be held for a long period, a still image can be displayed for a long period without rewriting data in the pixel 61.

A data potential is supplied to the wiring SL. A selection signal is supplied to the wiring GL. The selection signal includes a potential for bringing a transistor into a conducting state and a potential for bringing a transistor into a non-conducting state.

A reset potential is supplied to the wiring RL. An anode potential is supplied to the wiring AL. A cathode potential is supplied to the wiring CL. In the pixel 61, the anode potential is higher than the cathode potential. The reset potential supplied to the wiring RL can be set such that a potential difference between the reset potential and the cathode potential is lower than the threshold voltage of the light-emitting element EL. The reset potential can be a potential higher than the cathode potential, a potential equal to the cathode potential, or a potential lower than the cathode potential.

Figure 7C:
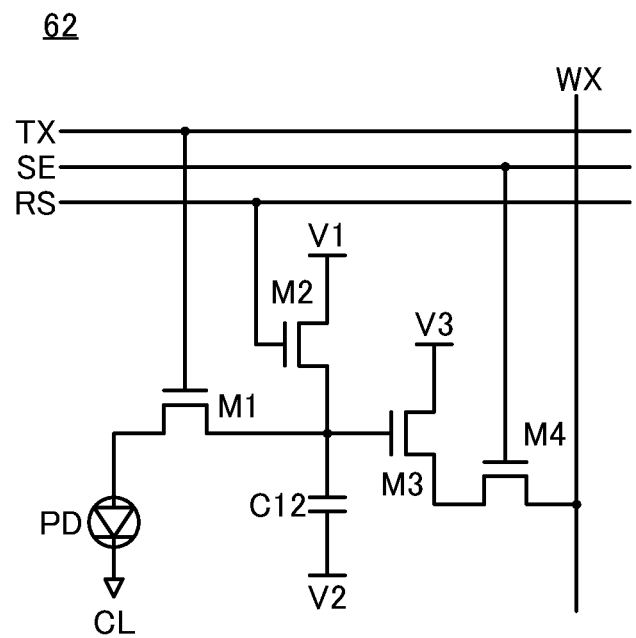

FIG. 7C illustrates an example of a circuit diagram of the imaging pixel 62. The imaging pixel 62 has a configuration similar to that of the pixel 15[i,j] shown in FIG. 5A as an example. The configuration illustrated in FIG. 7C is similar to that illustrated in FIG. 5A except that the capacitor C12 is included instead of the capacitor C; thus, the above description can be referred to for the detailed description.

Note that transistors each including a pair of gates overlapping with each other with a semiconductor layer therebetween can be used as the transistors included in the pixel 61 and the imaging pixel 62.

In the transistor including a pair of gates, the same potential is supplied to the pair of gates electrically connected to each other, whereby on-state current of the transistor can be increased and the saturation characteristics can be improved. A potential for controlling the threshold voltage of the transistor may be supplied to one of the pair of gates. Furthermore, when a constant potential is supplied to one of the pair of gates, the stability of the electrical characteristics of the transistor can be improved. For example, one of the gates of the transistor may be electrically connected to a wiring to which a constant potential is supplied or may be electrically connected to a source or a drain of the transistor.

[Configuration Examples of Circuit Portion]

Next, examples of the configuration that can be used for the above-described circuit portion 52 are described.

[Configuration Example 1]

Figure 8A:
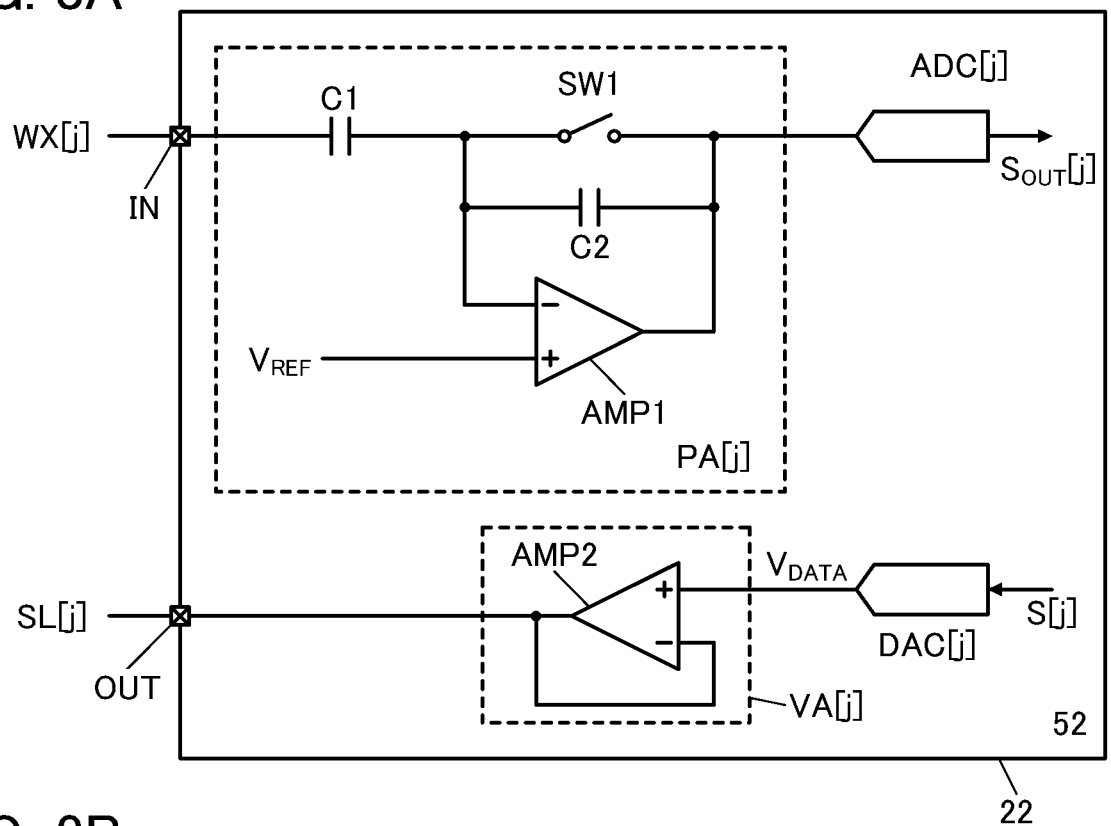
FIG. 8A and FIG. 8B are configuration examples of a circuit portion.

FIG. 8A illustrates a circuit diagram of the circuit portion 52. FIG. 8A illustrates some components corresponding to the j-th wiring WX[j] and the j-th wiring SL[j]. The wiring SL[j] corresponds to the j-th wiring SLR[j], the j-th wiring SLG[j], or the j-th wiring SLB[j] (not illustrated). FIG. 8A illustrates the input terminal IN to which the wiring WX[j] is connected and an output terminal OUT to which the wiring SL[j] is connected.

The circuit portion 52 includes the amplifier portion PA[j], the conversion portion ADC[j], an amplifier portion VA[j], and a conversion portion DAC[j].

The amplifier portion PA[j] and the conversion portion ADC[j] have configurations similar to those of FIG. 1B, which are described above. The amplifier portion PA[j] includes the comparison circuit AMP1, the capacitor C1, the capacitor C2, and the switch SW1. The conversion portion ADC[j] converts an analog potential input from the amplifier portion PA[j] into a digital potential and outputs it as the digital signal Sour[j].

A digital signal S[j] is input to the conversion portion DAC[j], and the conversion portion DAC[j] has a function of converting the signal S[j] into a potential VDATA that is an analog potential and outputting the potential VDATA to the amplifier portion VA[j]. The conversion portion DAC[j] functions as a digital-analog converter circuit. The signal S[j] can also be referred to as a video signal.

The amplifier portion VA[j] outputs the input potential VDATA to the wiring SL[j]. The amplifier portion VA[j] functions as a video amplifier.

FIG. 8A illustrates an example in which the amplifier portion VA[j] includes the comparison circuit AMP2. In the comparison circuit AMP2, an output terminal and an inverting input terminal are electrically connected to each other, and the potential VDATA that is output from the conversion portion DAC[j] is input to a non-inverting input terminal. The output terminal of the comparison circuit AMP2 is electrically connected to the output terminal OUT to which the wiring SL[j] is connected. Accordingly, the potential VDATA can be stably output to the wiring SL[j].

The amplifier portion PA[j], the conversion portion ADC[j], the amplifier portion VA[j], and the conversion portion DAC[j] are provided over the substrate 22, and the substrate 22 is formed to have a chip shape to have a form of an IC, so that a source line driver circuit and a reading circuit of the display device 50 can be formed with one IC. Accordingly, the number of components of the display device 50 and an electronic device in which the display device 50 is used can be reduced. Thus, the manufacturing cost of the display device 50 and an electronic device in which the display device 50 is used can be reduced.

[Configuration Example 2]

Figure 8B:
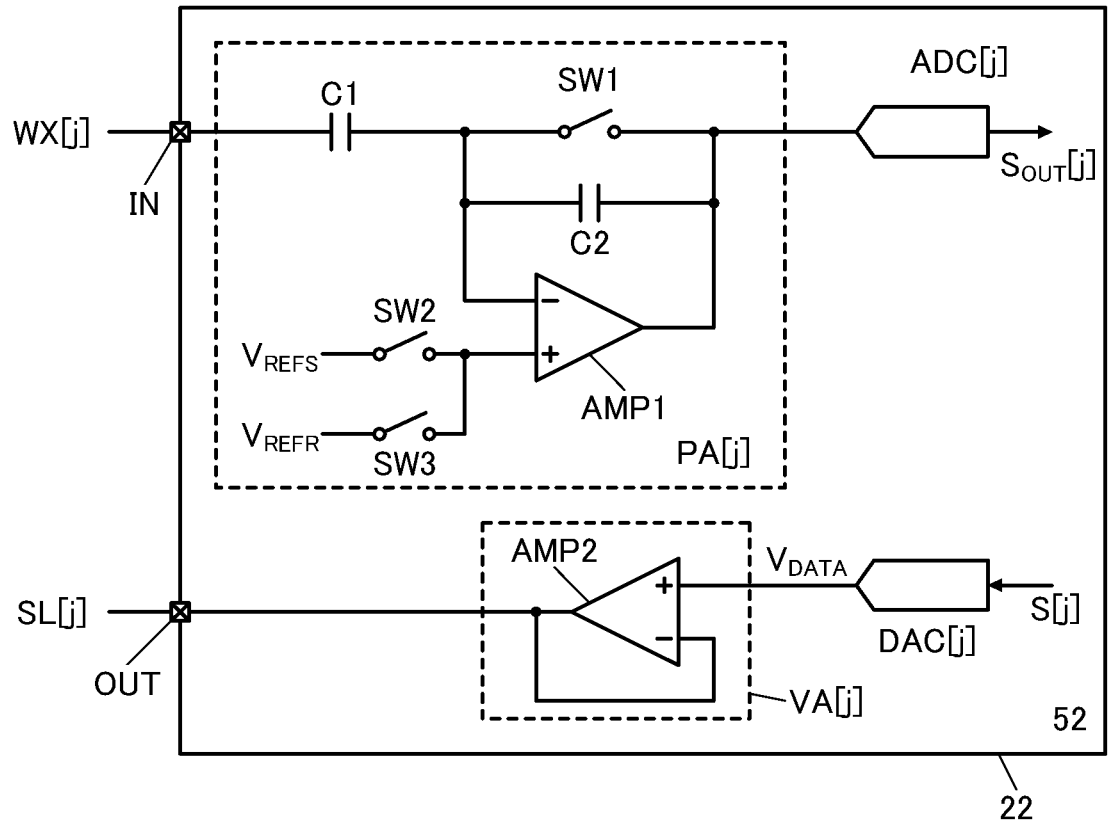

FIG. 8B illustrates a configuration example of the circuit portion 52 in the case where the configuration shown in FIG. 3 as an example, which is described above, is used for the amplifier portion PA[j].

In the amplifier portion PA[j], a wiring to which the reference potential $V_{REFS}$ is supplied through the switch SW2 and a wiring to which the reference potential $V_{REFR}$ is supplied through the switch SW3 are connected to the non-inverting input terminal of the comparison circuit AMP1.

For the driving method example of the amplifier portion PA[j], the above description can be referred to. With such a configuration, occurrence of clipping can be favorably inhibited in the reading operation.

[Configuration Example 3]

Figure 9A:
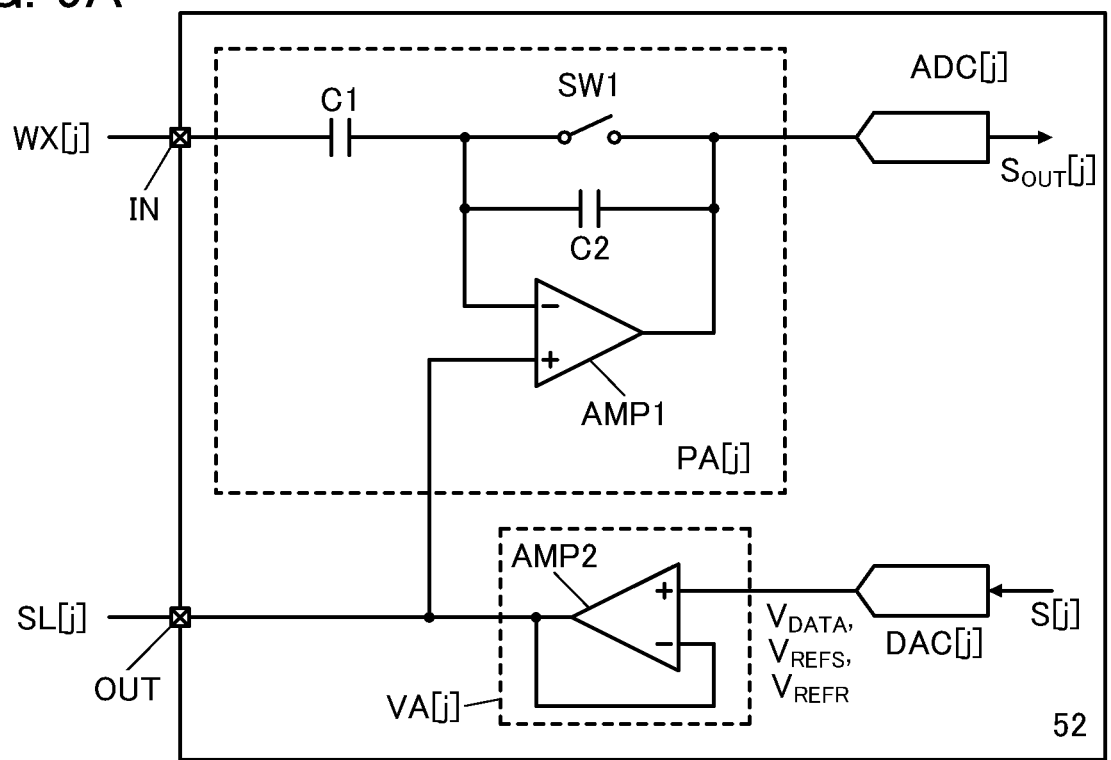
FIG. 9A and FIG. 9B are configuration examples of a circuit portion.

FIG. 9A illustrates a configuration example of the circuit portion 52 that has a configuration partly different from the above.

In FIG. 9A, the output terminal of the comparison circuit AMP2 included in the amplifier portion VA[j] is electrically connected to the non-inverting input terminal of the comparison circuit AMP1 included in the amplifier portion PA[j]. Thus, the output potential of the amplifier portion VA[j] is supplied to the non-inverting input terminal of the comparison circuit AMP1 as a reference potential.

Furthermore, the signal S[j] input to the conversion portion DAC[j] includes, as well as video data, data of two kinds of reference potentials used for the operation of the amplifier portion PA[j]. Thus, as the analog potential output from the conversion portion DAC[j], three kinds of potentials, which are the potential VDATA, the reference potential $V_{REFS}$, and the reference potential $V_{REFR}$, are output in different periods.

In a period of writing to each pixel in the display portion 51, the potential VDATA is sequentially output to the wiring SL[j] through the output terminal OUT on the basis of the video data included in the signal S[j]. In an image capturing period using the imaging pixel 62 of the display portion 51, the reference potential $V_{REFS}$ and the reference potential $V_{REFR}$ are sequentially output to the non-inverting input terminal of the comparison circuit AMP1 on the basis of the data of the reference potential included in the signal S[j].

With such a configuration, for example, the switch SW2, the switch SW3, the wiring to which the reference potential $V_{REFS}$ is supplied, the wiring to which the reference potential $V_{REFR}$ is supplied, and the like in the configuration shown in FIG. 8B as an example can be omitted. Furthermore, a circuit, a wiring, and the like for controlling the switch SW2 and the switch SW3 can also be omitted. Thus, the configuration of the circuit portion 52 can be simplified. Moreover, a power supply circuit (potential generation circuit) for generating the reference potential $V_{REFS}$ and the reference potential $V_{REFR}$ are unnecessary, which can contribute to not only simplification of the configuration but also a reduction in power consumption.

Note that although the case of using the driving method in which the conversion portion DAC[j] outputs two kinds of reference potentials (the reference potential $V_{REFS}$ and the reference potential $V_{REFR}$) and the amplifier portion PA[j] switches the two reference potentials is described here, a configuration in which the reference potentials are not switched may be used. That is, the signal S[j] can be changed so that one kind of reference potential (the reference potential $V_{REF}$) is output from the conversion portion DAC[j]. Thus, with the configuration illustrated in FIG. 9A, the driving method of the reading circuit can be easily switched by signals supplied as the signal S[j]. Moreover, by changing data of the reference potential included in the signal S[j], without change of the circuit configuration, the value of the reference potential can be optimized easily.

[Configuration Example 4]

Figure 9B:
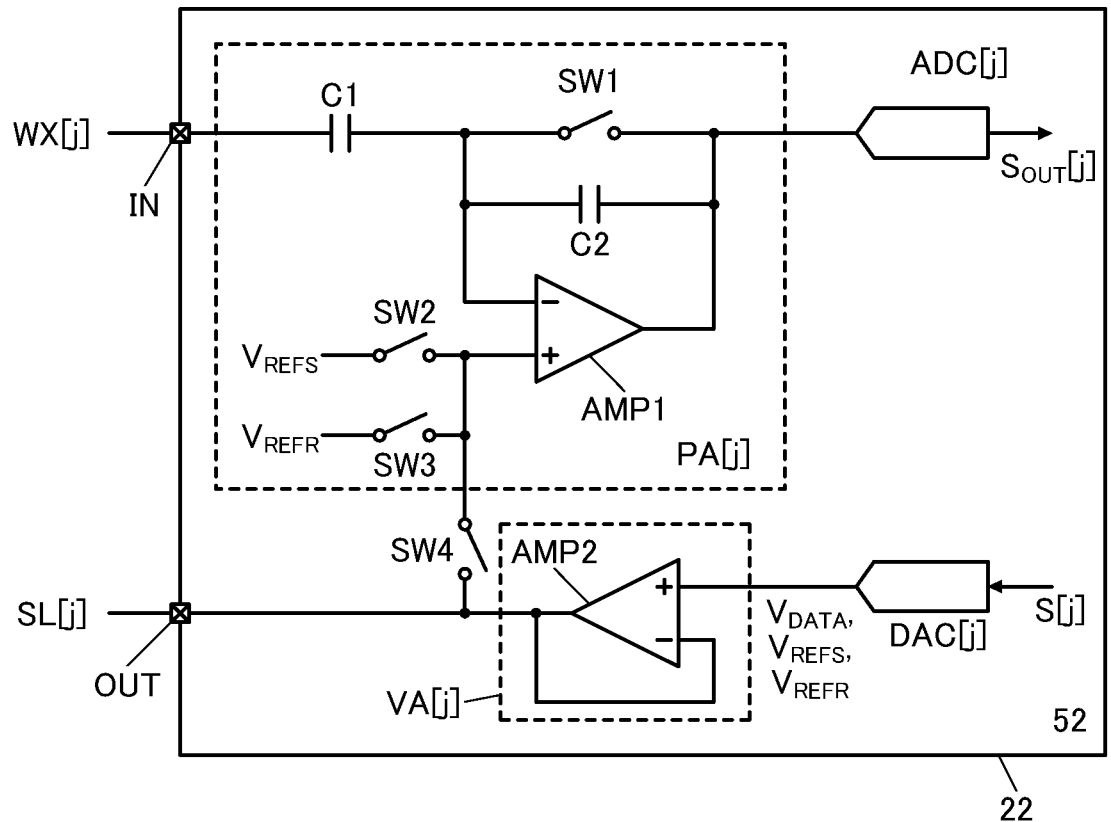

FIG. 9B illustrates an example of the circuit portion 52 having a configuration different from the above.

To the non-inverting input terminal of the comparison circuit AMP1 included in the amplifier portion PA[j], a wiring to which the reference potential $V_{REFS}$ is supplied is connected through the switch SW2, a wiring to which the reference potential $V_{REFR}$ is supplied is connected through the switch SW3, and an output terminal of the amplifier portion VA[j] is connected through a switch SW4.

Figure 4A:
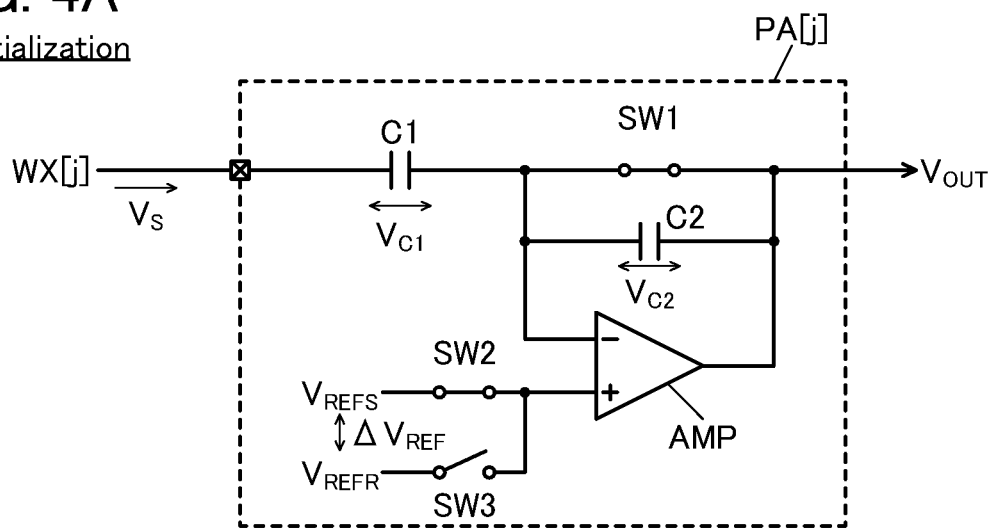
FIG. 4A and FIG. 4B are diagrams illustrating operation of an amplifier portion.
Figure 4B:
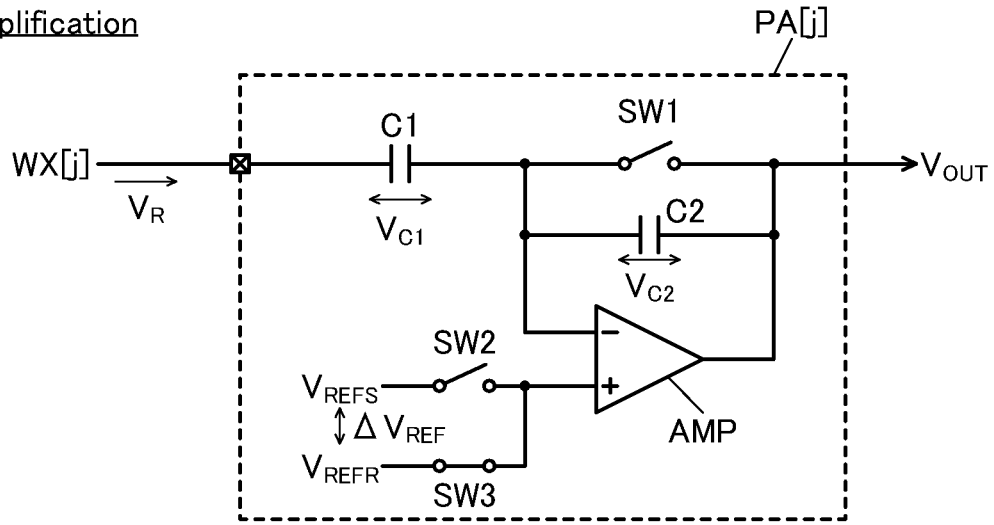

In the configuration illustrated in FIG. 9B, the amplifier portion PA[j] can be driven by the above-described method shown in FIG. 3, FIG. 4A, and FIG. 4B as an example when the switch SW4 is brought into a non-conducting state. When the switch SW4 is brought into a non-conducting state, the output terminal OUT and the amplifier portion PA[j] are electrically separated. Accordingly, writing operation of data to the pixel 70 of the display portion 51 and the reading operation of data from the imaging pixel 62 can be performed in parallel. Thus, the high-speed image capturing can be performed.

When the switch SW4 is brought into a conducting state, the amplifier portion PA[j] can be driven on the basis of the reference potential that is included in the signal S[j] and converted into an analog potential by the conversion portion DAC[j]. With such a configuration, the amplifier portion PA[j] can be driven using another reference potential that is not the preset reference potential $V_{REFS}$ or the preset reference potential $V_{REFR}$.

As described above, in the circuit portion 52 illustrated in FIG. 9B, control of the switch SW4 can switch the driving methods of the amplifier portion PA[j]. For example, selecting and switching to the optimal driving method can be easily performed in accordance with an image capturing mode, illuminance of external light, or the like.

Modification Example

Figure 10A:
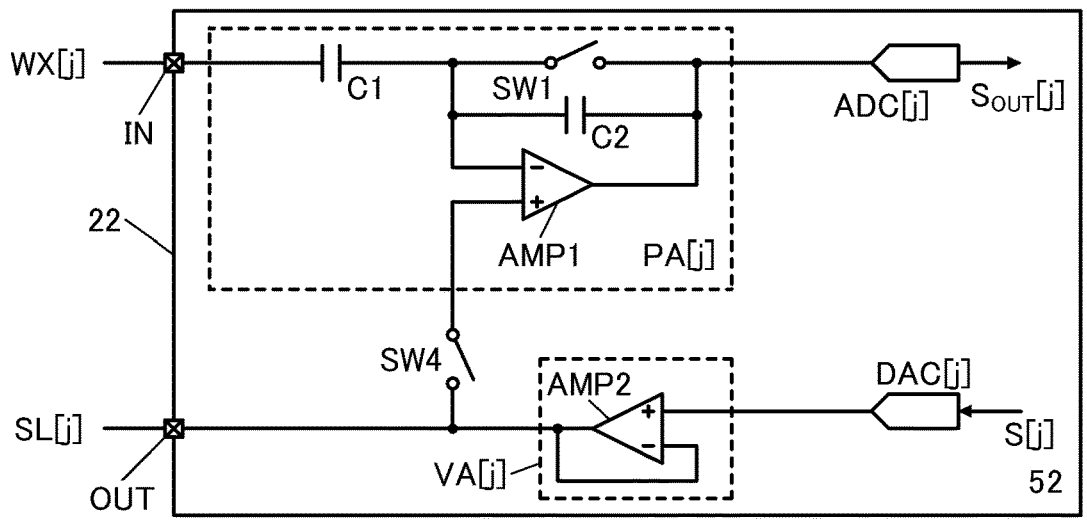
FIG. 10A to FIG. 10C are configuration examples of a circuit portion.

The circuit portion 52 illustrated in FIG. 10A is an example in which the switch SW4 illustrated in FIG. 9B is added to the configuration illustrated in FIG. 9A.

In the circuit portion 52 illustrated in FIG. 10A, during the period of writing to each pixel of the display portion 51, the switch SW4 is brought into a non-conducting state and accordingly the potential VDATA can be prevented from being input to the comparison circuit AMP1; thus, the load of the amplifier portion VA[j] can be reduced. During the image capturing period, the switch SW4 is brought into a conducting state and accordingly the reference potential $V_{REFS}$ or the reference potential $V_{REFR}$ can be output to the comparison circuit AMP1. Alternatively, only the reference potential $V_{REF}$ may be output to the comparison circuit AMP1.

Figure 10B:
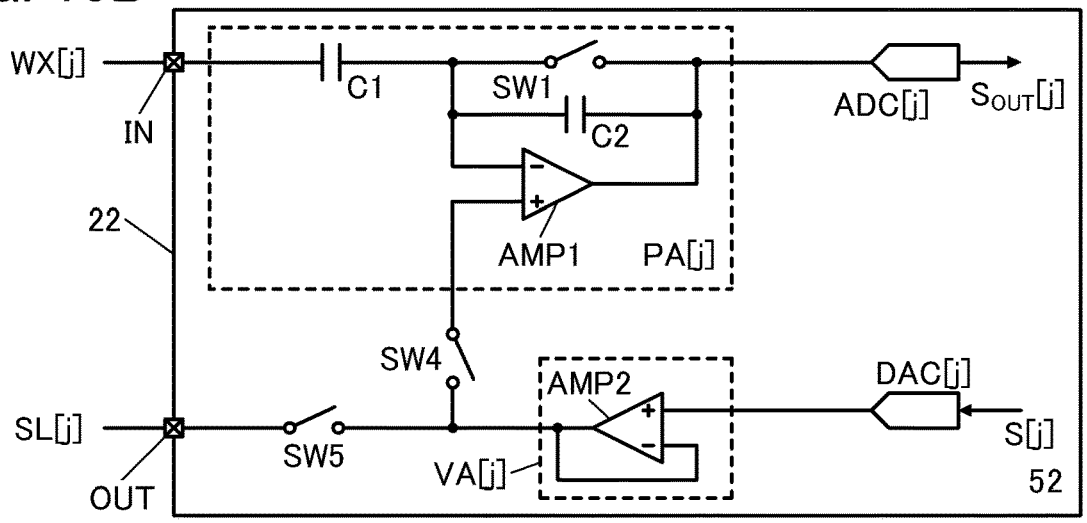

The circuit portion 52 illustrated in FIG. 10B is an example in which a switch SW5 is further added to the configuration illustrated in FIG. 10A. One terminal of the switch SW5 is electrically connected to the output terminal OUT and the other terminal of the switch SW5 is electrically connected to one terminal of the switch SW4 and the output terminal of the comparison circuit AMP2.

The switch SW5 can be brought into a conducting state in the period of writing to each pixel of the display portion 51 and can be brought into a non-conducting state in the image capturing period. Accordingly, in the image capturing period, the amplifier portion VA[j] and the wiring SL[j] can be electrically separated; thus, the load of the amplifier portion VA[j] can be reduced.

Note that a configuration in which the switch SW4 is not provided in FIG. 10B may be used. That is, a configuration in which only the switch SW5 is added to the circuit portion 52 illustrated in FIG. 9A may be used.

Figure 10C:
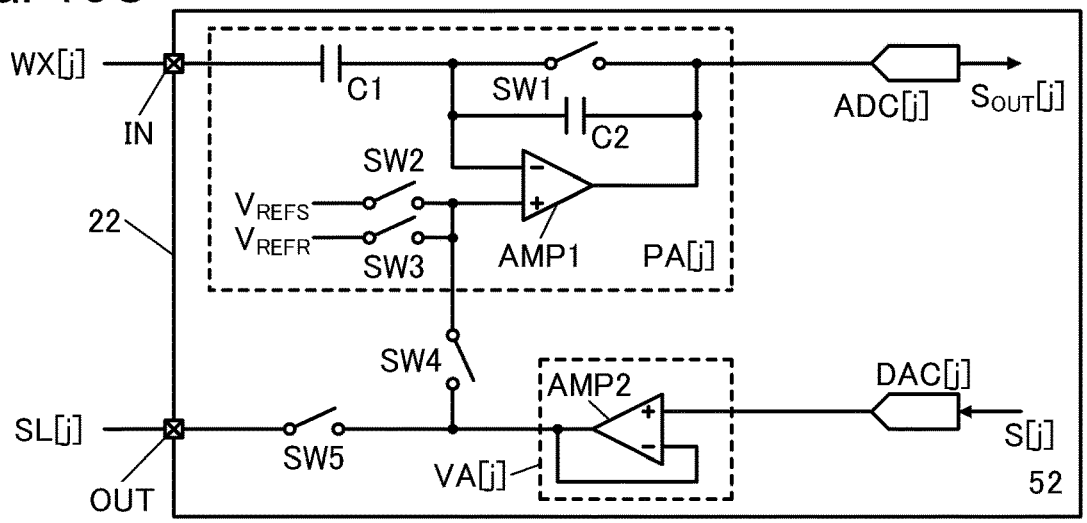

Furthermore, the circuit portion 52 illustrated in FIG. 10C is an example in which the switch SW5 is further added to the configuration shown in FIG. 9B as an example.

The above is the description of the configuration examples of the circuit portion.

[Configuration Examples of Connection Portion]

Configuration examples of a connection portion between the substrate 21 and the substrate 22 are described below.

As described above, in the case where the substrate 22 is formed to have a chip shape and an IC chip including the substrate 22 is bonded to the substrate 21 or the like, a reduction in the number of terminals between them is important to meet the demand for a reduction in cost, a reduction in size of an electronic device, and the like. Configurations of the connection portion in which the number of terminals can be reduced are described below.

[Configuration Example 1]

Figure 11A:
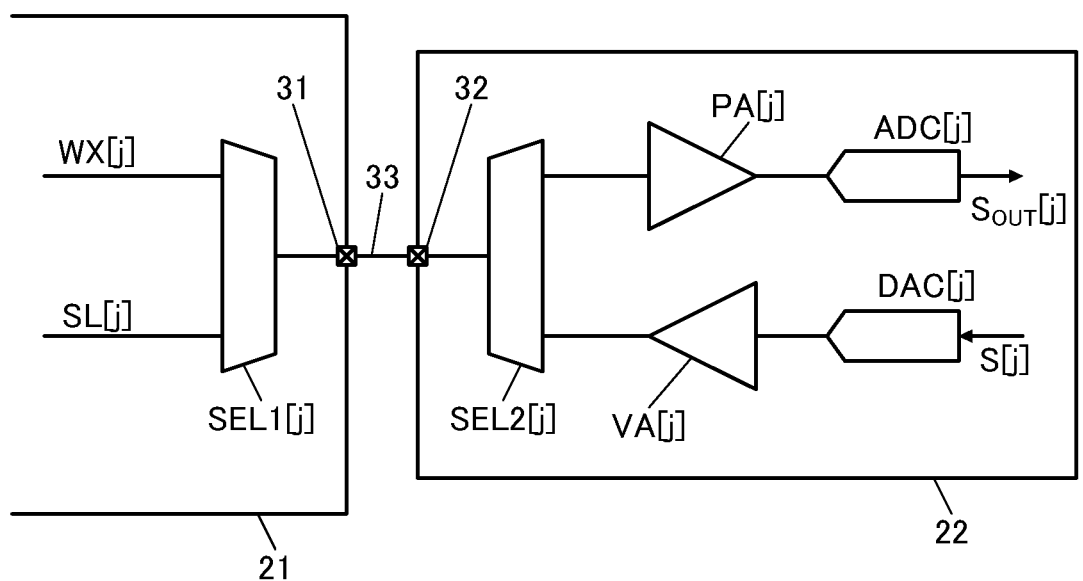
FIG. 11A and FIG. 11B are configuration examples of a display device.

FIG. 11A illustrates configurations of part of the substrate 21 and the substrate 22 and the connection portion between them. The substrate 21 includes a terminal 31, and the substrate 22 includes a terminal 32. Moreover, the terminal 31 and the terminal 32 are connected by a wiring 33.

The wiring 33 is not limited to a wiring and can be in a variety of forms that can electrically connect the terminal 31 and the terminal 32. For example, one or more of a bump, a plug, a connector, an FPC, an ACF, an ACP, and the like can be used as the wiring 33.

The wiring WX[j], the wiring SL[j], and a selection circuit SEL1[j] are provided over the substrate 21. Here, the wiring SL[j] corresponds to any of the wiring SLR[j], the wiring SLG[j], and the wiring SLB[j] (not illustrated).

The wiring WX[j], the wiring SL[j], and the terminal 31 are electrically connected to the selection circuit SEL1[j]. The selection circuit SEL1[j] is a circuit that selects one of the wiring WX[j] and the wiring SL[j] and electrically connects the one of the wirings to the terminal 31. Accordingly, for example, the wiring WX[j] or the wiring SL[j] is electrically connected to the wiring 33 through the terminal 31.

A selection circuit SEL2[j], the amplifier portion PA[j], the conversion portion ADC[j], the amplifier portion VA[j], and the conversion portion DAC[j] are provided over the substrate 22. For the configurations of the amplifier portion PA[j], the conversion portion ADC[j], the amplifier portion VA[j], and the conversion portion DAC[j], the above description can be referred to. Note that in FIG. 11A, the amplifier portion PA[j] and the amplifier portion VA[j] are simply illustrated using circuit symbols.

The input terminal of the amplifier portion PA[j], the output terminal of the amplifier portion VA[j], and the terminal 32 are electrically connected to the selection circuit SEL2[j]. The selection circuit SEL2[j] is a circuit that selects one of a wiring to which the input terminal of the amplifier portion PA[j] is connected and a wiring to which the output terminal of the amplifier portion VA[j] is connected and electrically connects the one of the wirings to the terminal 32. Accordingly, for example, the wiring to which the input terminal of the amplifier portion PA[j] is connected or the wiring to which the output terminal of the amplifier portion VA[j] is connected is electrically connected to the wiring 33 through the terminal 32.

In the period of writing to each pixel of the display portion 51, the selection circuit SEL1[j] selects the wiring SL[j], the selection circuit SEL2[j] selects the wiring to which the output terminal of the amplifier portion VA[j] is connected. Accordingly, the potential VDATA generated in the conversion portion DAC[j] is output to the wiring SL[j] through the selection circuit SEL2[j], the terminal 32, the wiring 33, the terminal 31, and the selection circuit SEL1[j].

In contrast, in the image capturing period using the imaging pixel 62 of the display portion 51, the selection circuit SEL1[j] selects the wiring WX[j], and the selection circuit SEL2[j] selects the wiring to which the input terminal of the amplifier portion PA[j] is connected. Accordingly, the potential $V_S$ as the potential of the first signal and the potential $V_R$ as the potential of the second signal that are input from the wiring WX[j] are input to the amplifier portion PA[j] through the selection circuit SEL1[j], the terminal 31, the wiring 33, the terminal 32, and the selection circuit SEL2[j].

With such a configuration, the number of terminals for connecting the substrate 21 and the substrate 22 can be reduced.

[Configuration Example 2]

Figure 11B:
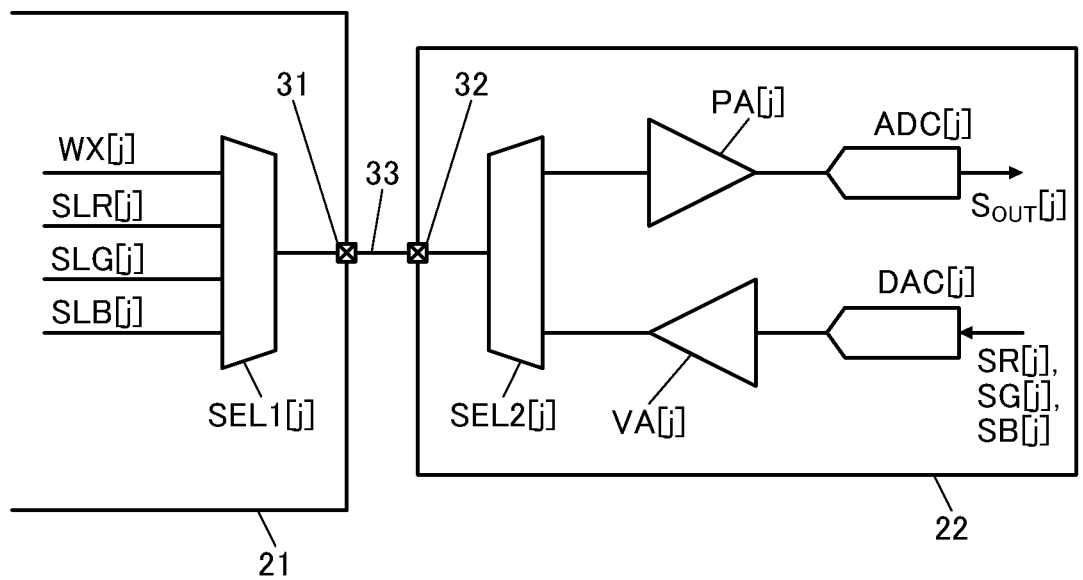

In an example illustrated in FIG. 11B, the wiring WX[j], the wiring SLR[j], the wiring SLG[j], and the wiring SLB[j] are connected to the selection circuit SEL1[j] included in the substrate 21.

The selection circuit SEL1[j] has a function of selecting any one of the wiring WX[j], the wiring SLR[j], the wiring SLG[j], and the wiring SLB[j] and electrically connects the one of the wirings to the terminal 31. For example, the wiring WX[j], the wiring SLR[j], the wiring SLG[j], or the wiring SLB[j] is electrically connected to the wiring 33 through the terminal 31.

In contrast, in the substrate 22, a signal SR[j], a signal SG[j], and a signal SB[j] are input to the conversion portion DAC[j] in different periods. The signal SR[j] is a signal including a data potential output to the wiring SLR[j]. Similarly, the signal SG[j] is a signal including a data potential output to the wiring SLG[j], and the signal SB[j] is a signal including a data potential output to the wiring SLB[j].

In the period of writing to each pixel of the display portion 51, the selection circuit SEL1[j] sequentially selects the wiring SLR[j], the wiring SLG[j], and the wiring SLB[j], and the selection circuit SEL2[j] selects the wiring to which the output terminal of the amplifier portion VA[j] is connected. Accordingly, data potentials are sequentially output to the wiring SLR[j], the wiring SLG[j], and the wiring SLB[j].

In contrast, in the image capturing period using the imaging pixel 62 of the display portion 51, the selection circuit SEL1[j] selects the wiring WX[j], and the selection circuit SEL2[j] selects the wiring to which the input terminal of the amplifier portion PA[j] is connected. Accordingly, the potential $V_S$ and the potential $V_R$ are input from the wiring WX[j] to the amplifier portion PA[j].

Note that although an example in which three source lines (the wiring SLR[j], the wiring SLG[j], and the wiring SLB[j]) are connected to the selection circuit SEL1[j] is shown here, the number of source lines is not limited to this and may be two or four or more. The number of connected source lines is particularly preferably a multiple of 3.

With such a configuration, the number of terminals for connecting the substrate 21 and the substrate 22 can be further reduced.

Here, the configurations of the selection circuit SEL1[j] and the selection circuit SEL2[j] are not particularly limited and the selection circuit SEL1[j] and the selection circuit SEL2[j] can have a variety of configurations. For example, a circuit that includes a plurality of analog switches and can control conduction or non-conduction of a wiring by the analog switches can be favorably used.

The above is the description of the configuration examples of the terminal portion.

At least part of the configuration examples, the drawings corresponding thereto, and the like shown in this embodiment as an example can be implemented in combination with the other configuration examples, the other drawings, and the like as appropriate.

At least part of this embodiment can be implemented in combination with the other embodiments described in this specification as appropriate.

Embodiment 2

In this embodiment, structure examples of a display device of one embodiment of the present invention are described.

A display device shown below as an example includes a light-emitting element and a light-receiving element. The display device has a function of displaying an image, a function of performing position sensing with reflected light from an object to be sensed, and a function of capturing an image of a fingerprint or the like with reflected light from an object to be sensed. The display device shown below as an example can also be regarded to have a function of a touch panel and a function of a fingerprint sensor.

A display device according to one embodiment of the present invention includes a light-emitting element emitting first light (a light-emitting device) and a light-receiving element receiving the first light (a light-receiving device). That is, the light-receiving element is an element whose light-receiving wavelength range covers an emission wavelength of the light-emitting element. The light-receiving element is preferably a photoelectric conversion element. As the first light, visible light or infrared light can be used. In the case where infrared light is used as the first light, in addition to the light-emitting element emitting the first light, a light-emitting element emitting visible light can be included.

In addition, the display device includes a pair of substrates (also referred to as a first substrate and a second substrate). The light-emitting element and the light-receiving element are arranged between the first substrate and the second substrate. The first substrate is positioned on a display surface side, and the second substrate is positioned on a side opposite to the display surface side.

Visible light is emitted from the light-emitting element to the outside through the first substrate. A plurality of such light-emitting elements arranged in a matrix are included in the display device, so that an image can be displayed.

The first light emitted from the light-emitting element reaches a surface of the first substrate. Here, when an object touches a surface of the first substrate, the first light is scattered at an interface between the first substrate and the object, and part of the scattered light enters the light-receiving element. When receiving the first light, the light-receiving element can convert the light into an electric signal in accordance with the intensity of the first light and output the electric signal. In the case where a plurality of light-receiving elements arranged in a matrix are included in the display device, positional data, shape, or the like of the object that touches the first substrate can be sensed. That is, the display device can function as an image sensor panel, a touch sensor panel, or the like.

Note that even in the case where the object does not touch the surface of the first substrate, the first light that has passed the first substrate is reflected or scattered in the surface of the object, and the reflected light or the scattered light is incident on the light-receiving element through the first substrate. Thus, the display device can also be used as a non-contact touch sensor panel (also referred to as a near-touch panel).

In the case where visible light is used as the first light, the first light used for image display can be used as a light source of a touch sensor. In that case, the light-emitting element has a function of a display element and a function of a light source, so that the structure of the display device can be simplified. In contrast, in the case where infrared light is used as the first light, a user does not perceive the infrared light, so that image capturing or sensing can be performed by the light-receiving element without a reduction in visibility of a displayed image.

In the case where infrared light is used as the first light, infrared light, preferably near-infrared light is used. In particular, near-infrared light having one or more peaks in the range of a wavelength greater than or equal to 700 nm and less than or equal to 2500 nm can be favorably used. In particular, the use of light having one or more peaks in the range of a wavelength greater than or equal to 750 nm and less than or equal to 1000 nm is preferable because it permits an extensive choice of a material used for an active layer of the light-receiving element.

When a fingertip touches a surface of the display device, the image of a shape of a fingerprint can be captured. The fingerprint has a projection and a depression. The first light is likely to be scattered in the projection of the fingerprint that touches the surface of the first substrate. Therefore, the intensity of scattered light that enters the light-receiving element overlapping with the projection of the fingerprint is high, and the intensity of scattered light that enters the light-receiving element overlapping with the depression is low. Utilizing this, a fingerprint image can be captured. A device including the display device of one embodiment of the present invention can perform fingerprint authentication, which is a kind of biometric authentication, by utilizing a captured fingerprint image.

In addition, the display device can also capture an image of a blood vessel, especially a vein of a finger, a hand, or the like. For example, light having a wavelength of 760 nm and its vicinity is not absorbed by reduced hemoglobin in a vein, so that the position of the vein can be sensed by making an image from reflected light from a palm, a finger, or the like that is received by the light-receiving element. A device including the display device of one embodiment of the present invention can perform vein authentication, which is a kind of biometric authentication, by utilizing a captured vein image.

In addition, the device including the display device of one embodiment of the present invention can perform touch sensing, fingerprint authentication, and vein authentication at the same time. Thus, high-security biological authentication can be performed at low cost without increasing the number of components.

The light-receiving element is preferably an element capable of receiving visible light and infrared light. In that case, as the light-emitting element, both a light-emitting element emitting infrared light and a light-emitting element emitting visible light are preferably included. Accordingly, visible light is reflected by a user's finger and reflected light is received by the light-receiving element, so that an image of a fingerprint can be captured. Furthermore, an image of a shape of a vein can be captured with infrared light. Accordingly, both fingerprint authentication and vein authentication can be performed in one display device. Moreover, fingerprint image capturing and vein image capturing may be performed either at different timings or at the same time. In the case where fingerprint image capturing and vein image capturing are performed at the same time, image data including both data on the shape of a fingerprint and data on the shape of a vein can be obtained, so that biometric authentication with higher accuracy can be achieved.

The display device of one embodiment of the present invention may have a function of sensing user's health conditions. For example, by utilizing changes in reflectance and transmittance with respect to visible light and infrared light in accordance with a change in blood oxygen saturation, temporal modulation of the oxygen saturation is obtained, from which a heart rate can be measured. Furthermore, a glucose concentration in dermis, a neutral fat concentration in the blood, or the like can also be measured with infrared light or visible light. The device including the display device of one embodiment of the present invention can be used as a health care device capable of obtaining index data on user's health conditions.

As the first substrate, a sealing substrate for sealing the light-emitting element, a protective film, or the like can be used, for example. In addition, a resin layer may be provided between the first substrate and the second substrate to attach the first substrate and the second substrate to each other.

Here, as the light-emitting element, an EL element such as an OLED (Organic Light Emitting Diode) or a QLED (Quantum-dot Light Emitting Diode) is preferably used. As a light-emitting substance included in the EL element, a substance which emits fluorescence (a fluorescent material), a substance which emits phosphorescence (a phosphorescent material), a substance which exhibits thermally activated delayed fluorescence (a thermally activated delayed fluorescent (TADF) material), an inorganic compound (e.g., a quantum dot material), and the like can be given. Alternatively, an LED such as a micro-LED (Light Emitting Diode) can be used as the light-emitting element.

As the light-receiving element, a pn photodiode or a pin photodiode can be used, for example. The light-receiving element functions as a photoelectric conversion element that senses light incident on the light-receiving element and generates charge. The amount of generated charge in the photoelectric conversion element is determined depending on the amount of incident light. It is particularly preferable to use an organic photodiode including a layer containing an organic compound as the light-receiving element. An organic photodiode, which is easily made thin, lightweight, and large in area and has a high degree of freedom for shape and design, can be used in a variety of display devices.

The light-emitting element can have a stacked-layer structure including a light-emitting layer between a pair of electrodes, for example. The light-receiving element can have a stacked-layer structure including an active layer between a pair of electrodes. A semiconductor material can be used for the active layer of the light-receiving element. For example, an inorganic semiconductor material such as silicon can be used.

An organic compound is preferably used for the active layer of the light-receiving element. In that case, one electrode of the light-emitting element and one electrode of the light-receiving element (the electrodes are also referred to as pixel electrodes) are preferably provided on the same plane. It is further preferable that the other electrode of the light-emitting element and the other electrode of the light-receiving element be an electrode (also referred to as a common electrode) formed using one continuous conductive layer. It is still further preferable that the light-emitting element and the light-receiving element include a common layer. Thus, the manufacturing process of the light-emitting element and the light-receiving element can be simplified, so that the manufacturing cost can be reduced and the manufacturing yield can be increased.

More specific examples are described below with reference to drawings.

[Structure Example 1 of Display Panel]
[Structure Example 1-1]

Figure 12A:
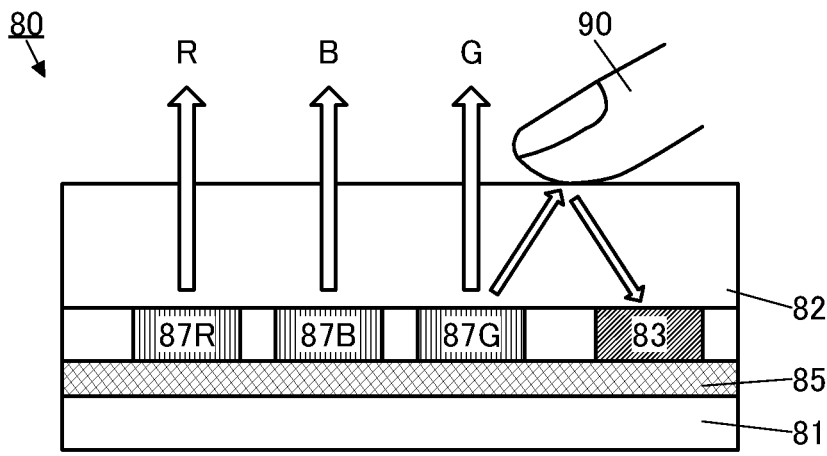
FIG. 12A, FIG. 12B, FIG. 12D, and FIG. 12F to FIG. 12H are structure examples of a display device.

A schematic diagram of a display panel 80 is illustrated in FIG. 12A. The display panel 80 includes a substrate 81, a substrate 82, a light-receiving element 83, a light-emitting element 87R, a light-emitting element 87G, a light-emitting element 87B, a functional layer 85, and the like.

The light-emitting element 87R, the light-emitting element 87G, the light-emitting element 87B, and the light-receiving element 83 are provided between the substrate 81 and the substrate 82.

The light-emitting element 87R, the light-emitting element 87G, and the light-emitting element 87B emit red (R) light, green (G) light, and blue (B) light, respectively.

The display panel 80 includes a plurality of pixels arranged in a matrix. One pixel includes one or more subpixels. One subpixel includes one light-emitting element. For example, the pixel can have a structure including three subpixels (e.g., three colors of R, G, and B or three colors of yellow (Y), cyan (C), and magenta (M)) or four subpixels (e.g., four colors of R, G, B, and white (W) or four colors of R, G, B, and Y). The pixel further includes the light-receiving element 83. The light-receiving element 83 may be provided in all the pixels or may be provided in some of the pixels. In addition, one pixel may include a plurality of light-receiving elements 83.

FIG. 12A illustrates a finger 90 touching a surface of the substrate 82. Part of light emitted from the light-emitting element 87G is reflected or scattered by a contact portion of the substrate 82 and the finger 90. In the case where part of reflected light or scattered light is incident on the light-receiving element 83, the contact of the finger 90 with the substrate 82 can be sensed. That is, the display panel 80 can function as a touch panel.

The functional layer 85 includes a circuit that drives the light-emitting element 87R, the light-emitting element 87G, and the light-emitting element 87B and a circuit that drives the light-receiving element 83. The functional layer 85 is provided with a switch, a transistor, a capacitor, a wiring, and the like. Note that in the case where the light-emitting element 87R, the light-emitting element 87G, the light-emitting element 87B, and the light-receiving element 83 are driven by a passive-matrix method, a structure not provided with a switch, a transistor, or the like may be employed.

Figure 12B:
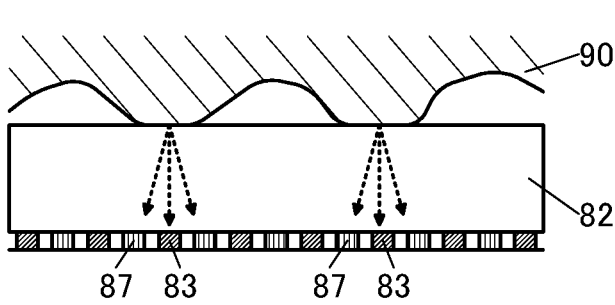

The display panel 80 may have a function of sensing a fingerprint of the finger 90. FIG. 12B schematically illustrates an enlarged view of the contact portion in a state where the finger 90 touches the substrate 82. FIG. 12B illustrates light-emitting elements 87 and the light-receiving elements 83 that are alternately arranged.

The fingerprint of the finger 90 is formed of depressions and projections. Therefore, as shown in FIG. 12B, the projections of the fingerprint touch the substrate 82, and scattered light (indicated by dashed arrows) occurs at the contact surfaces.

As shown in FIG. 12B, in the intensity distribution of the scattered light on the surface where the finger 90 touches the substrate 82, the intensity of light almost perpendicular to the contact surface is the highest, and the intensity of light becomes lower as an angle becomes larger in an oblique direction. Thus, the intensity of light received by the light-receiving element 83 positioned directly below the contact surface (i.e., positioned in a portion overlapping with the contact surface) is the highest. Scattered light at greater than or equal to a predetermined scattering angle is fully reflected in the other surface (a surface opposite to the contact surface) of the substrate 82 and does not pass through the light-receiving element 83. As a result, a clear fingerprint image can be captured.

In the case where an arrangement interval between the light-receiving elements 83 is smaller than a distance between two projections of a fingerprint, preferably a distance between a depression and a projection adjacent to each other, a clear fingerprint image can be obtained. The distance between a depression and a projection of a human's fingerprint is approximately 200 μm; thus, the arrangement interval between the light-receiving elements 83 is, for example, less than or equal to 400 μm, preferably less than or equal to 200 μm, further preferably less than or equal to 150 μm, still further preferably less than or equal to 100 μm, even still further preferably less than or equal to 50 μm and greater than or equal to 1 μm, preferably greater than or equal to 10 μm, further preferably greater than or equal to 20 μm.

Figure 12C:
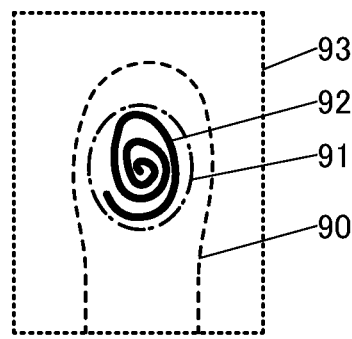
FIG. 12C and FIG. 12E are examples of an image.

FIG. 12C illustrates an example of a fingerprint image captured with the display panel 80. In an image capturing range 93 in FIG. 12C, the outline of the finger 90 is indicated by a dashed line and the outline of a contact portion 91 is indicated by a dashed-dotted line. In the contact portion 91, a high-contrast image of a fingerprint 92 can be captured owing to a difference in the amount of light incident on the light-receiving elements 83.

Figure 12D:
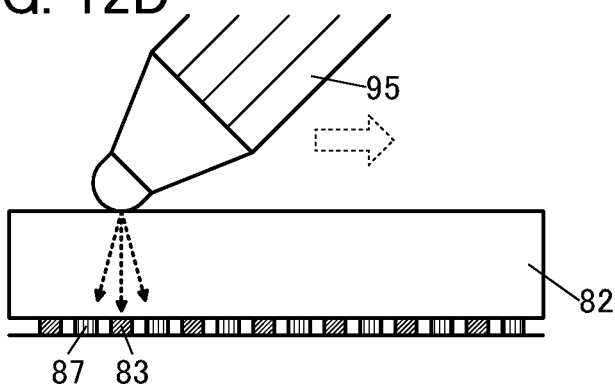

The display panel 80 can also function as a touch panel or a pen tablet. FIG. 12D shows a state in which a tip of a stylus 95 slides in a direction indicated by a dashed arrow while the tip of the stylus 95 touches the substrate 82.

As shown in FIG. 12D, when light scattered by the contact surface of the tip of the stylus 95 and the substrate 82 is incident on the light-receiving element 83 that overlaps with the contact surface, the position of the tip of the stylus 95 can be sensed with high accuracy.

Figure 12E:
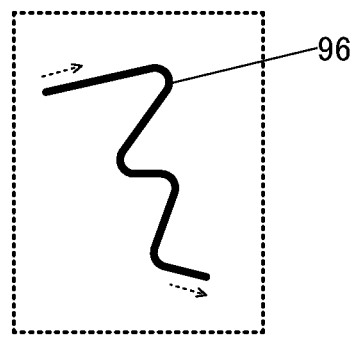

FIG. 12E illustrates an example of a path 96 of the stylus 95 that is sensed by the display panel 80. The display panel 80 can sense the position of a sensing target, such as the stylus 95, with high position accuracy, so that high-definition drawing can be performed using a drawing application or the like. Unlike the case of using a capacitive touch sensor, an electromagnetic induction touch pen, or the like, the display panel 80 can detect even the position of a highly insulating object to be detected, the material of a tip portion of the stylus 95 is not limited, and a variety of writing materials (e.g., a brush, a glass pen, a quill pen, and the like) can be used.

Figure 12F:
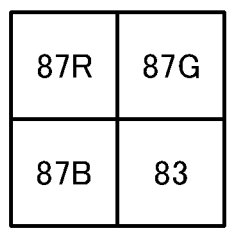
Figure 12G:
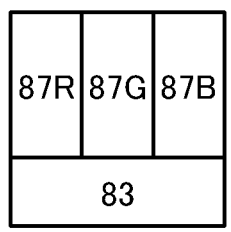
Figure 12H:
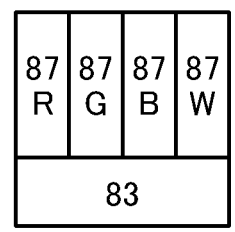

Here, FIG. 12F to FIG. 12H illustrate examples of a pixel that can be used in the display panel 80.

Pixels shown in FIG. 12F and FIG. 12G include the light-emitting element 87R for red (R), the light-emitting element 87G for green (G), the light-emitting element 87B for blue (B), and the light-receiving element 83. The pixels each include a pixel circuit for driving the light-emitting element 87R, the light-emitting element 87G, the light-emitting element 87B, and the light-receiving element 83.

FIG. 12F illustrates an example in which three light-emitting elements and one light-receiving element are provided in a matrix of 2×2. FIG. 12G shows an example in which three light-emitting elements are arranged in one line and one laterally long light-receiving element 83 is provided below the three light-emitting elements.

The pixel illustrated in FIG. 12H is an example including a light-emitting element 87W for white (W). Here, four light-emitting elements are arranged in one line and the light-receiving element 83 is provided below the four light-emitting elements.

Note that the pixel structure is not limited to the above structure, and a variety of arrangement methods can be employed.

[Structure Example 1-2]

An example of a structure including a light-emitting element emitting visible light, a light-emitting element emitting infrared light, and a light-receiving element is described below.

Figure 13A:
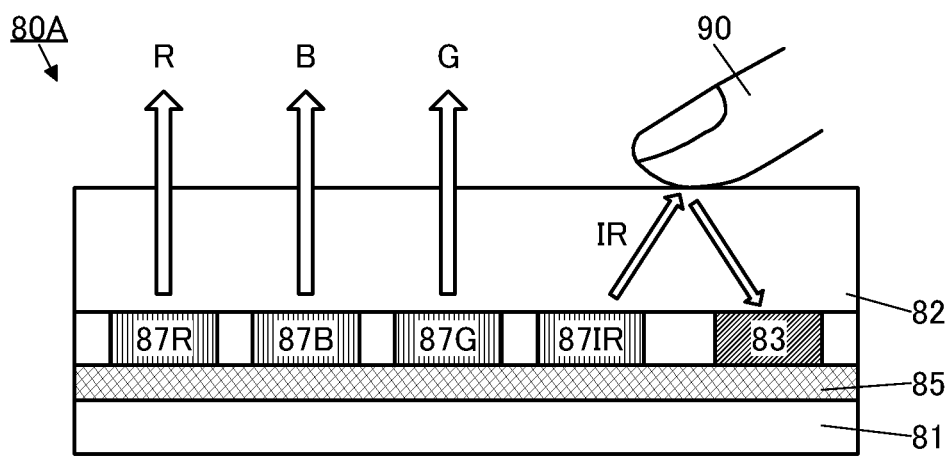
FIG. 13A to FIG. 13D are structure examples of a display device.

A display panel 80A shown in FIG. 13A includes a light-emitting element 87IR in addition to the components shown in FIG. 12A as an example. The light-emitting element 87IR is a light-emitting element emitting infrared light IR. Moreover, in that case, an element capable of receiving at least the infrared light IR emitted from the light-emitting element 87IR is preferably used as the light-receiving element 83. As the light-receiving element 83, an element capable of receiving visible light and infrared light is further preferably used.

As shown in FIG. 13A, when the finger 90 touches the substrate 82, the infrared light IR emitted from the light-emitting element 87IR is reflected or scattered by the finger 90 and part of reflected light or scattered light is incident on the light-receiving element 83, so that the positional information of the finger 90 can be obtained.

Figure 13B:
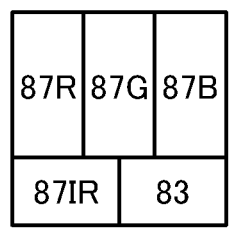
Figure 13C:
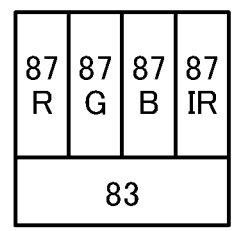
Figure 13D:
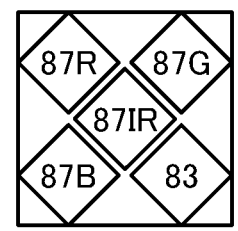

FIG. 13B to FIG. 13D show examples of pixels that can be used for the display panel 80A.

FIG. 13B shows an example in which three light-emitting elements are arranged in one line and the light-emitting element 87IR and the light-receiving element 83 are arranged below the three light-emitting elements in a horizontal direction. FIG. 13C shows an example in which four light-emitting elements including the light-emitting element 87IR are arranged in one column and the light-receiving element 83 is provided below the four light-emitting elements.

FIG. 13D shows an example in which three light-emitting elements and the light-receiving element 83 arranged in all directions with the light-emitting element 87IR used as a center.

Note that in the pixels shown in FIG. 13B to FIG. 13D, the positions of the light-emitting elements can be interchangeable, or the positions of the light-emitting element and the light-receiving element can be interchangeable.

[Structure Example 2 of Display Panel]

[Structure Example 2-1]

Figure 14A:
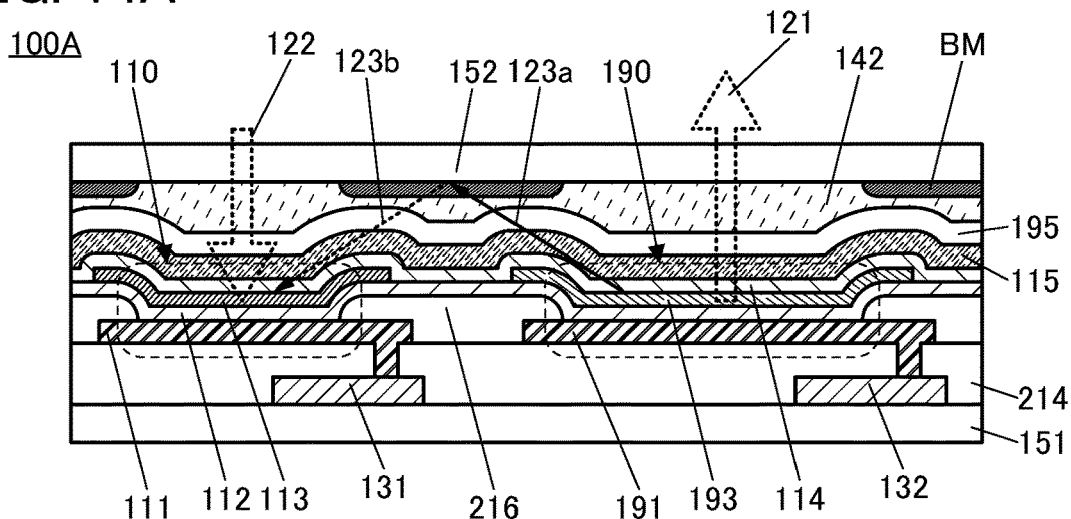
FIG. 14A to FIG. 14C are structure examples of a display device.

FIG. 14A is a schematic cross-sectional view of a display panel 100A.

The display panel 100A includes a light-receiving element 110 and a light-emitting element 190. The light-receiving element 110 includes a pixel electrode 111, a common layer 112, an active layer 113, a common layer 114, and a common electrode 115. The light-emitting element 190 includes a pixel electrode 191, the common layer 112, a light-emitting layer 193, the common layer 114, and the common electrode 115.

The pixel electrode 111, the pixel electrode 191, the common layer 112, the active layer 113, the light-emitting layer 193, the common layer 114, and the common electrode 115 may each have a single-layer structure or a stacked-layer structure.

The pixel electrode 111 and the pixel electrode 191 are positioned over an insulating layer 214. The pixel electrode 111 and the pixel electrode 191 can be formed using the same material in the same step.

The common layer 112 is positioned over the pixel electrode 111 and the pixel electrode 191. The common layer 112 is a layer shared by the light-receiving element 110 and the light-emitting element 190.

The active layer 113 overlaps with the pixel electrode 111 with the common layer 112 therebetween. The light-emitting layer 193 overlaps with the pixel electrode 191 with the common layer 112 therebetween. The active layer 113 includes a first organic compound, and the light-emitting layer 193 includes a second organic compound that is different from the first organic compound.

The common layer 114 is positioned over the common layer 112, the active layer 113, and the light-emitting layer 193. The common layer 114 is a layer shared by the light-receiving element 110 and the light-emitting element 190.

The common electrode 115 includes a portion overlapping with the pixel electrode 111 with the common layer 112, the active layer 113, and the common layer 114 therebetween. The common electrode 115 further includes a portion overlapping with the pixel electrode 191 with the common layer 112, the light-emitting layer 193, and the common layer 114 therebetween. The common electrode 115 is a layer shared by the light-receiving element 110 and the light-emitting element 190.

In the display panel of this embodiment, an organic compound is used for the active layer 113 of the light-receiving element 110. In the light-receiving element 110, the layers other than the active layer 113 can have structures in common with the layers in the light-emitting element 190 (EL element). Therefore, the light-receiving element 110 can be formed concurrently with the formation of the light-emitting element 190 only by adding a step of depositing the active layer 113 in the manufacturing process of the light-emitting element 190. The light-emitting element 190 and the light-receiving element 110 can be formed over one substrate. Accordingly, the light-receiving element 110 can be incorporated into the display panel without a significant increase in the number of manufacturing steps.

The display panel 100A illustrates an example in which the light-receiving element 110 and the light-emitting element 190 have a common structure except that the active layer 113 of the light-receiving element 110 and the light-emitting layer 193 of the light-emitting element 190 are separately formed. Note that the structures of the light-receiving element 110 and the light-emitting element 190 are not limited thereto. The light-receiving element 110 and the light-emitting element 190 may include separately formed layers other than the active layer 113 and the light-emitting layer 193 (see display panels 100D, 100E, and 100F described later). The light-receiving element 110 and the light-emitting element 190 preferably include at least one layer used in common (common layer). Thus, the light-receiving element 110 can be incorporated into the display panel without a significant increase in the number of manufacturing steps.

The display panel 100A includes the light-receiving element 110, the light-emitting element 190, a transistor 131, a transistor 132, and the like between a pair of substrates (a substrate 151 and a substrate 152).

In the light-receiving element 110, the common layer 112, the active layer 113, and the common layer 114, which are positioned between the pixel electrode 111 and the common electrode 115, can each also be referred to as an organic layer (a layer including an organic compound). The pixel electrode 111 preferably has a function of reflecting visible light. An end portion of the pixel electrode 111 is covered with a bank 216. The common electrode 115 has a function of transmitting visible light.

The light-receiving element 110 has a function of sensing light. Specifically, the light-receiving element 110 is a photoelectric conversion element that receives light 122 entering from the outside through the substrate 152 and converts the light 122 into an electrical signal.

A light-blocking layer BM is provided on a surface of the substrate 152 that faces the substrate 151. The light-blocking layer BM has an opening in a position overlapping with the light-receiving element 110 and in a position overlapping with the light-emitting element 190. Providing the light-blocking layer BM can control the range where the light-receiving element 110 senses light.

For the light-blocking layer BM, a material that blocks light emitted from the light-emitting element can be used. The light-blocking layer BM preferably absorbs visible light. As the light-blocking layer BM, a black matrix can be formed using a metal material or a resin material containing pigment (e.g., carbon black) or dye, for example. The light-blocking layer BM may have a stacked-layer structure of a red color filter, a green color filter, and a blue color filter.

Here, part of light emitted from the light-emitting element 190 is reflected in the display panel 100A and is incident on the light-receiving element 110 in some cases. The light-blocking layer BM can reduce the influence of such stray light. For example, in the case where the light-blocking layer BM is not provided, light 123a emitted from the light-emitting element 190 is reflected by the substrate 152 and reflected light 123b enters the light-receiving element 110 in some cases. Providing the light-blocking layer BM can inhibit the reflected light 123b from entering the light-receiving element 110. Consequently, noise can be reduced, and the sensitivity of a sensor using the light-receiving element 110 can be increased.

In the light-emitting element 190, the common layer 112, the light-emitting layer 193, and the common layer 114, which are positioned between the pixel electrode 191 and the common electrode 115, can each also be referred to as an EL layer. The pixel electrode 191 preferably has a function of reflecting visible light. An end portion of the pixel electrode 191 is covered with the bank 216. The pixel electrode 111 and the pixel electrode 191 are electrically insulated from each other by the bank 216. The common electrode 115 has a function of transmitting visible light.

The light-emitting element 190 has a function of emitting visible light. Specifically, the light-emitting element 190 is an electroluminescent element that emits light 121 to the substrate 152 side when voltage is applied between the pixel electrode 191 and the common electrode 115.

It is preferable that the light-emitting layer 193 be formed not to overlap with a light-receiving region of the light-receiving element 110. This inhibits the light-emitting layer 193 from absorbing the light 122, increasing the amount of light with which the light-receiving element 110 is irradiated.

The pixel electrode 111 is electrically connected to a source or a drain of the transistor 131 through an opening provided in the insulating layer 214. The end portion of the pixel electrode 111 is covered with the bank 216.

The pixel electrode 191 is electrically connected to a source or a drain of the transistor 132 through an opening provided in the insulating layer 214. The end portion of the pixel electrode 191 is covered with the bank 216. The transistor 132 has a function of controlling the driving of the light-emitting element 190.

The transistor 131 and the transistor 132 are in contact with the same layer (the substrate 151 in FIG. 14A).

At least part of a circuit electrically connected to the light-receiving element 110 and a circuit electrically connected to the light-emitting element 190 are preferably formed using the same material in the same step. In that case, the thickness of the display panel can be reduced compared with the case where the two circuits are separately formed, resulting in simplification of the manufacturing steps.

The light-receiving element 110 and the light-emitting element 190 are preferably covered with a protective layer 195. In FIG. 14A, the protective layer 195 is provided on and in contact with the common electrode 115. Providing the protective layer 195 can inhibit entry of impurities such as water into the light-receiving element 110 and the light-emitting element 190, so that the reliability of the light-receiving element 110 and the light-emitting element 190 can be increased. The protective layer 195 and the substrate 152 are bonded to each other with an adhesive layer 142.

Figure 15A:
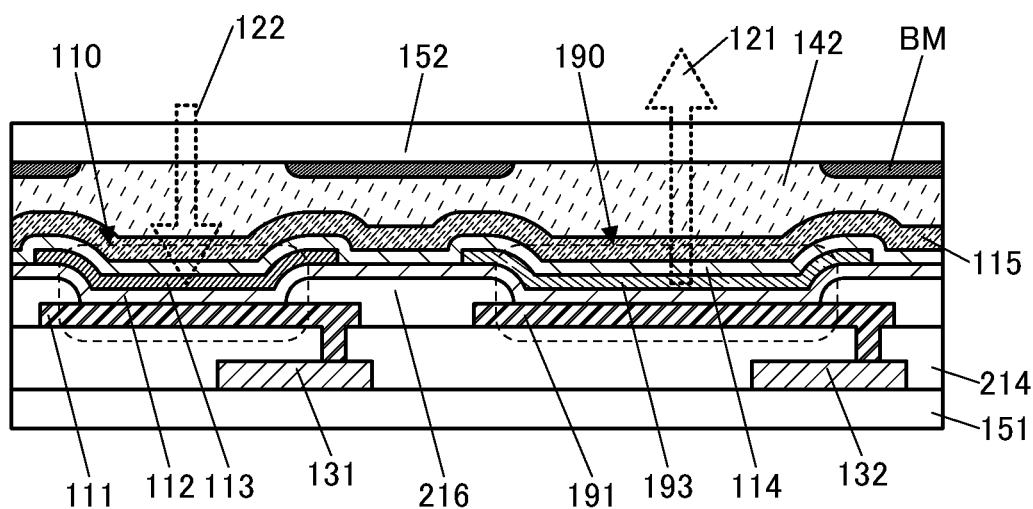
FIG. 15A and FIG. 15B are structure examples of display devices.

Note that as illustrated in FIG. 15A, the protective layer over the light-receiving element 110 and the light-emitting element 190 may be omitted. In FIG. 15A, the common electrode 115 and the substrate 152 are bonded to each other with the adhesive layer 142.

Figure 15B:
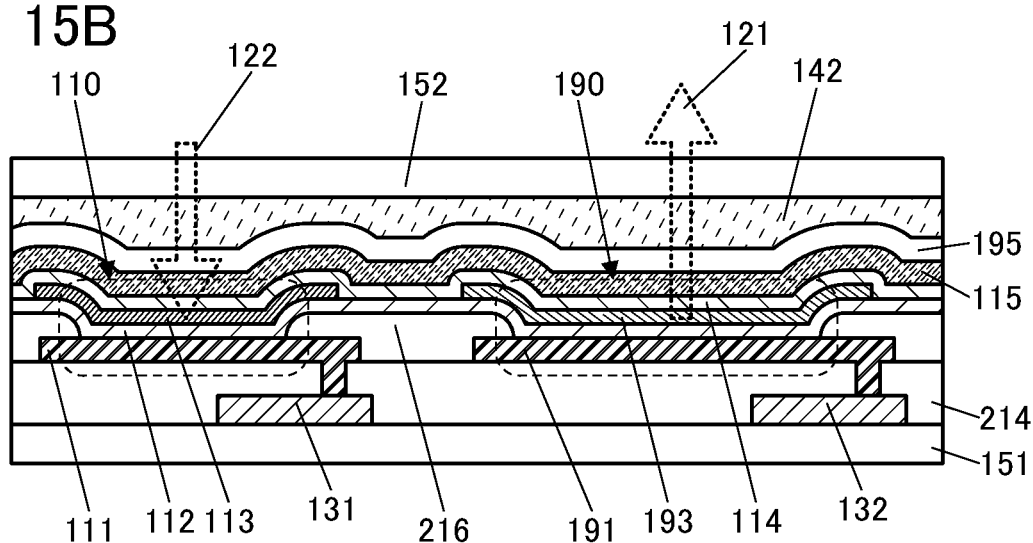

A structure that does not include the light-blocking layer BM as illustrated in FIG. 15B may be employed. This can increase the light-receiving area of the light-receiving element 110, further increasing the sensitivity of the sensor.

[Structure Example 2-2]

Figure 14B:
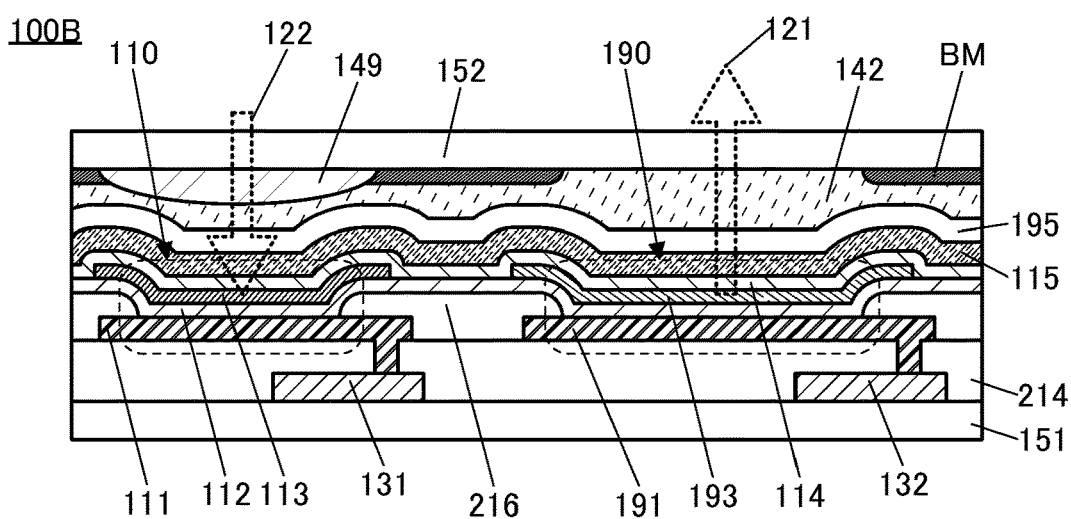

FIG. 14B illustrates a schematic cross-sectional view of a display panel 100B. Note that in the description of the display panel below, components similar to those of the above-mentioned display panel are not described in some cases.

The display panel 100B illustrated in FIG. 14B includes a lens 149 in addition to the components of the display panel 100A.

The lens 149 is provided in a position overlapping with the light-receiving element 110. In the display panel 100B, the lens 149 is provided in contact with the substrate 152. The lens 149 included in the display panel 100B is a convex lens having a convex surface on the substrate 151 side. Note that a convex lens having a convex surface on the substrate 152 side may be provided in a region overlapping with the light-receiving element 110.

In the case where the light-blocking layer BM and the lens 149 are formed on the same plane of the substrate 152, their formation order is not limited. FIG. 14B illustrates an example in which the lens 149 is formed first; alternatively, the light-blocking layer BM may be formed first. In FIG. 14B, an end portion of the lens 149 is covered with the light-blocking layer BM.

In the display panel 100B, the light 122 is incident on the light-receiving element 110 through the lens 149. With the lens 149, the amount of the light 122 incident on the light-receiving element 110 can be increased compared to the case where the lens 149 is not provided. This can increase the sensitivity of the light-receiving element 110.

As a method for forming the lens used in the display panel of this embodiment, a lens such as a microlens may be formed directly over the substrate or the light-receiving element, or a lens array formed separately, such as a microlens array, may be bonded to the substrate.

[Structure Example 2-3]

Figure 14C:
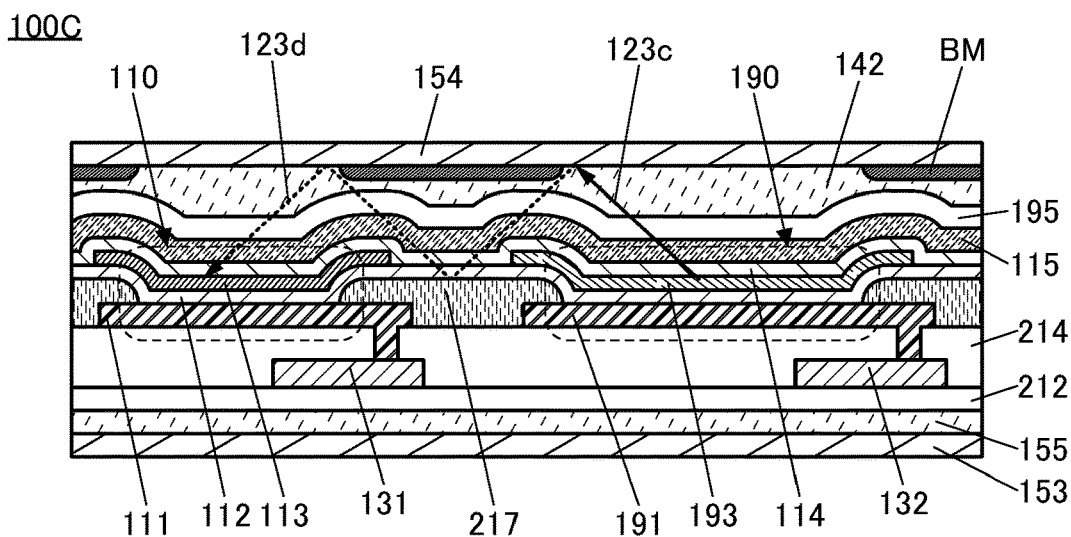

FIG. 14C illustrates a schematic cross-sectional view of a display panel 100C. The display panel 100C is different from the display panel 100A in that the substrate 151, the substrate 152, and the bank 216 are not included but a substrate 153, a substrate 154, an adhesive layer 155, an insulating layer 212, and a partition wall 217 are included.

The substrate 153 and the insulating layer 212 are bonded to each other with the adhesive layer 155. The substrate 154 and the protective layer 195 are bonded to each other with the adhesive layer 142.

The display panel 100C has a structure obtained in such a manner that the insulating layer 212, the transistor 131, the transistor 132, the light-receiving element 110, the light-emitting element 190, and the like are formed over a formation substrate and then transferred onto the substrate 153. The substrate 153 and the substrate 154 preferably have flexibility. Accordingly, the flexibility of the display panel 100C can be increased. For example, a resin is preferably used for each of the substrate 153 and the substrate 154.

For each of the substrate 153 and the substrate 154, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyether sulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, or cellulose nanofiber can be used, for example. Glass that is thin enough to have flexibility may be used for one or both of the substrate 153 and the substrate 154.

As the substrate included in the display panel of this embodiment, a film having high optical isotropy may be used. Examples of the film having high optical isotropy include a triacetyl cellulose (TAC, also referred to as cellulose triacetate) film, a cycloolefin polymer (COP) film, a cycloolefin copolymer (COC) film, and an acrylic resin film.

The partition wall 217 preferably absorbs light emitted by the light-emitting element. As the partition wall 217, a black matrix can be formed using a resin material containing a pigment or dye, for example. Moreover, the partition wall 217 can be formed of a colored insulating layer by using a brown resist material.

In some cases, light 123c emitted from the light-emitting element 190 is reflected by the substrate 154 and the partition wall 217 and reflected light 123d is incident on the light-receiving element 110. In other cases, the light 123c passes through the partition wall 217 and is reflected by a transistor, a wiring, or the like, and thus reflected light enters the light-receiving element 110.

When the partition wall 217 absorbs the light 123c, the reflected light 123d can be inhibited from entering the light-receiving element 110. Consequently, noise can be reduced, and the sensitivity of a sensor using the light-receiving element 110 can be increased.

The partition wall 217 preferably absorbs at least light having a wavelength that is sensed by the light-receiving element 110. For example, in the case where the light-receiving element 110 senses red light emitted by the light-emitting element 190, the partition wall 217 preferably absorbs at least red light. For example, when the partition wall 217 includes a blue color filter, the partition wall 217 can absorb the red light 123c and thus the reflected light 123d can be inhibited from entering the light-receiving element 110.

[Structure Example 2-4]

Although the light-emitting element and the light-receiving element include two common layers in the above examples, one embodiment of the present invention is not limited thereto. Examples in which common layers have different structures are described below.

Figure 16A:
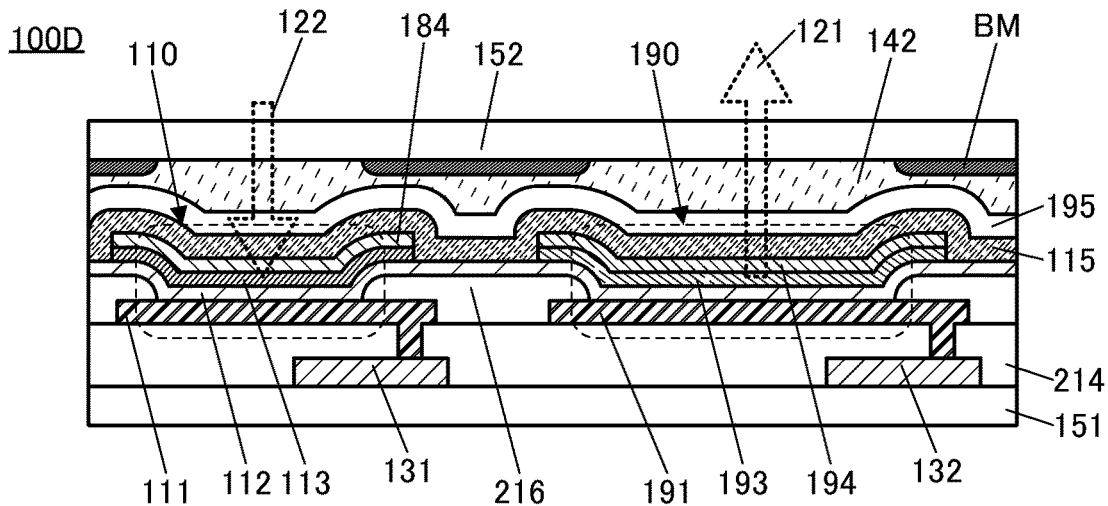
FIG. 16A to FIG. 16C are structure examples of a display device.

FIG. 16A illustrates a schematic cross-sectional view of a display panel 100D. The display panel 100D is different from the display panel 100A in that the common layer 114 is not included and a buffer layer 184 and a buffer layer 194 are included. The buffer layer 184 and the buffer layer 194 may each have a single-layer structure or a stacked-layer structure.

In the display panel 100D, the light-receiving element 110 includes the pixel electrode 111, the common layer 112, the active layer 113, the buffer layer 184, and the common electrode 115. In the display panel 100D, the light-emitting element 190 includes the pixel electrode 191, the common layer 112, the light-emitting layer 193, the buffer layer 194, and the common electrode 115.

The display panel 100D shows an example in which the buffer layer 184 between the common electrode 115 and the active layer 113 and the buffer layer 194 between the common electrode 115 and the light-emitting layer 193 are formed separately. As the buffer layer 184 and the buffer layer 194, one or both of an electron-injection layer and an electron-transport layer can be formed, for example.

Figure 16B:
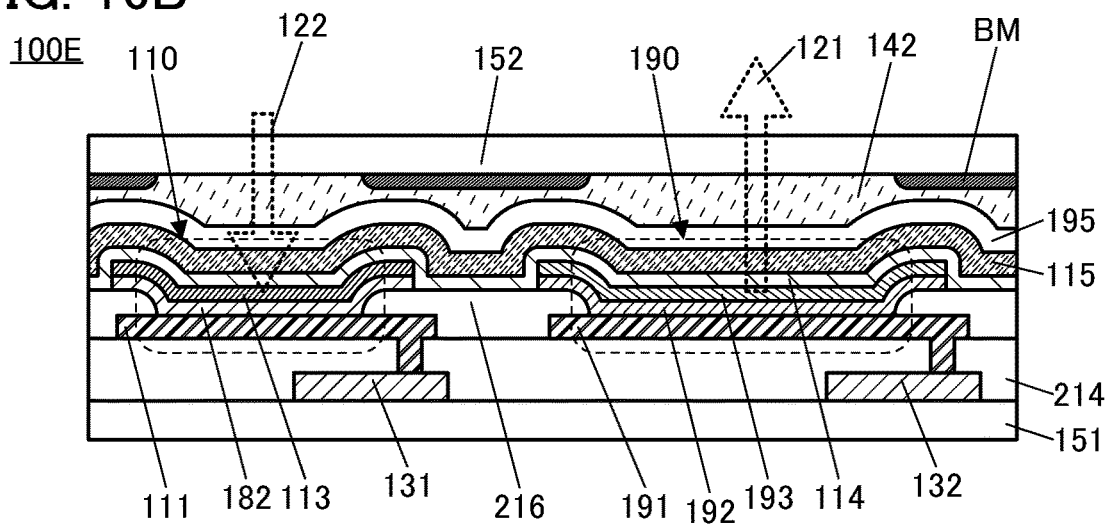

FIG. 16B illustrates a schematic cross-sectional view of a display panel 100E. The display panel 100E is different from the display panel 100A in that the common layer 112 is not included and a buffer layer 182 and a buffer layer 192 are included. The buffer layer 182 and the buffer layer 192 may each have a single-layer structure or a stacked-layer structure.

In the display panel 100E, the light-receiving element 110 includes the pixel electrode 111, the buffer layer 182, the active layer 113, the common layer 114, and the common electrode 115. In the display panel 100E, the light-emitting element 190 includes the pixel electrode 191, the buffer layer 192, the light-emitting layer 193, the common layer 114, and the common electrode 115.

The display panel 100E shows an example in which the buffer layer 182 between the pixel electrode 111 and the active layer 113 and the buffer layer 192 between the pixel electrode 191 and the light-emitting layer 193 are formed separately. As the buffer layer 182 and the buffer layer 192, one or both of a hole-injection layer and a hole-transport layer can be formed, for example.

Figure 16C:
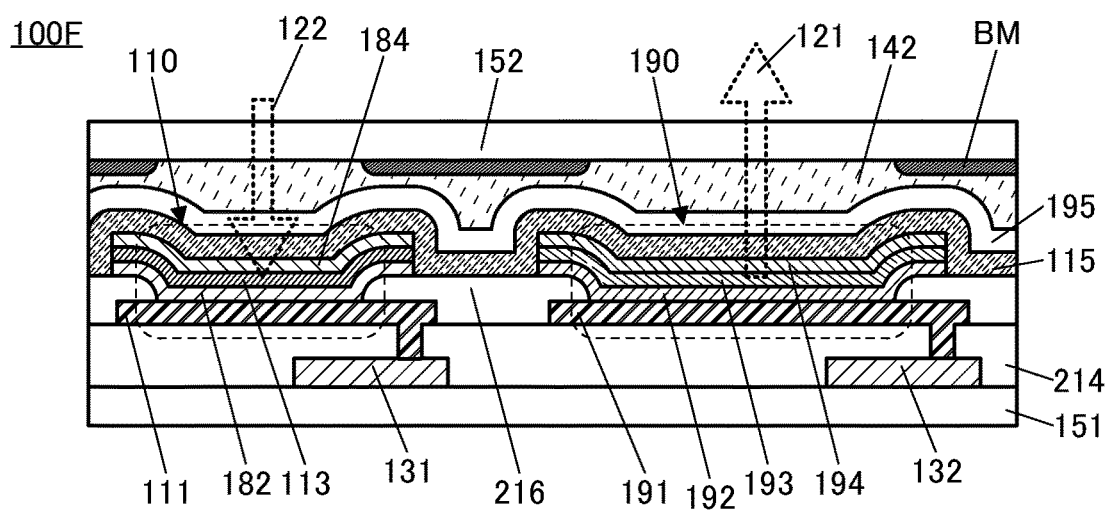

FIG. 16C illustrates a schematic cross-sectional view of a display panel 100F. The display panel 100F is different from the display panel 100A in that the common layer 112 and the common layer 114 are not included and the buffer layer 182, the buffer layer 184, the buffer layer 192, and the buffer layer 194 are included.

In the display panel 100F, the light-receiving element 110 includes the pixel electrode 111, the buffer layer 182, the active layer 113, the buffer layer 184, and the common electrode 115. In the display panel 100F, the light-emitting element 190 includes the pixel electrode 191, the buffer layer 192, the light-emitting layer 193, the buffer layer 194, and the common electrode 115.

In the formation of the light-receiving element 110 and the light-emitting element 190, not only the active layer 113 and the light-emitting layer 193 but also other layers can be formed separately.

The display panel 100F shows an example in which the light-receiving element 110 and the light-emitting element 190 do not have a common layer between the pair of electrodes (the pixel electrode 111 or the pixel electrode 191 and the common electrode 115). The light-receiving element 110 and the light-emitting element 190 included in the display panel 100F can be formed in the following manner: the pixel electrode 111 and the pixel electrode 191 are formed over the insulating layer 214 using the same material in the same step; the buffer layer 182, the active layer 113, and the buffer layer 184 are formed over the pixel electrode 111, and the buffer layer 192, the light-emitting layer 193, and the buffer layer 194 are formed over the pixel electrode 191; and then, the common electrode 115 is formed to cover the buffer layer 184, the buffer layer 194, and the like.

Note that the formation order of the stacked-layer structure of the buffer layer 182, the active layer 113, and the buffer layer 184 and the stacked-layer structure of the buffer layer 192, the light-emitting layer 193, and the buffer layer 194 is not particularly limited. For example, after the buffer layer 182, the active layer 113, and the buffer layer 184 are deposited, the buffer layer 192, the light-emitting layer 193, and the buffer layer 194 may be deposited. In contrast, the buffer layer 192, the light-emitting layer 193, and the buffer layer 194 may be deposited before the buffer layer 182, the active layer 113, and the buffer layer 184 are deposited. Alternate deposition of the buffer layer 182, the buffer layer 192, the active layer 113, the light-emitting layer 193, and the like in this order is also possible.

[Structure Example 3 of Display Panel]
More specific structure examples of the display panel are described below.

Figure 17:
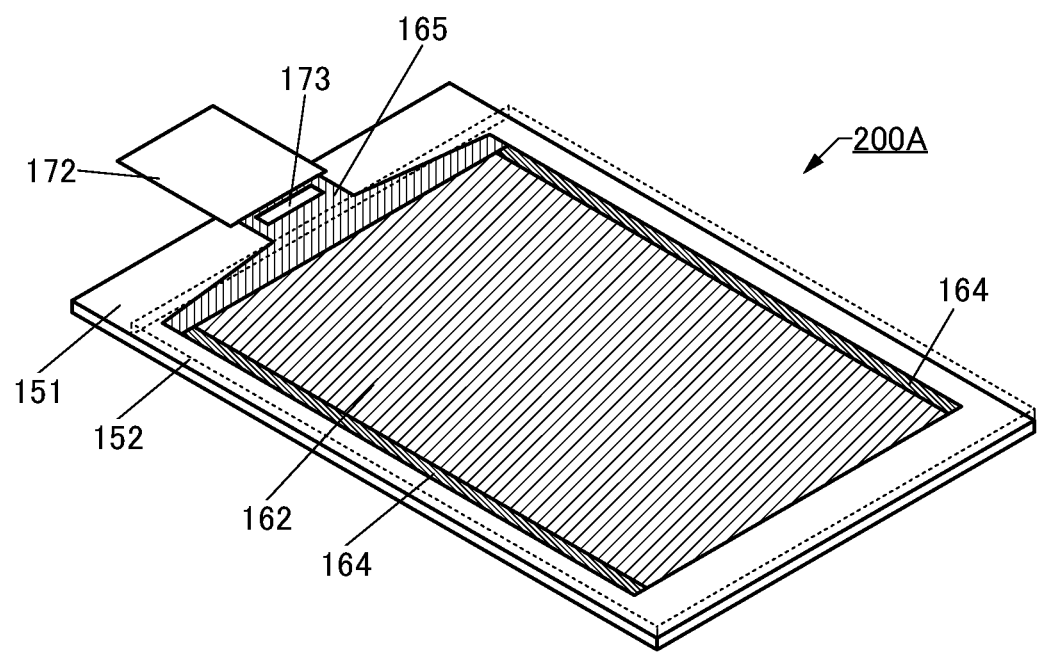
FIG. 17 is a structure example of a display device.

[Structure Example 3-1]
FIG. 17 illustrates a perspective view of a display panel 200A.

The display panel 200A has a structure in which the substrate 151 and the substrate 152 are bonded to each other. In FIG. 17, the substrate 152 is denoted by a dashed line.

The display panel 200A includes a display portion 162, a circuit 164, a wiring 165, and the like. FIG. 17 illustrates an example in which the display panel 200A is provided with an IC (integrated circuit) 173 and an FPC 172. Thus, the structure illustrated in FIG. 17 can be regarded as a display module including the display panel 200A, an IC, and an FPC.

As the circuit 164, a scan line driver circuit can be used.
The wiring 165 has a function of supplying a signal and power to the display portion 162 and the circuit 164. The signal and power are input to the wiring 165 from the outside through the FPC 172 or from the IC 173.

FIG. 17 illustrates an example in which the IC 173 is provided over the substrate 151 by a COG (Chip On Glass) method, a COF (Chip On Film) method, or the like. An IC including a scan line driver circuit, a signal line driver circuit, or the like can be used as the IC 173, for example. Note that the display panel 200A and the display module may have a structure that does not include an IC. The IC may be mounted on the FPC by a COF method or the like.

Figure 18:
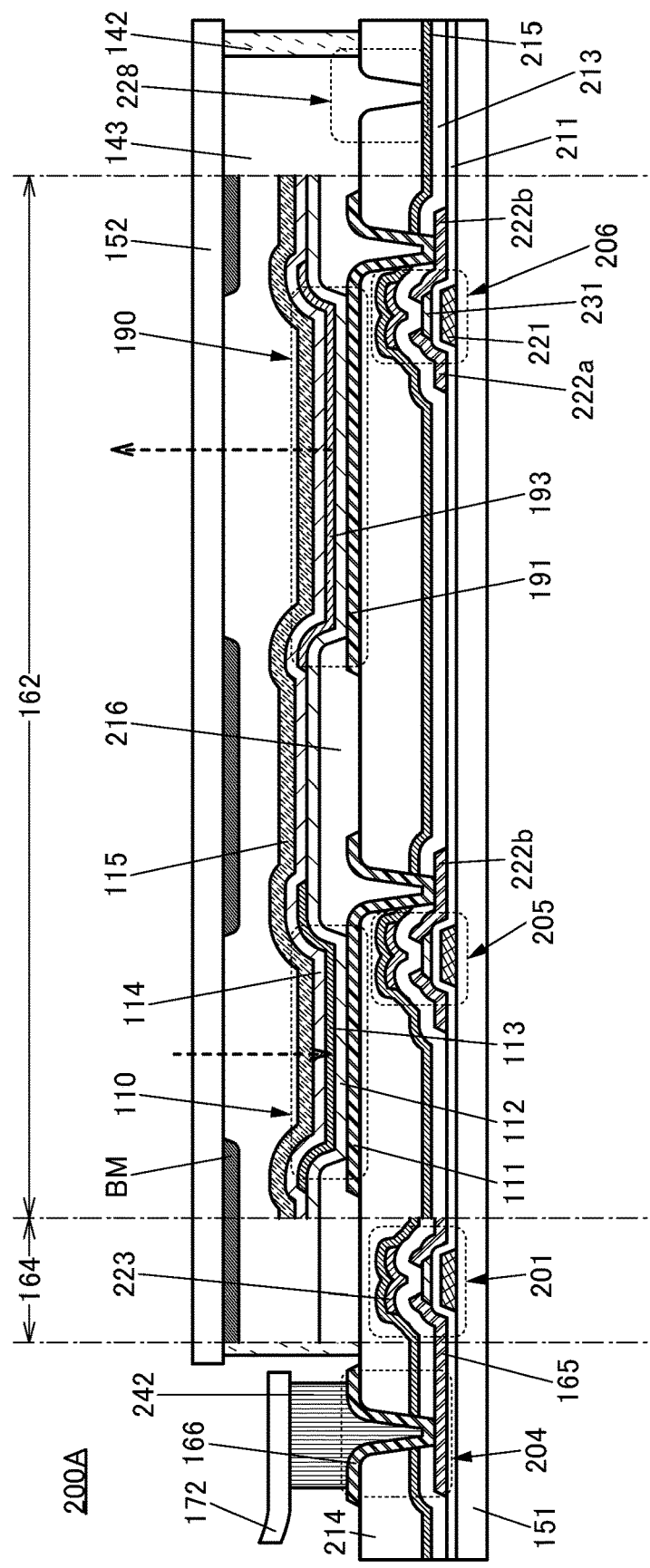
FIG. 18 is a structure example of a display device.

FIG. 18 illustrates an example of a cross section of part of a region including the FPC 172, part of a region including the circuit 164, part of a region including the display portion 162, and part of a region including an end portion of the display panel 200A illustrated in FIG. 17.

The display panel 200A illustrated in FIG. 18 includes a transistor 201, a transistor 205, a transistor 206, the light-emitting element 190, the light-receiving element 110, and the like between the substrate 151 and the substrate 152.

The substrate 152 and the insulating layer 214 are attached to each other with the adhesive layer 142. A solid sealing structure, a hollow sealing structure, or the like can be employed to seal the light-emitting element 190 and the light-receiving element 110. In FIG. 18, a space 143 surrounded by the substrate 152, the adhesive layer 142, and the insulating layer 214 is filled with an inert gas (e.g., nitrogen or argon), that is, a hollow sealing structure is employed. The adhesive layer 142 may be provided to overlap with the light-emitting element 190. The space 143 surrounded by the substrate 152, the adhesive layer 142, and the insulating layer 214 may be filled with a resin different from that of the adhesive layer 142.

The light-emitting element 190 has a stacked-layer structure in which the pixel electrode 191, the common layer 112, the light-emitting layer 193, the common layer 114, and the common electrode 115 are stacked in this order from the insulating layer 214 side. The pixel electrode 191 is connected to a conductive layer 222*b* included in the transistor 206 through an opening provided in the insulating layer 214. The transistor 206 has a function of controlling the driving of the light-emitting element 190. An end portion of the pixel electrode 191 is covered with the bank 216. The pixel electrode 191 includes a material that reflects visible light, and the common electrode 115 includes a material that transmits visible light.

The light-receiving element 110 has a stacked-layer structure in which the pixel electrode 111, the common layer 112, the active layer 113, the common layer 114, and the common electrode 115 are stacked in this order from the insulating layer 214 side. The pixel electrode 111 is electrically connected to the conductive layer 222b included in the transistor 205 through an opening provided in the insulating layer 214. An end portion of the pixel electrode 111 is covered with the bank 216. The pixel electrode 111 includes a material that reflects visible light, and the common electrode 115 includes a material that transmits visible light.

Light emitted from the light-emitting element 190 is emitted toward the substrate 152 side. Light enters the light-receiving element 110 through the substrate 152 and the space 143. For the substrate 152, a material that has high transmittance with respect to visible light is preferably used.

The pixel electrode 111 and the pixel electrode 191 can be formed using the same material in the same step. The common layer 112, the common layer 114, and the common electrode 115 are used in both the light-receiving element 110 and the light-emitting element 190. The light-receiving element 110 and the light-emitting element 190 can have common components except the active layer 113 and the light-emitting layer 193. Thus, the light-receiving element 110 can be incorporated into the display panel 200A without a significant increase in the number of manufacturing steps.

The light-blocking layer BM is provided on the surface of the substrate 152 that faces the substrate 151. The light-blocking layer BM has an opening in a position overlapping with the light-receiving element 110 and in a position overlapping with the light-emitting element 190. Providing the light-blocking layer BM can control the range where the light-receiving element 110 senses light. Furthermore, with the light-blocking layer BM, light from the light-emitting element 190 can be inhibited from directly entering the light-receiving element 110. Hence, a sensor with less noise and high sensitivity can be obtained.

The transistor 201, the transistor 205, and the transistor 206 are formed over the substrate 151. These transistors can be formed using the same materials in the same steps.

An insulating layer 211, an insulating layer 213, an insulating layer 215, and the insulating layer 214 are provided in this order over the substrate 151. Parts of the insulating layer 211 function as gate insulating layers of the transistors. Parts of the insulating layer 213 function as gate insulating layers of the transistors. The insulating layer 215 is provided to cover the transistors. The insulating layer 214 is provided to cover the transistors and has a function of a planarization layer. Note that there is no limitation on the number of gate insulating layers and the number of insulating layers covering the transistors, and each insulating layer may have either a single layer or two or more layers.

A material into which impurities such as water or hydrogen do not easily diffuse is preferably used for at least one of the insulating layers that cover the transistors. This allows the insulating layer to serve as a barrier layer. Such a structure can effectively inhibit diffusion of impurities into the transistors from the outside and increase the reliability of the display device.

An inorganic insulating film is preferably used as each of the insulating layer 211, the insulating layer 213, and the insulating layer 215. As the inorganic insulating film, for example, a silicon nitride film, a silicon oxynitride film, a silicon oxide film, a silicon nitride oxide film, an aluminum oxide film, an aluminum nitride film, or the like which is an inorganic insulating film can be used. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may also be used. A stack including two or more of the above insulating films may also be used.

Here, an organic insulating film often has a lower barrier property than an inorganic insulating film. Therefore, the organic insulating film preferably has an opening in the vicinity of an end portion of the display panel 200A. This can inhibit diffusion of impurities from the end portion of the display panel 200A through the organic insulating film. Alternatively, in order to prevent the organic insulating film from being exposed at the end portion of the display panel 200A, the organic insulating film may be formed so that its end portion is positioned on the inner side compared to the end portion of the display panel 200A.

An organic insulating film is suitable for the insulating layer 214 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

In a region 228 illustrated in FIG. 18, an opening is formed in the insulating layer 214. This can inhibit diffusion of impurities into the display portion 162 from the outside through the insulating layer 214 even when an organic insulating film is used as the insulating layer 214. Thus, the reliability of the display panel 200A can be increased.

Each of the transistor 201, the transistor 205, and the transistor 206 includes a conductive layer 221 functioning as a gate, the insulating layer 211 functioning as the gate insulating layer, a conductive layer 222a and the conductive layer 222b functioning as a source and a drain, a semiconductor layer 231, the insulating layer 213 functioning as the gate insulating layer, and a conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display panel of this embodiment. For example, a planar transistor, a staggered transistor, or an inverted staggered transistor can be used. A top-gate or a bottom-gate transistor structure may be employed. Alternatively, gates may be provided above and below a semiconductor layer in which a channel is formed.

The structure in which the semiconductor layer where a channel is formed is provided between two gates is used for the transistor 201, the transistor 205, and the transistor 206. The two gates may be connected to each other and supplied with the same signal to drive the transistor. Alternatively, a potential for controlling the threshold voltage may be supplied to one of the two gates and a potential for driving may be supplied to the other to control the threshold voltage of the transistor.

There is no particular limitation on the crystallinity of a semiconductor material used for the transistors, and any of an amorphous semiconductor, a single crystal semiconductor, and a semiconductor having crystallinity other than single crystal (a microcrystalline semiconductor, a polycrystalline semiconductor, or a semiconductor partly including crystal regions) may be used. A single crystal semiconductor or a semiconductor having crystallinity is preferably used, in which case deterioration of the transistor characteristics can be inhibited.

A semiconductor layer of a transistor preferably includes a metal oxide (also referred to as an oxide semiconductor).

Alternatively, the semiconductor layer of the transistor may include silicon. Examples of silicon include amorphous silicon and crystalline silicon (e.g., low-temperature polysilicon or single crystal silicon).

The semiconductor layer preferably includes indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more kinds selected from aluminum, gallium, yttrium, and tin.

It is particularly preferable to use an oxide containing indium (In), gallium (Ga), and zinc (Zn) (also referred to as IGZO) for the semiconductor layer.

In the case where the semiconductor layer is an In-M-Zn oxide, the atomic ratio of In to M in a sputtering target used for depositing the In-M-Zn oxide is preferably higher than or equal to 1. Examples of the atomic ratio of the metal elements in such a sputtering target include In: M:Zn=1:1:1, In:M:Zn=1:1:1.2, In:M:Zn=2:1:3, In:M:Zn=3:1:2, In:M:Zn=4:2:3, In:M:Zn=4:2:4.1, In:M:Zn=5:1:3, In:M:Zn=5:1:6, In:M:Zn=5:1:7, In:M:Zn=5:1:8, In:M:Zn=6:1:6, and In:M:Zn=5:2:5.

A target including a polycrystalline oxide is preferably used as the sputtering target, in which case the semiconductor layer having crystallinity is easily formed. Note that the atomic ratio in the deposited semiconductor layer may vary from the above atomic ratio between metal elements in the sputtering target in a range of ±40%. For example, in the case where the composition of a sputtering target used for the semiconductor layer is In:Ga:Zn=4:2:4.1 [atomic ratio], the composition of the semiconductor layer to be deposited is sometimes in the neighborhood of In:Ga:Zn=4:2:3 [atomic ratio].

Note that when the atomic ratio is described as In:Ga:Zn=4:2:3 or in the neighborhood thereof, the case is included where Ga is greater than or equal to 1 and less than or equal to 3 and Zn is greater than or equal to 2 and less than or equal to 4 with In being 4. When the atomic ratio is described as In:Ga:Zn=5:1:6 or in the neighborhood thereof, the case is included where Ga is greater than 0.1 and less than or equal to 2 and Zn is greater than or equal to 5 and less than or equal to 7 with In being 5. When the atomic ratio is described as In:Ga:Zn=1:1:1 or in the neighborhood thereof, the case is included where Ga is greater than 0.1 and less than or equal to 2 and Zn is greater than 0.1 and less than or equal to 2 with In being 1.

The transistor included in the circuit 164 and the transistor included in the display portion 162 may have the same structure or different structures. A plurality of transistors included in the circuit 164 may have the same structure or two or more kinds of structures. Similarly, a plurality of transistors included in the display portion 162 may have the same structure or two or more kinds of structures.

A connection portion 204 is provided in a region of the substrate 151 that does not overlap with the substrate 152. In the connection portion 204, the wiring 165 is electrically connected to the FPC 172 via a conductive layer 166 and a connection layer 242. On the top surface of the connection portion 204, the conductive layer 166 obtained by processing the same conductive film as the pixel electrode 191 is exposed. Thus, the connection portion 204 and the FPC 172 can be electrically connected to each other through the connection layer 242.

A variety of optical members can be arranged on the outer surface of the substrate 152. Examples of the optical members include a polarizing plate, a retardation plate, a light diffusion layer (a diffusion film or the like), an anti-reflective layer, and a light-condensing film. Furthermore, an antistatic film inhibiting the attachment of dust, a water repellent film inhibiting the attachment of stain, a hard coat film inhibiting generation of a scratch caused by the use, a shock absorbing layer, or the like may be provided on the outside of the substrate 152.

For each of the substrate 151 and the substrate 152, glass, quartz, ceramic, sapphire, resin, or the like can be used. When a flexible material is used for the substrate 151 and the substrate 152, the flexibility of the display panel can be increased.

As the adhesive layer, a variety of curable adhesives, e.g., a photocurable adhesive such as an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. Alternatively, a two-component resin may be used. An adhesive sheet or the like may be used.

As the connection layer 242, an anisotropic conductive film (ACF), an anisotropic conductive paste (ACP), or the like can be used.

The light-emitting element 190 may be of a top emission type, a bottom emission type, a dual emission type, or the like. A conductive film that transmits visible light is used as the electrode through which light is extracted. A conductive film that reflects visible light is preferably used as the electrode through which light is not extracted.

The light-emitting element 190 includes at least the light-emitting layer 193. In addition to the light-emitting layer 193, the light-emitting element 190 may further include a layer containing any of a substance with a high hole-injection property, a substance with a high hole-transport property, a hole-blocking material, a substance with a high electron-transport property, a substance with a high electron-injection property, an electron-blocking material, a substance with a bipolar property (a substance with a high electron- and hole-transport property), and the like. For example, the common layer 112 preferably includes one or both of a hole-injection layer and a hole-transport layer. For example, the common layer 114 preferably includes one or both of an electron-transport layer and an electron-injection layer.

The common layer 112, the light-emitting layer 193, and the common layer 114 may use either a low molecular compound or a high molecular compound and may also contain an inorganic compound. The layers that constitute the common layer 112, the light-emitting layer 193, and the common layer 114 can each be formed by a method such as an evaporation method (including a vacuum evaporation method), a transfer method, a printing method, an inkjet method, or a coating method.

The light-emitting layer 193 may contain an inorganic compound such as quantum dots as a light-emitting material.

The active layer 113 of the light-receiving element 110 includes a semiconductor. Examples of the semiconductor include an inorganic semiconductor such as silicon and an organic semiconductor including an organic compound. This embodiment shows an example in which an organic semiconductor is used as the semiconductor included in the active layer. The use of an organic semiconductor is preferable because the light-emitting layer 193 of the light-emitting element 190 and the active layer 113 of the light-receiving element 110 can be formed by the same method (e.g., a vacuum evaporation method) and thus the same manufacturing apparatus can be used.

Examples of an n-type semiconductor material included in the active layer 113 are electron-accepting organic semiconductor materials such as fullerene (e.g., $C_{60}$ and $C_{70}$) and fullerene derivatives. Fullerene has a soccer ball-like shape, which is energetically stable. Both the HOMO level and the LUMO level of fullerene are deep (low). Having a deep LUMO level, fullerene has an extremely high electron-accepting property (acceptor property). When π-electron conjugation (resonance) spreads in a plane as in benzene, the electron-donating property (donor property) usually increases. Although π-electrons widely spread in fullerene having a spherical shape, its electron-accepting property is high. The high electron-accepting property efficiently causes rapid charge separation and is useful for light-receiving devices. Both $C_{60}$ and $C_{70}$ have a wide absorption band in the visible light region, and $C_{70}$ is especially preferable because of having a larger π-electron conjugation system and a wider absorption band in the long wavelength region than $C_{60}$.

Other examples of the n-type semiconductor material contained in the active layer 113 include a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative, a benzoquinoline derivative, a quinoxaline derivative, a dibenzoquinoxaline derivative, a pyridine derivative, a bipyridine derivative, a pyrimidine derivative, a naphthalene derivative, an anthracene derivative, a coumarin derivative, a rhodamine derivative, a triazine derivative, and a quinone derivative.

Examples of a p-type semiconductor material contained in the active layer 113 include electron-donating organic semiconductor materials such as copper(II) phthalocyanine (CuPc), tetraphenyldibenzoperiflanthene (DBP), zinc phthalocyanine (ZnPc), tin phthalocyanine (SnPc), and quinacridone.

Examples of a p-type semiconductor material include a carbazole derivative, a thiophene derivative, a furan derivative, and a compound having an aromatic amine skeleton. Other examples of the p-type semiconductor material include a naphthalene derivative, an anthracene derivative, a pyrene derivative, a triphenylene derivative, a fluorene derivative, a pyrrole derivative, a benzofuran derivative, a benzothiophene derivative, an indole derivative, a dibenzofuran derivative, a dibenzothiophene derivative, an indolocarbazole derivative, a porphyrin derivative, a phthalocyanine derivative, a naphthalocyanine derivative, a quinacridone derivative, a polyphenylene vinylene derivative, a polyparaphenylene derivative, a polyfluorene derivative, a polyvinylcarbazole derivative, and a polythiophene derivative.

For example, the active layer 113 is preferably formed by co-evaporation of an n-type semiconductor and a p-type semiconductor. Alternatively, the active layer 113 may be formed by stacking an n-type semiconductor and a p-type semiconductor.

As materials that can be used for a gate, a source, and a drain of a transistor and conductive layers such as a variety of wirings and electrodes included in a display panel, metals such as aluminum, titanium, chromium, nickel, copper, yttrium, zirconium, molybdenum, silver, tantalum, or tungsten, an alloy containing any of these metals as its main component, and the like can be given. A film containing any of these materials can be used in a single layer or as a stacked-layer structure.

As a light-transmitting conductive material, a conductive oxide such as indium oxide, indium tin oxide, indium zinc oxide, zinc oxide, or zinc oxide containing gallium, or graphene can be used. Alternatively, a metal material such as gold, silver, platinum, magnesium, nickel, tungsten, chromium, molybdenum, iron, cobalt, copper, palladium, or titanium, or an alloy material containing the metal material can be used. Further alternatively, a nitride of the metal material (e.g., titanium nitride) or the like may be used. Note that in the case of using the metal material or the alloy material (or the nitride thereof), the thickness is preferably set small enough to be able to transmit light. A stacked-layer film of any of the above materials can be used as a conductive layer. For example, a stacked-layer film of indium tin oxide and an alloy of silver and magnesium, or the like is preferably used for increased conductivity. These materials can also be used for conductive layers such as a variety of wirings and electrodes that constitute a display panel, or conductive layers (conductive layers functioning as a pixel electrode or a common electrode) included in a display element.

As an insulating material that can be used for each insulating layer, for example, a resin such as an acrylic resin or an epoxy resin, and an inorganic insulating material such as silicon oxide, silicon oxynitride, silicon nitride oxide, silicon nitride, or aluminum oxide can be given.

[Structure Example 3-2]

FIG. 19A illustrates a cross-sectional view of a display panel 200B. The display panel 200B is different from the display panel 200A mainly in that the lens 149 and the protective layer 195 are included.

Providing the protective layer 195 covering the light-receiving element 110 and the light-emitting element 190 can inhibit diffusion of impurities such as water into the light-receiving element 110 and the light-emitting element 190, so that the reliability of the light-receiving element 110 and the light-emitting element 190 can be increased.

In the region 228 in the vicinity of an end portion of the display panel 200B, the insulating layer 215 and the protective layer 195 are preferably in contact with each other through an opening in the insulating layer 214. In particular, the inorganic insulating film included in the insulating layer 215 and the inorganic insulating film included in the protective layer 195 are preferably in contact with each other. Thus, diffusion of impurities from the outside into the display portion 162 through the organic insulating film can be inhibited. Thus, the reliability of the display panel 200B can be increased.

FIG. 19B illustrates an example in which the protective layer 195 has a three-layer structure. In FIG. 19B, the protective layer 195 includes an inorganic insulating layer 195a over the common electrode 115, an organic insulating layer 195b over the inorganic insulating layer 195a, and an inorganic insulating layer 195c over the organic insulating layer 195b.

An end portion of the inorganic insulating layer 195a and an end portion of the inorganic insulating layer 195c extend beyond an end portion of the organic insulating layer 195b and are in contact with each other. The inorganic insulating layer 195a is in contact with the insulating layer 215 (inorganic insulating layer) through the opening in the insulating layer 214 (organic insulating layer). Accordingly, the light-receiving element 110 and the light-emitting element 190 can be surrounded by the insulating layer 215 and the protective layer 195, whereby the reliability of the light-receiving element 110 and the light-emitting element 190 can be increased.

As described above, the protective layer 195 may have a stacked-layer structure of an organic insulating film and an inorganic insulating film. In that case, an end portion of the inorganic insulating film preferably extends beyond an end portion of the organic insulating film.

The lens 149 is provided on the surface of the substrate 152 that faces the substrate 151. The lens 149 has a convex surface on the substrate 151 side. It is preferable that the light-receiving region of the light-receiving element 110 overlap with the lens 149 and not overlap with the light-emitting layer 193. Thus, the sensitivity and accuracy of a sensor using the light-receiving element 110 can be increased.

The refractive index of the lens 149 with respect to light received by the light-receiving element 110 is preferably greater than or equal to 1.3 and less than or equal to 2.5. The lens 149 can be formed using at least one of an inorganic material and an organic material. For example, a material containing a resin can be used for the lens 149. Moreover, a material containing at least one of an oxide and a sulfide can be used for the lens 149.

Specifically, a resin containing chlorine, bromine, or iodine, a resin containing a heavy metal atom, a resin having an aromatic ring, a resin containing sulfur, or the like can be used for the lens 149. Alternatively, a material containing a resin and nanoparticles of a material having a higher refractive index than the resin can be used for the lens 149. Titanium oxide, zirconium oxide, or the like can be used for the nanoparticles.

In addition, cerium oxide, hafnium oxide, lanthanum oxide, magnesium oxide, niobium oxide, tantalum oxide, titanium oxide, yttrium oxide, zinc oxide, an oxide containing indium and tin, an oxide containing indium, gallium, and zinc, and the like can be used for the lens 149. Alternatively, zinc sulfide or the like can be used for the lens 149.

In the display panel 200B, the protective layer 195 and the substrate 152 are bonded to each other with the adhesive layer 142. The adhesive layer 142 is provided to overlap with the light-receiving element 110 and the light-emitting element 190; that is, the display panel 200B employs a solid sealing structure.

[Structure Example 3-3]

FIG. 20A illustrates a cross-sectional view of a display panel 200C. The display panel 200C is different from the display panel 200B mainly in the structure of the transistors and including neither the light-blocking layer BM nor the lens 149.

The display panel 200C includes a transistor 208, a transistor 209, and a transistor 210 over the substrate 151.

Each of the transistor 208, the transistor 209, and the transistor 210 includes the conductive layer 221 functioning as a gate, the insulating layer 211 functioning as a gate insulating layer, a semiconductor layer including a channel formation region 231i and a pair of low-resistance regions 231n, the conductive layer 222a connected to one of the pair of low-resistance regions 231n, the conductive layer 222b connected to the other of the pair of low-resistance regions 231n, an insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231i. The insulating layer 225 is positioned between the conductive layer 223 and the channel formation region 231i.

The conductive layer 222a and the conductive layer 222b are connected to the corresponding low-resistance regions 231n through openings provided in the insulating layer 225 and the insulating layer 215. One of the conductive layer 222a and the conductive layer 222b serves as a source, and the other serves as a drain.

The pixel electrode 191 of the light-emitting element 190 is electrically connected to one of the pair of low-resistance regions 231n of the transistor 208 through the conductive layer 222b.

The pixel electrode 111 of the light-receiving element 110 is electrically connected to the other of the pair of low-resistance regions 231n of the transistor 209 through the conductive layer 222b.

FIG. 20A illustrates an example in which the insulating layer 225 covers a top surface and side surfaces of the semiconductor layer. Meanwhile, FIG. 20B illustrates an example of a transistor 202 in which the insulating layer 225 overlaps with the channel formation region 231i of the semiconductor layer 231 and does not overlap with the low-resistance regions 231n. The structure illustrated in FIG. 20B can be manufactured by processing the insulating layer 225 using the conductive layer 223 as a mask, for example. In FIG. 20B, the insulating layer 215 is provided to cover the insulating layer 225 and the conductive layer 223, and the conductive layer 222a and the conductive layer 222b are connected to the low-resistance regions 231n through the openings in the insulating layer 215. Furthermore, an insulating layer 218 covering the transistor may be provided.

[Structure Example 3-4]

Figure 21:
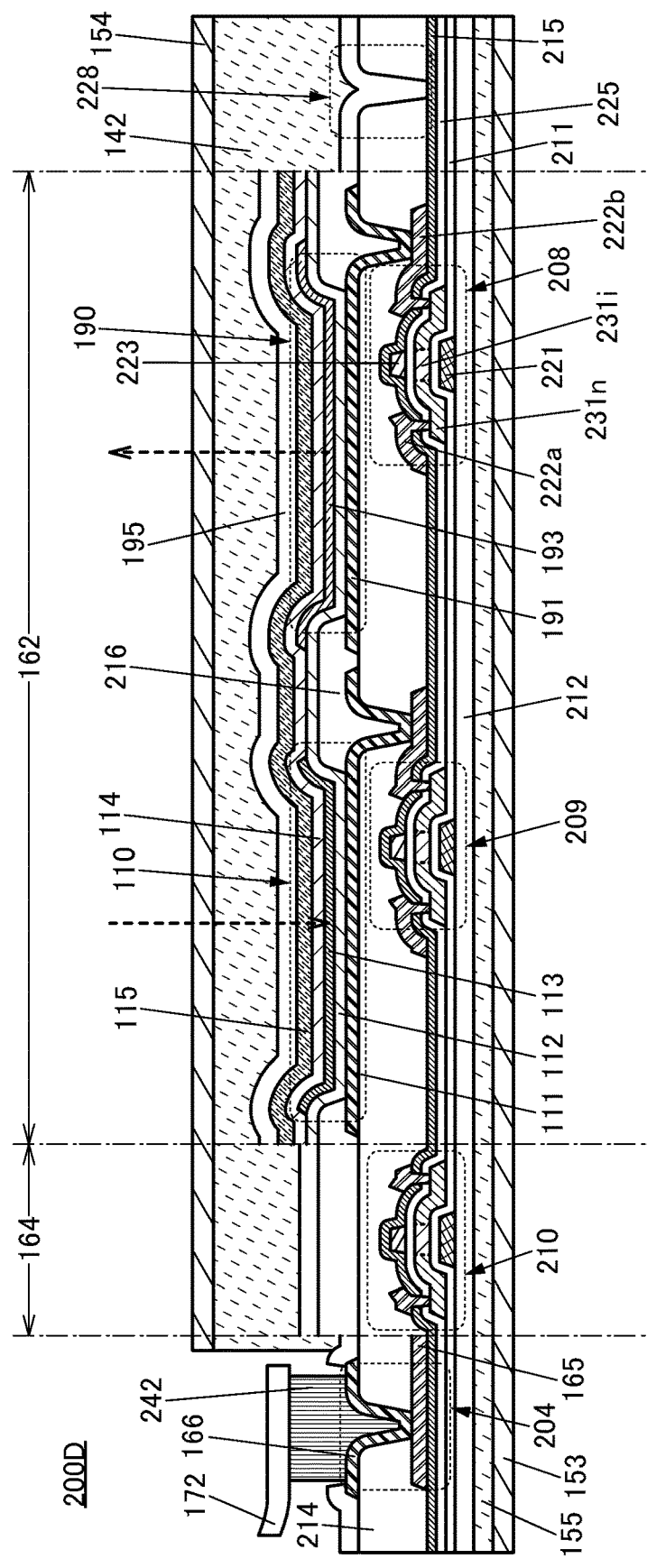
FIG. 21 is an example of a structure of a display device.

FIG. 21 illustrates a cross-sectional view of a display panel 200D. The display panel 200D is different from the display panel 200C mainly in the structure of the substrates.

The display panel 200D does not include the substrate 151 or the substrate 152 and includes the substrate 153, the substrate 154, the adhesive layer 155, and the insulating layer 212.

The substrate 153 and the insulating layer 212 are bonded to each other with the adhesive layer 155. The substrate 154 and the protective layer 195 are bonded to each other with the adhesive layer 142.

The display panel 200D has a structure obtained in such a manner that the insulating layer 212, the transistor 208, the transistor 209, the light-receiving element 110, the light-emitting element 190, and the like are formed over a formation substrate and then transferred onto the substrate 153. The substrate 153 and the substrate 154 preferably have flexibility. Accordingly, the flexibility of the display panel 200D can be increased.

The inorganic insulating film that can be used as the insulating layer 211, the insulating layer 213, and the insulating layer 215 can be used as the insulating layer 212. Alternatively, a stacked-layer film of an organic insulating film and an inorganic insulating film may be used as the insulating layer 212. In that case, a film on the transistor 209 side is preferably an inorganic insulating film.

The above is the description of the structure examples of the display panel.

[Metal Oxide]

A metal oxide that can be used for the semiconductor layer is described below.

Note that in this specification and the like, a metal oxide containing nitrogen is also collectively referred to as a metal oxide in some cases. A metal oxide containing nitrogen may be referred to as a metal oxynitride. For example, a metal oxide containing nitrogen, such as zinc oxynitride (ZnON), may be used for the semiconductor layer.

Note that in this specification and the like, CAAC (c-axis aligned crystal) or CAC (Cloud-Aligned Composite) may be stated. CAAC refers to an example of a crystal structure, and CAC refers to an example of a function or a material composition.

For example, a CAC (Cloud-Aligned Composite)-OS (Oxide Semiconductor) can be used for the semiconductor layer.

A CAC-OS or a CAC-metal oxide has a conducting function in part of the material and has an insulating function in another part of the material; as a whole, the CAC-OS or the CAC-metal oxide has a function of a semiconductor. In the case where the CAC-OS or the CAC-metal oxide is used in a semiconductor layer of a transistor, the conducting function is to allow electrons (or holes) serving as carriers to flow, and the insulating function is to not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

Furthermore, the CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, in some cases, the conductive regions are observed to be coupled in a cloud-like manner with their boundaries blurred.

Furthermore, in the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

Furthermore, the CAC-OS or the CAC-metal oxide includes components having different bandgaps. For example, the CAC-OS or the CAC-metal oxide includes a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, high current driving capability in an on state of the transistor, that is, a high on-state current and high field-effect mobility can be obtained.

In other words, the CAC-OS or the CAC-metal oxide can also be referred to as a matrix composite or a metal matrix composite.

Oxide semiconductors (metal oxides) are classified into a single crystal oxide semiconductor and a non-single-crystal oxide semiconductor. Examples of a non-single-crystal oxide semiconductor include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear crystal grain boundary (also referred to as grain boundary) even in the vicinity of distortion in the CAAC-OS. That is, formation of a crystal grain boundary is found to be inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

The CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is a metal oxide with high crystallinity. On the other hand, a clear crystal grain boundary is difficult to observe in the CAAC-OS; thus, it can be said that a reduction in electron mobility due to the crystal grain boundary is unlikely to occur. Entry of impurities, formation of defects, and the like might decrease the crystallinity of a metal oxide; thus, it can be said that the CAAC-OS is a metal oxide that has small amounts of impurities and defects (e.g., oxygen vacancies (also referred to as $V_O$)). Thus, a metal oxide including a CAAC-OS is physically stable. Therefore, the metal oxide including a CAAC-OS is resistant to heat and has high reliability.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods.

Note that indium-gallium-zinc oxide (hereinafter referred to as IGZO), which is a kind of metal oxide containing indium, gallium, and zinc, has a stable structure in some cases by being formed of the above-described nanocrystals. In particular, crystals of IGZO tend not to grow in the air and thus, a stable structure might be obtained when IGZO is formed of smaller crystals (e.g., the above-described nanocrystals) rather than larger crystals (here, crystals with a size of several millimeters or several centimeters).

An a-like OS is a metal oxide having a structure between those of the nc-OS and an amorphous oxide semiconductor.

The a-like OS includes a void or a low-density region. That is, the a-like OS has low crystallinity as compared with the nc-OS and the CAAC-OS.

An oxide semiconductor (metal oxide) can have various structures that show different properties. Two or more of the amorphous oxide semiconductor, the polycrystalline oxide semiconductor, the a-like OS, the nc-OS, and the CAAC-OS may be included in an oxide semiconductor of one embodiment of the present invention.

A metal oxide film that functions as a semiconductor layer can be deposited using either or both of an inert gas and an oxygen gas. Note that there is no particular limitation on the flow rate ratio of oxygen (the partial pressure of oxygen) at the time of depositing the metal oxide film. However, to obtain a transistor having high field-effect mobility, the flow rate ratio of oxygen (the partial pressure of oxygen) at the time of depositing the metal oxide film is preferably higher than or equal to 0% and lower than or equal to 30%, further preferably higher than or equal to 5% and lower than or equal to 30%, and still further preferably higher than or equal to 7% and lower than or equal to 15%.

The energy gap of the metal oxide is preferably 2 eV or more, further preferably 2.5 eV or more, still further preferably 3 eV or more. With the use of a metal oxide having such a wide energy gap, the off-state current of the transistor can be reduced.

The substrate temperature during the deposition of the metal oxide film is preferably lower than or equal to 350° C., further preferably higher than or equal to room temperature and lower than or equal to 200° C., and still further preferably higher than or equal to room temperature and lower than or equal to 130° C. The substrate temperature during the deposition of the metal oxide film is preferably room temperature because productivity can be increased.

The metal oxide film can be formed by a sputtering method. Alternatively, a PLD method, a PECVD method, a thermal CVD method, an ALD method, or a vacuum evaporation method, for example, may be used.

The above is the description of the metal oxide.

At least part of this embodiment can be implemented in combination with the other embodiments described in this specification as appropriate.

Embodiment 3

In this embodiment, electronic devices each using a display device of one embodiment of the present invention are described with reference to FIG. 22 to FIG. 24.

An electronic device in this embodiment includes a display device of one embodiment of the present invention. The display device of one embodiment of the present invention has a function of sensing light, and thus can perform biometric authentication on the display portion and sense a touch or a near touch on the display portion. Unauthorized use of the electronic device of one embodiment of the present invention is difficult, that is, the electronic device has extremely high security level. Moreover, the electronic device can have improved functionality and convenience, for example.

Examples of the electronic devices include a digital camera, a digital video camera, a digital photo frame, a mobile phone, a portable game console, a portable information terminal, and an audio reproducing device, in addition to electronic devices with a relatively large screen, such as a television device, a desktop or laptop personal computer, a monitor of a computer or the like, digital signage, and a large game machine such as a pachinko machine.

The electronic device in this embodiment may include a sensor (a sensor having a function of sensing, detecting, or measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 22A:
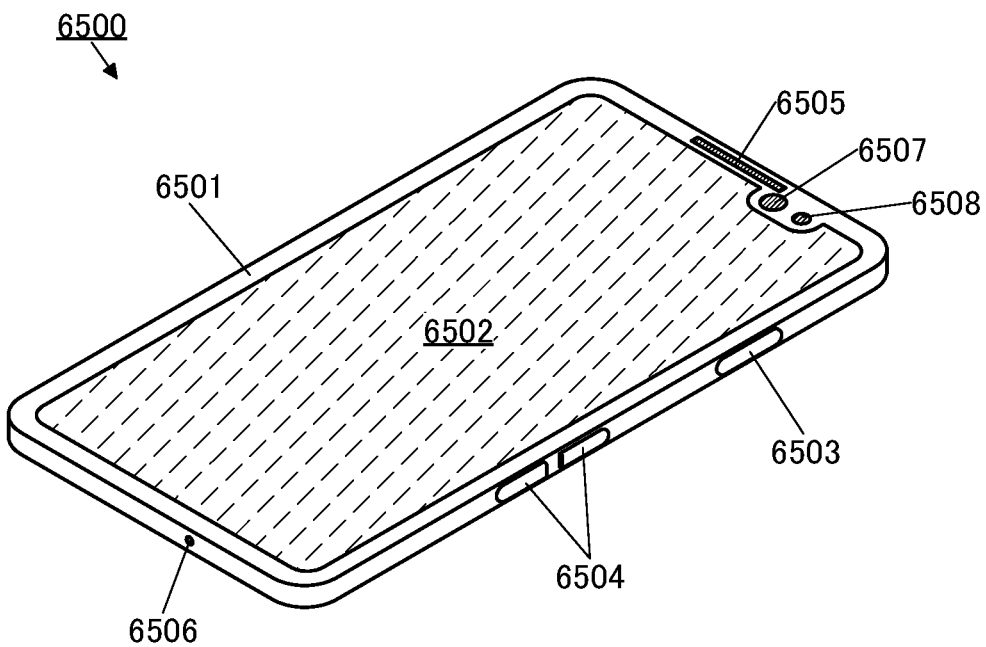
FIG. 22A and FIG. 22B are a structure example of an electronic device.

An electronic device 6500 illustrated in FIG. 22A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used in the display portion 6502.

Figure 22B:
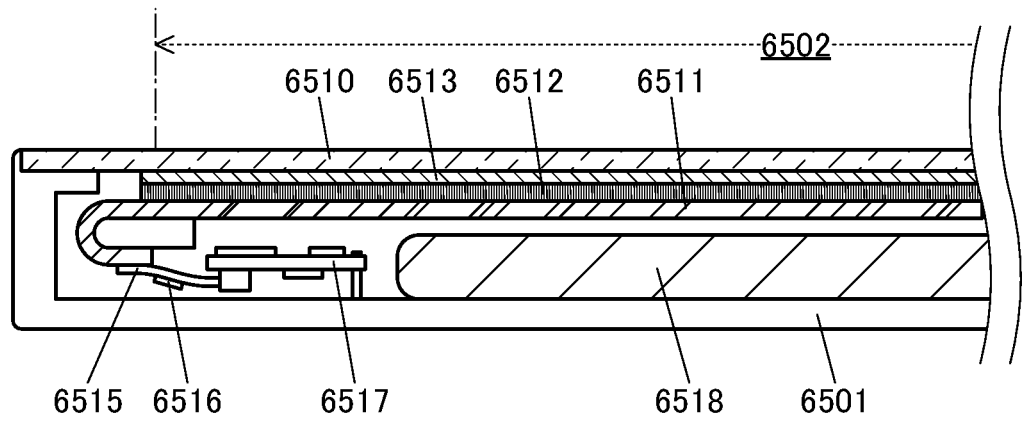

FIG. 22B is a schematic cross-sectional view including an end portion of the housing 6501 on the microphone 6506 side.

A protection member 6510 having a light-transmitting property is provided on the display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be achieved. Since the display panel 6511 is extremely thin, the battery 6518 with high capacity can be mounted with the thickness of the electronic device controlled. An electronic device with a narrow frame can be achieved when part of the display panel 6511 is folded back so that the portion connected to the FPC 6515 is provided on the rear side of a pixel portion.

Figure 23A:
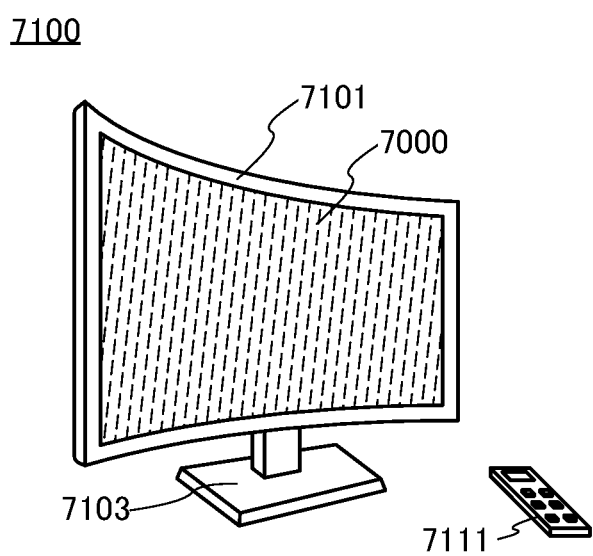
FIG. 23A to FIG. 23D are structure examples of electronic devices.

FIG. 23A illustrates an example of a television device. In a television device 7100, a display portion 7000 is incorporated in a housing 7101. Here, a structure in which the housing 7101 is supported by a stand 7103 is illustrated.

A display device of one embodiment of the present invention can be used in the display portion 7000.

Operation of the television device 7100 illustrated in FIG. 23A can be performed with an operation switch provided in the housing 7101 or a separate remote controller 7111. Alternatively, the display portion 7000 may include a touch sensor, and the television device 7100 may be operated by a touch on the display portion 7000 with a finger or the like. The remote controller 7111 may be provided with a display portion for displaying data output from the remote controller 7111. With operation keys or a touch panel provided in the remote controller 7111, channels and volume can be operated and videos displayed on the display portion 7000 can be operated.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

Figure 23B:
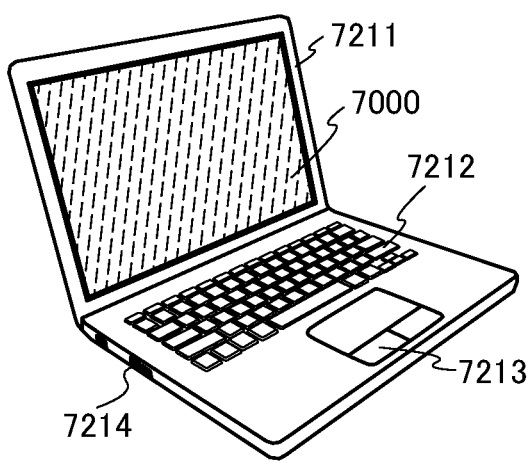

FIG. 23B illustrates an example of a laptop personal computer. A laptop personal computer 7200 includes a housing 7211, a keyboard 7212, a pointing device 7213, an external connection port 7214, and the like. In the housing 7211, the display portion 7000 is incorporated.

The display device of one embodiment of the present invention can be used in the display portion 7000.

Figure 23C:
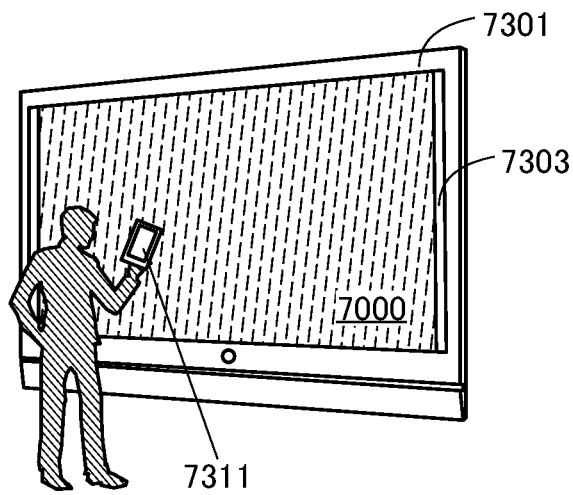
Figure 23D:
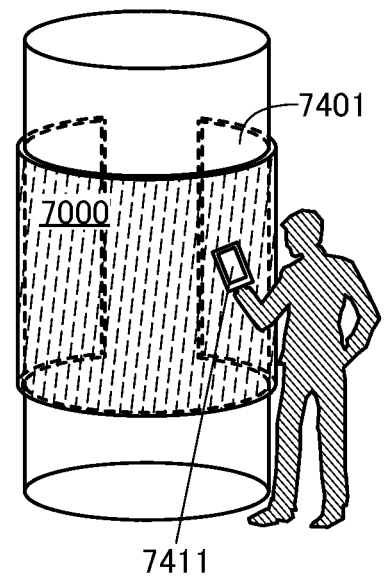

FIG. 23C and FIG. 23D illustrate examples of digital signage.

Digital signage 7300 illustrated in FIG. 23C includes a housing 7301, the display portion 7000, a speaker 7303, and the like. Furthermore, the digital signage can include an LED lamp, operation keys (including a power switch or an operation switch), a connection terminal, a variety of sensors, a microphone, and the like.

FIG. 23D is digital signage 7400 attached to a cylindrical pillar 7401. The digital signage 7400 includes the display portion 7000 provided along a curved surface of the pillar 7401.

The display device of one embodiment of the present invention can be used for the display portion 7000 in FIG. 23C and FIG. 23(D).

A larger area of the display portion 7000 can increase the amount of data that can be provided at a time. The larger display portion 7000 attracts more attention, so that the advertising effectiveness can be enhanced, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIG. 23C and FIG. 23D, the digital signage 7300 or the digital signage 7400 is preferably capable of working with an information terminal 7311 or an information terminal 7411 such as a user's smartphone through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

Electronic devices illustrated in FIG. 24A to FIG. 24F include a housing 9000, a display portion 9001, a speaker 9003, an operation key 9005 (including a power switch or an operation switch), a connection terminal 9006, a sensor 9007 (a sensor having a function of sensing, detecting, or measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIG. 24A to FIG. 24F have a variety of functions. For example, the electronic devices can have a function of displaying a variety of information (a still image, a moving image, a text image, and the like) on the display portion, a touch panel function, a function of displaying a calendar, date, time, and the like, a function of controlling processing with use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may each include a camera or the like and have a function of taking a still image or a moving image and storing the taken image in a recording medium (an external recording medium or a recording medium incorporated in the camera), a function of displaying the taken image on the display portion, or the like.

The details of the electronic devices illustrated in FIG. 24A to FIG. 24F are described below.

Figure 24A:
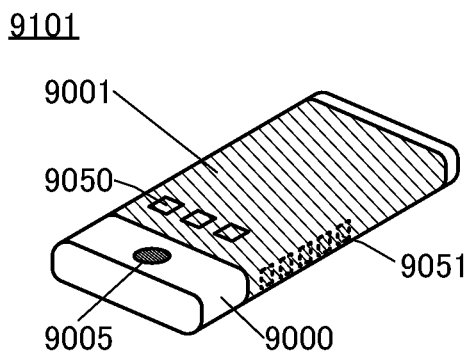
FIG. 24A to FIG. 24F are structure examples of electronic devices.

FIG. 24A is a perspective view illustrating a portable information terminal 9101. For example, the portable information terminal 9101 can be used as a smartphone. Note that the portable information terminal 9101 may be provided with the speaker 9003, the connection terminal 9006, the sensor 9007, or the like. The portable information terminal 9101 can display characters or image information on its plurality of surfaces. FIG. 24A shows an example where three icons 9050 are displayed. Information 9051 indicated by dashed rectangles can be displayed on another surface of the display portion 9001. Examples of the information 9051 include notification of reception of an e-mail, SNS, or an incoming call, the title and sender of an e-mail, SNS, or the like, the date, the time, remaining battery, and the reception strength of an antenna. Alternatively, the icon 9050 or the like may be displayed in the position where the information 9051 is displayed.

Figure 24B:
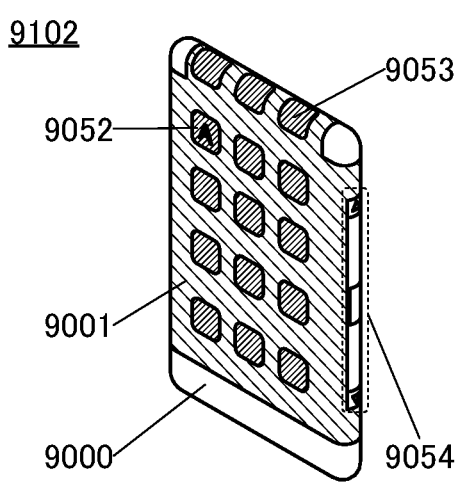

FIG. 24B is a perspective view illustrating a portable information terminal 9102. The portable information terminal 9102 has a function of displaying information on three or more surfaces of the display portion 9001. Here, an example in which information 9052, information 9053, and information 9054 are displayed on different surfaces is shown. For example, a user can check the information 9053 displayed in a position that can be observed from above the portable information terminal 9102, with the portable information terminal 9102 put in a breast pocket of his/her clothes. The user can see the display without taking out the portable information terminal 9102 from the pocket and decide whether to answer the call, for example.

Figure 24C:
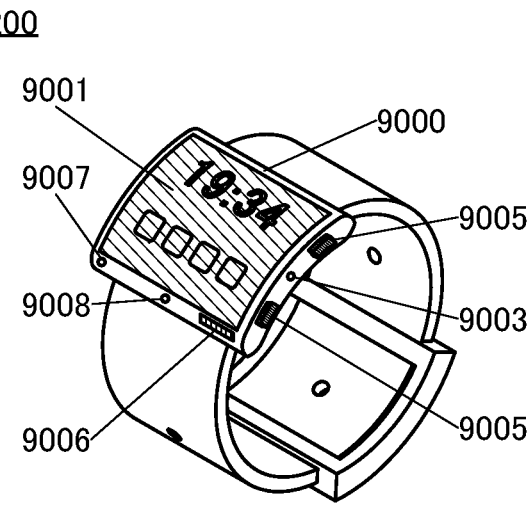

FIG. 24C is a perspective view illustrating a watch-type portable information terminal 9200. The display surface of the display portion 9001 is curved and provided, and display can be performed along the curved display surface. Mutual communication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

Figure 24D:
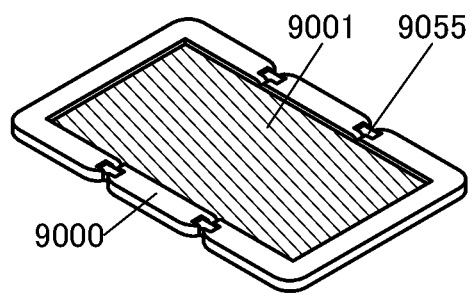
Figure 24E:
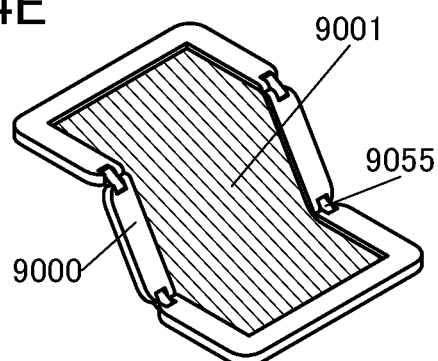
Figure 24F:
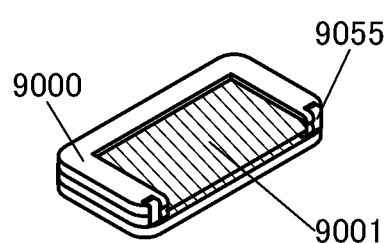

FIG. 24D, FIG. 24E, and FIG. 24F are perspective views illustrating a foldable portable information terminal 9201. FIG. 24D is a perspective view of an opened state of the portable information terminal 9201, FIG. 24F is a perspective view of a folded state thereof, and FIG. 24E is a perspective view of a state in the middle of change from one of FIG. 24D and FIG. 24F to the other. The portable information terminal 9201 is highly portable in the folded state and is highly browsable in the opened state because of a seamless large display region. The display portion 9001 of the portable information terminal 9201 is supported by three housings 9000 joined by hinges 9055. For example, the display portion 9001 can be curved with a radius of curvature greater than or equal to 0.1 mm and less than or equal to 150 mm.

At least part of this embodiment can be implemented in combination with the other embodiments described in this specification as appropriate.

REFERENCE NUMERALS

ADC: conversion portion: PA: amplifier portion: AMP: comparison circuit: DAC: conversion portion: VA: amplifier portion: MUX: multiplexer circuit: TX, SE, RS, WX, SL, GL: wiring: PD: light-receiving element: EL: light-emitting element: IN: input terminal: OUT: output terminal: $V_{REF}$, $V_{REFR}$, $V_{REFS}$: reference potential: AMP1, AMP2: comparison circuit: C, C1, C2, C11, C12: capacitor: M1 to M7: transistor: SW1 to SW4: switch: SEL1, SEL2: selection circuit: 10: imaging device: 11: imaging portion: 12: circuit portion: 13: driver circuit portion: 15: pixel: 21 to 23: substrate: 30: pixel: 31, 32: terminal: 33: wiring: 50: display device: 51: display portion: 52: circuit portion: 53: driver circuit portion: 61: pixel: 61B, 61G, 61R: subpixel: 62: imaging pixel: 70: pixel

The invention claimed is:

1. A semiconductor device comprising:
an amplifier portion; and
a conversion portion,
wherein the amplifier portion includes a comparison circuit,
wherein a first signal and a second signal are sequentially input to the amplifier portion,
wherein a first reference potential is supplied to the comparison circuit in a period during which the first signal is input,
wherein a second reference potential is supplied to the comparison circuit in a period during which the second signal is input,
wherein the amplifier portion is configured to output, to the conversion portion, an output potential that is obtained by amplifying a difference between potentials of the first signal and the second signal in a period during which the second signal is input, and
wherein the conversion portion is configured to convert the output potential into a digital value.

2. A semiconductor device comprising:
an amplifier portion;
a conversion portion; and
an input terminal,
wherein the amplifier portion includes a comparison circuit, a first capacitor, a second capacitor, and a first switch,
wherein the comparison circuit includes an inverting input terminal, a non-inverting input terminal, and an output terminal,
wherein a first signal and a second signal are sequentially supplied to the input terminal,
wherein one terminal of the first capacitor is electrically connected to the input terminal,
wherein the other terminal of the first capacitor is electrically connected to the inverting input terminal,
wherein the second capacitor and the first switch are each electrically connected in parallel with the inverting input terminal and the output terminal,
wherein in the amplifier portion, when the first signal is supplied, the first switch is turned on and a first reference potential is supplied to the non-inverting input terminal, and when the second signal is supplied, the first switch is turned off and a second reference potential that is different from the first reference potential is supplied to the non-inverting input terminal, and
wherein the conversion portion is configured to convert a potential output from the output terminal into a digital value.

3. An imaging device comprising the semiconductor device according to claim 2, a pixel, and a third wiring,
wherein the pixel includes a photoelectric conversion element and a pixel circuit,
wherein the pixel circuit is configured to output the first signal including a light-receiving potential and the second signal including a reset potential to the third wiring, and
wherein the third wiring is electrically connected to the input terminal.

4. An imaging device comprising the semiconductor device according to claim 2, a plurality of pixels, a plurality of third wirings, and a first selection circuit,
wherein the pixel includes a photoelectric conversion element and a pixel circuit,
wherein the pixel circuit is configured to output the first signal including a light-receiving potential and the second signal including a reset potential to the third wiring,
wherein the plurality of third wirings is electrically connected to the first selection circuit, and
wherein the first selection circuit is configured to select one of the plurality of third wirings and electrically connect the selected third wiring to the input terminal.

5. The imaging device according to claim 4, comprising a correlated double sampling circuit between the third wiring and the input terminal.

6. The imaging device according to claim 4, comprising a first substrate and a second substrate,
wherein the semiconductor device is provided over the first substrate, and
wherein the pixel is provided over the second substrate.

7. A semiconductor device comprising:
an amplifier portion;
a conversion portion; and
an input terminal,
wherein the amplifier portion includes a comparison circuit, a first capacitor, a second capacitor, a first switch, a second switch, a third switch, a first wiring, and a second wiring,
wherein the comparison circuit includes an inverting input terminal, a non-inverting input terminal, and an output terminal,
wherein a first signal and a second signal are sequentially supplied to the input terminal, wherein one terminal of the first capacitor is electrically connected to the input terminal, wherein the other terminal of the first capacitor is electrically connected to the inverting input terminal, wherein the second capacitor and the first switch are each electrically connected in parallel with the inverting input terminal and the output terminal, wherein the first wiring to which a first reference potential is supplied is electrically connected to the non-inverting input terminal through the second switch, wherein the second wiring to which a second reference potential that is different from the first reference potential is supplied is electrically connected to the non-inverting input terminal through the third switch, and wherein the conversion portion is configured to convert a potential output from the output terminal into a digital value.

8. An imaging device comprising the semiconductor device according to claim 7, a pixel, and a third wiring,
wherein the pixel includes a photoelectric conversion element and a pixel circuit,
wherein the pixel circuit is configured to output the first signal including a light-receiving potential and the second signal including a reset potential to the third wiring, and wherein the third wiring is electrically connected to the input terminal.

9. An imaging device comprising the semiconductor device according to claim 7, a plurality of pixels, a plurality of third wirings, and a first selection circuit,
wherein the pixel includes a photoelectric conversion element and a pixel circuit,
wherein the pixel circuit is configured to output the first signal including a light-receiving potential and the second signal including a reset potential to the third wiring,
wherein the plurality of third wirings is electrically connected to the first selection circuit, and wherein the first selection circuit is configured to select one of the plurality of third wirings and electrically connect the selected third wiring to the input terminal.

10. The imaging device according to claim 9, comprising a correlated double sampling circuit between the third wiring and the input terminal.

11. The imaging device according to claim 9, comprising a first substrate and a second substrate,
wherein the semiconductor device is provided over the first substrate, and
wherein the pixel is provided over the second substrate.

12. A semiconductor device comprising:
an amplifier portion;
a first conversion portion;
a second conversion portion;
an input terminal; and
a first output terminal,
wherein the amplifier portion includes a comparison circuit, a first capacitor, a second capacitor, and a first switch,
wherein the comparison circuit includes an inverting input terminal, a non-inverting input terminal, and a second output terminal,
wherein a first signal and a second signal are sequentially supplied to the input terminal,
wherein one terminal of the first capacitor is electrically connected to the input terminal,
wherein the other terminal of the first capacitor is electrically connected to the inverting input terminal,
wherein the second capacitor and the first switch are each electrically connected in parallel with the inverting input terminal and the second output terminal,
wherein in the amplifier portion, when the first signal is supplied, a first reference potential is supplied to the non-inverting input terminal, and when the second signal is supplied, a second reference potential that is different from the first reference potential is supplied to the non-inverting input terminal,
wherein the first conversion portion is configured to convert a potential output from the second output terminal into a digital value,
wherein a digital signal is supplied to the second conversion portion,
wherein the second conversion portion is configured to convert the digital signal into a third signal and output the third signal to the first output terminal,
wherein the third signal is an analog signal, and
wherein the amplifier portion, the first conversion portion, and the second conversion portion are provided over a first substrate.

13. The semiconductor device according to claim 12, comprising a fourth switch,
wherein the first output terminal is electrically connected to the non-inverting input terminal through the fourth switch,
wherein the second conversion portion is configured to output the third signal including a data potential, the first reference potential, and the second reference potential on the basis of the digital signal,
wherein the fourth switch is in a conducting state in a period during which the first reference potential is output to the first output terminal and in a period during which the second reference potential is output to the first output terminal, and
wherein the fourth switch is in a non-conducting state in a period during which the data potential is output to the first output terminal.

14. The semiconductor device according to claim 12, comprising a second switch, a third switch, a first wiring, and a second wiring,
wherein the first wiring to which the first reference potential is supplied is electrically connected to the non-inverting input terminal through the second switch, and
wherein the second wiring to which the second reference potential is supplied is electrically connected to the non-inverting input terminal through the third switch.

15. A display device comprising the semiconductor device according to claim 12, a first pixel, a second pixel, a third wiring, and a fourth wiring,
wherein the first pixel includes a photoelectric conversion element and a first pixel circuit,
wherein the first pixel circuit is configured to output the first signal including a light-receiving potential and the second signal including a reset potential to the third wiring,
wherein the third wiring is electrically connected to the input terminal,
wherein the second pixel includes a display element and a second pixel circuit,
wherein the fourth wiring is electrically connected to the first output terminal and the second pixel circuit, and
wherein the second pixel circuit is configured to control a gray level of the display element on the basis of the third signal.

16. The display device according to claim 15, comprising a second selection circuit, a third selection circuit, and a fifth wiring,
- wherein the third wiring and the fourth wiring are electrically connected to the second selection circuit,
- wherein the input terminal and the first output terminal are electrically connected to the third selection circuit,
- wherein the second selection circuit is electrically connected to the third selection circuit through the fifth wiring,
- wherein the second selection circuit is configured to select either the third wiring or the fourth wiring and electrically connect the selected wiring to the fifth wiring, and
- wherein the third selection circuit is configured to select either the input terminal or the first output terminal and electrically connect the selected terminal to the fifth wiring.

17. The display device according to claim 15,
- wherein the display element is a light-emitting element,
- wherein the photoelectric conversion element and the light-emitting element are positioned on the same plane,
- wherein the photoelectric conversion element includes a pixel electrode, a first electrode, and, between the pixel electrode and the first electrode, an electron-injection layer, an electron-transport layer, a light-emitting layer, an active layer, a hole-injection layer, and a hole-transport layer, and
- wherein the light-emitting element includes one or more of the first electrode, the electron-injection layer, the electron-transport layer, the hole-injection layer, and the hole-transport layer.

18. The display device according to claim 15, comprising a second substrate,
- wherein the semiconductor device is provided over the first substrate,
- wherein the first pixel and the second pixel are provided over the second substrate,
- wherein the first substrate is a single crystal substrate, and
- wherein the second substrate includes glass or organic resin.

* * * * *